(12) United States Patent
Nagaosa et al.

(10) Patent No.: US 9,748,000 B2
(45) Date of Patent: Aug. 29, 2017

(54) MAGNETIC ELEMENT, SKYRMION MEMORY, SOLID-STATE ELECTRONIC DEVICE DATA RECORDING APPARATUS, DATA PROCESSING APPARATUS, AND COMMUNICATION APPARATUS

(71) Applicant: RIKEN, Saitama (JP)

(72) Inventors: Naoto Nagaosa, Tokyo (JP); Wataru Koshibae, Saitama (JP); Junichi Iwasaki, Tokyo (JP); Masashi Kawasaki, Tokyo (JP); Yoshinori Tokura, Tokyo (JP); Yoshio Kaneko, Chiba (JP)

(73) Assignee: RIKEN, Saitama (JP)

( * ) Notice: Subject to any disclaimer, the term of this patent is extended or adjusted under 35 U.S.C. 154(b) by 0 days.

(21) Appl. No.: 15/391,860

(22) Filed: Dec. 28, 2016

(65) Prior Publication Data
US 2017/0169898 A1   Jun. 15, 2017

Related U.S. Application Data

(63) Continuation of application No. PCT/JP2015/068888, filed on Jun. 30, 2015.

(30) Foreign Application Priority Data

Jul. 4, 2014   (JP) .................. 2014-139030

(51) Int. Cl.
*G11C 19/00*   (2006.01)
*G11C 19/08*   (2006.01)

(52) U.S. Cl.
CPC ........ *G11C 19/085* (2013.01); *G11C 19/0866* (2013.01)

(58) Field of Classification Search
CPC .................................................... G11C 19/085
(Continued)

(56) References Cited

U.S. PATENT DOCUMENTS 6,834,005 B1   12/2004   Parkin
2016/0314827 A1*  10/2016   Cros ...................... G11C 11/16

FOREIGN PATENT DOCUMENTS

JP   2014-86470 A   5/2014

OTHER PUBLICATIONS

Brian Youngblood, "Growth and Characterization of Skyrmion-hosting Magnetic Thin Films" PhD Dissertation, 2015, Electronic Theses and Dissertations UC Irvine.*

(Continued)

*Primary Examiner* — Hoai V Ho
*Assistant Examiner* — Jay Radke

(57) ABSTRACT

Provided is a skyrmion memory circuit capable of circularly transferring a magnetic element skyrmion, comprising one or more current paths in a magnet having a closed-path pattern that are provided surrounding an end region including an end portion of the magnet in a plane of the magnet with the closed-path pattern, and applying current between an outer terminal connected to an outer circumferential portion of the closed-path pattern and an inner circumference electrode connected to an inner circumferential portion of the closed-path pattern, transferring the skyrmion in a direction substantially perpendicular to the direction of the applied current, and circulating the skyrmion in the magnet with the closed-path pattern.

20 Claims, 38 Drawing Sheets

(58) Field of Classification Search
USPC .......................................................... 365/171
See application file for complete search history.

(56) References Cited

OTHER PUBLICATIONS

Fert et al., "Skyrmions on the track", 2013, Nature Nanotechnology, vol. 8, pp. 152-156.*
Schulz et al., "Emergent electrodynamics of skyrmions in a chiral magnet", Apr. 2012, Nat Phys, vol. 8. pp. 301-304.*
Kiselev et al., "Chiral skyrmions in thin magnetic films: new objects for magnetic storage technologies?", 2011, Journal of Physics D: Applied Physics, vol. 44, p. 392001.*
Zhang et al., "Skyrmion-skymion and skymion-edge repulsions in skyrmion-based racetrack memory", Jan. 2015, Scientific Reports, vol. 5, pp. 7643 EP.*
Romming et al., "Writing and deleting single magnetic skyrmions", 2013, Science, vol. 341, pp. 636-639.*
Li et al., "Robust formation of skyrmions and topological Hall effect anomaly in epitaxial thin films of MnSi", Mar. 2013, Phys. Rv. Lett., vol. 110, p. 117202.*
Yu et al., "Observation of the magnetic skyrmion lattice in a MnSi nanowire by Lorentz TEM", 2013, Nano Letters, vol. 13, pp. 3755-3759.*
Monchesky et al., "Comment on robust formation of skyrmions and topological Hall effect anomaly in epitaxial thin films of MnSi", Feb. 2014, Phys. Rev. Lett., vol. 112, p. 059701.*
Wilson et al., Chiral skyrmions in cubic helimagnet films: The role of uniaxial anisotropy, Mar. 2014, Phys. Rev. B, vol. 89, p. 094411.*
Yi et al., "Skyrmions and anomalous Hall effect in a Dzyaloshinskii-Moriya spiral magnet", Aug. 2009, Phys. Rev. B, vol. 80, p. 054416.*
International Search Report for International Application No. PCT/JP2015/068888, issued by the Japan Patent Office on Sep. 8, 2015.
Nagaosa Naoto, Tokura Yoshinori, "Topological properties and dynamics of magnetic skyrmions," Nature Nanotechnology, GB, Nature Publishing Group, Dec. 4, 2013, vol. 8, pp. 899-911.
Iwasaki, J., Mochizuki, M. & Nagaosa, N., Nat. Commun. 4, 1463 (2013).
Wataru Koshibe et al., "Memory functions of magnetic skyrmions", Japanese Journal of Applied Physics, vol. 54, No. 5, Apr. 2, 2015, pp. 053001-1-053001-8.

* cited by examiner

MAGNETIC ELEMENT, SKYRMION MEMORY, SOLID-STATE ELECTRONIC DEVICE DATA RECORDING APPARATUS, DATA PROCESSING APPARATUS, AND COMMUNICATION APPARATUS

The contents of the following Japanese patent applications are incorporated herein by reference:
NO. 2014-139030 filed in JP on Jul. 4, 2014 and
NO. PCT/JP2015/068888 filed on Jun. 30, 2015.

BACKGROUND

Technical Field

The present invention relates to a magnetic element using skyrmions as a memory, a skyrmion memory, a skyrmion memory circuit, a skyrmion memory device, a skyrmion-memory-device embedded solid-state electronic device, a data recording apparatus, a data processing apparatus, and a communication apparatus.

Related Art

A magnetic element is known that uses the magnetic moment of a magnet as digital information. A skyrmion memory using skyrmions, which is a magnetic element, includes the element structure of a nonvolatile memory that does not require power when holding nanoscale information. Based on advantages such as ultra-high density resulting from the nanoscale magnetic structure, this magnetic element is expected to be used as a high-capacity information storage medium, and the importance thereof increases when used as a memory device of an electronic device.

Magnetic shift registers have been proposed, mainly by IBM in the US, as candidates for next-generation magnetic memory devices. A magnetic shift register drives a magnetic domain wall to transfer the magnetic moment arrangement thereof through a current, and reads stored information (see Patent Document 1).

FIG. 36 is a schematic view of the principles of driving a magnetic domain wall with current. The domain wall is a boundary of a magnetic region where the orientations of magnetic moments are phase-inverted. In FIG. 36, the domain walls in a magnetic shift register 1 are shown by solid lines. The magnetic domain walls are driven by causing current with the orientation indicated by the arrows to flow in the magnetic shift register 1. By driving the domain walls, the magnetism caused by the orientation of the magnetic moment positioned above the magnetic sensor 2 changes. This magnetic change is sensed by the magnetic sensor 2, and magnetic information is derived.

However, this type of magnetic shift register 1 requires a large current when moving the magnetic domain walls, and there is a disadvantage that the transfer velocity of the magnetic domain walls is low. Furthermore, in the case of a nano-size domain, a problem occurs that spin reversal occurs due to thermal disturbance. The reliability guarantee for an LSI demands data holding for 10 years.

Therefore, the inventors of the present application proposed a skyrmion magnetic element that uses skyrmions generated in the magnet as a storage unit (see Patent Document 2). In this proposal, the inventors of the present application showed that it is possible to drive skyrmions with current. Furthermore, the details concerning the motion of the skyrmions being able to be driven by current were made clear, and the results were shown (see Non-Patent Document 2).

In this Specification, an arrangement in which the drive current and the transfer direction of the skyrmions are substantially parallel is defined as a longitudinal transfer arrangement. When using such a longitudinal transfer arrangement as a memory, electrodes that apply current are provided to both ends of the fine line structure of the magnet having the skyrmions. In order to handle the skyrmions as information units, a sensor that senses the skyrmions is provided at a prescribed location along the fine lines of the magnet. Therefore, time is needed to transfer the skyrmions to the prescribed position of the sensor. This is the same as in the magnetic shift register proposed by IBM in the US (see FIG. 36).

However, it became clear that there was a major problem that the transfer velocity of the skyrmions is low in the longitudinal transfer arrangement (see Non-Patent Document 2). As a second issue to be addressed, there is a problem that the skyrmion drive current density is large in the longitudinal transfer arrangement. In a case where the transfer velocity of the skyrmions in the longitudinal transfer arrangement is 15 m/s, the current density becomes a large value of $2 \times 10^{11}$ $Am^{-2}$ (see Non-Patent Document 2). When handling the skyrmions as information units, it was made clear that there is a problem of the transfer velocity of the skyrmions is slow, and therefore that the current density for driving is large.

PRIOR ART DOCUMENTS

Patent Document 1: U.S. Pat. No. 6,834,005
Patent Document 2: Japanese Patent Application Publication No. 2014-86470
Non-Patent Document 1: Nagaosa Naoto, Tokura Yoshinori, "Topological properties and dynamics of magnetic skyrmions," Nature Nanotechnology, US, Nature Publishing Group, Dec. 4, 2013, Vol. 8, pp. 899-911
Non-Patent Document 2: Iwasaki, J., Mochizuki, M. & Nagaosa, N., Nat. Commun. 4, 1463 (2013)

SUMMARY OF THE INVENTION

Problem to be Solved by the Invention

A skyrmion has an extremely small magnetic structure with a diameter from 1 nm to 100 nm, and since this structure can be held for a long time, there has been increasing expectation of skyrmions being used in memory elements. The first issue for using skyrmions as memory elements is to increase the transfer velocity of the skyrmions by an order of magnitude. The second issue is to decrease the current density for driving.

Means for Solving the Problem

According to a first aspect of the present invention, provided is a skyrmion memory circuit comprising a magnet with a closed-path pattern with a thin film shape capable of generating a skyrmion, wherein the magnet with the closed-path pattern has a width W and a length L in a plane of the thin film, and has a closed-path pattern that has both ends of the length L connected to each other and circularly transfers the skyrmion.

The magnet may include an inner circumference edge that defines an inner circumference of the magnet with the closed-path pattern in a plane of the closed-path pattern and an outer circumference edge that defines an outer circumference. The skyrmion memory circuit may include, in a plane parallel to an extension direction of the magnet with the closed-path pattern, an inner circumference electrode made from a nonmagnetic metal connected to the inner circumference edge of the magnet with the closed-path pattern and an outer circumference electrode made from a nonmagnetic metal connected to the outer circumference edge of the magnet with the closed-path pattern. The skyrmion memory circuit may have a transverse transfer arrangement in which a direction in which current flows between the inner circumference electrode and the outer circumference electrode is arranged substantially perpendicular to a direction in which the skyrmion is transferred.

One or more of the skyrmions may be circularly transferred in the magnet with the closed-path pattern by applying current between the inner circumference electrode and the outer circumference electrode. With the diameter of the skyrmion being $\lambda$, the width W of the magnet with the closed-path pattern may be such that $W > 0.5 \cdot \lambda$.

With the diameter of the skyrmion being $\lambda$, an interval d between a plurality of the skyrmions being circularly transferred may be such that $d \geq 0.5 \cdot \lambda$.

With the diameter of the skyrmion being $\lambda$, when an interval d between a plurality of the skyrmions being circularly transferred is such that $d \geq 2 \cdot \lambda$, the plurality of skyrmions may be circularly transferred while maintaining the interval d.

With a magnitude of a magnetic exchange interaction of the magnet with the closed-path pattern being J and a current density of the current when a plurality of the skyrmions are being circularly transferred being Jd, a current density Jc of the current flowing between the inner circumference electrode and the outer circumference electrode may be such that $Jc \geq 2 \cdot Jd$, and the plurality of skyrmions being circularly transferred may all be deleted.

When deleting all of the plurality of skyrmions, an application time of the current density Jc may be such that $t \geq 6000(1/J)$.

The skyrmion memory circuit may further comprise one or more current paths in one plane of the magnet with the closed-path pattern, and one or more of the skyrmions may be generated or erased, or a transfer speed of the one or more skyrmions may be increased or decreased, by applying current to the current path.

A first current path among the one or more current paths has a width W1 and a length L1 in the same direction as a width direction and a length direction of the magnet with the closed-path pattern and surrounds an end region in a range where the width W1 and length L1, relative to the diameter $\lambda$ of the skyrmion, may be such that $0.75 \cdot \lambda \geq W1 > 0.2 \cdot \lambda$ and $0.5 \cdot \geq L1 > 0.1 \cdot \lambda$, and when a magnetic field Ha of the end region is such that $0.01J \geq Ha$ (with J indicating a magnitude of a magnetic exchange interaction of the magnet with the closed-path pattern), due to a magnetic field generated by current flowing in a first direction through the first current path, the skyrmion may be generated in the magnet with the closed-path pattern.

When a magnetic field Ha of the end region is such that $0.024J \geq Ha > 0.01J$ (with J indicating a magnitude of a magnetic exchange interaction of the magnet with the closed-path pattern), due to a magnetic field generated by current flowing in a second direction through the first current path, the skyrmion may be deleted in the magnet with the closed-path pattern.

A second current path among the one or more current paths has a width W2 and a length L2 in the same direction as a width direction and a length direction of the magnet with the closed-path pattern and surrounds an end region in a range where the width W2 and length L2, relative to the diameter $\lambda$ of the skyrmion, may be such that $0.2 \cdot \lambda \geq W2$ and $L2 \geq \lambda$, and a transfer velocity of one or more of the skyrmions being circularly transferred in the magnet with the closed-path pattern may be increased or decreased due to a magnetic field generated by current flowing through the second current path.

The magnet with the closed-path pattern may express at least a ferromagnetic phase and a skyrmion crystal phase generated by the skyrmion, according to an applied magnetic field. The magnet with the closed-path pattern may be made from one of a chiral magnet, a dipole magnet, a frustrated magnet, and a layered structure of a magnetic material and a nonmagnetic material.

According to a second aspect of the present invention, provided is a skyrmion memory device comprising a plurality of the skyrmion memory circuits according to the first aspect, arranged in a matrix shape; a first selection line that selects the inner circumference electrode of the magnet with the closed-path pattern and a switch provided to the first selection line; a second selection line that selects the outer circumference electrode of the magnet with the closed-path pattern and a switch provided to the second selection line; one or more write lines that apply current to the one or more current paths and a switch provided to the one or more write lines; a sensor that detects the skyrmion; a word line connected to the sensor and a switch provided to the word line; a detection circuit that detects a signal of the word line; and a magnetic field generating unit that applies a first magnetic field to the magnet with the closed-path pattern.

The write line for generating the skyrmion wired to one of the skyrmion memory circuits may be in common with the write line of another of the skyrmion memory circuits.

The word line for sensing the skyrmion wired to one of the skyrmion memory circuits may be in common with word line of another of the skyrmion memory circuits.

The skyrmions in the plurality of skyrmion memory circuits may be deleted en masse by applying a predetermined current in a width direction of the magnet with the closed-path pattern of the plurality of skyrmion memory circuits.

A skyrmion memory device may have a multilayer structure in which two or more of the skyrmion memory devices according to the second aspect are layered.

According to a third aspect of the present invention, provided is a solid-state electronic device on which is mounted a skyrmion memory device including the skyrmion memory device according to the second aspect and a central computational processing device formed in the same chip.

According to a fourth aspect of the present invention, provided is a data recording apparatus on which the skyrmion memory device according to the second aspect is mounted.

According to a fifth aspect of the present invention, provided is a data processing apparatus on which the skyrmion memory device according to the second aspect is mounted.

According to a sixth aspect of the present invention, provided is a communication apparatus on which the skyrmion memory device according to the second aspect is mounted.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

A chiral magnet is one example of a magnet that can form skyrmions. A chiral magnet is a magnet in which the magnetic moment arrangement when an external magnetic field is not applied obeys a magnetically ordered phase that rotates in a spiral relative to a progression direction of the magnetic moment. By applying an external magnetic field, the chiral magnet is caused to transition through a crystal phase in which the skyrmions are arranged in a lattice to a ferromagnetic phase.

Figure 1:
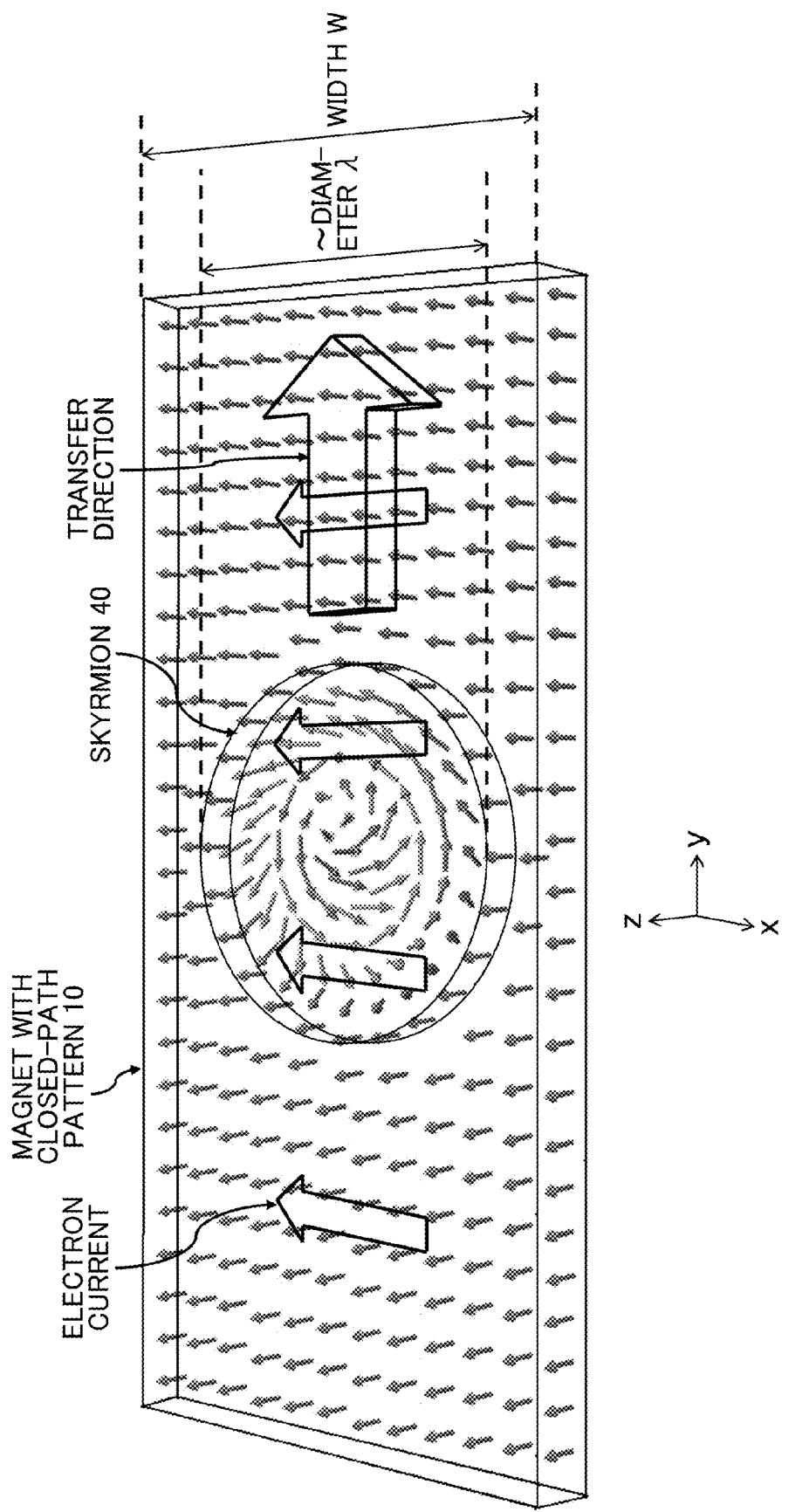
FIG. 1 schematically shows an exemplary skyrmion that is a nanoscale magnetic structure of a magnetic moment in a magnet.

FIG. 1 schematically shows an exemplary skyrmion 40 that is a nanoscale magnetic structure formed in a portion of a magnet 10 with a closed-path pattern. The magnet 10 with the closed-path pattern has a thin-film shape. The magnet 10 with the closed-path pattern has a closed-path pattern with a width W and a length L in the plane of the thin film, and both end portions in the length L direction are connected. In FIG. 1, a portion of the closed-path pattern is shown. Both ends of the magnet 10 with the closed-path pattern shown in FIG. 1 extend to connect to each other. In the present example, the length L is the length of one circuit of the closed path, passing though the center of the width W.

With $\lambda$ indicating the diameter of the skyrmion 40, the width W of the magnet 10 with the closed-path pattern is preferably such that $W > 0.5\lambda$. When the width W is smaller than this, the skyrmion 40 cannot exist in the magnet 10 with the closed-path pattern. In FIG. 1, each arrow indicates the orientation of the magnetic moment in the skyrmion 40. The x axis and the y axis are orthogonal to each other, and the z axis is orthogonal to the xy plane.

The magnet 10 with the closed-path pattern has a plane that is parallel to the xy plane. The skyrmion 40 has a magnetic moment whose orientation changes in a spiral according to the position in this plane of the magnet 10 with the closed-path pattern. In the present example, the orientation of the magnetic field applied to the magnet 10 with the closed-path pattern is the +z direction. A magnetic field with a prescribed strength is applied uniformly to the entire closed-path magnet 10. In this case, the magnetic moment of the outermost circumference of the skyrmion 40 in the present example is oriented in the +z direction.

The magnetic moment in the skyrmion 40 is arranged in a manner to rotate in a spiral from the outermost circumference toward the inside. Furthermore, the orientation of the magnetic moment changes gradually from the +z direction to the −z direction in accordance with the rotation in this spiral.

Between the center and the outermost circumference of the skyrmion 40, the orientation of the magnetic moment spirals continuously. In other words, the skyrmion 40 has a nanoscale magnetic structure in which the magnetic moment has a spiral structure. In a case where the magnet 10 with the closed-path pattern in which the skyrmion is present is a thin board-shaped solid material, each magnetic moment forming the skyrmion is a magnetic moment with the same orientation in the thickness direction of the magnet 10 with the closed-path pattern. In other words, the magnetic moment structure of the skyrmion is formed from magnetic moments having the same orientation from a front surface to a back surface in a depth direction (z direction) of the thin film structure. Essentially, the skyrmion 40 has a cylindrical pillar shape with a height equal to the thickness of the magnet 10 with the closed-path pattern.

The skyrmion 40, which is the nanoscale magnetic structure having the spiral structure, is characterized by a skyrmion number. The skyrmion number is expressed by Expression 1 and Expression 2 shown below. In Expression 2, the polar angle $\Theta(r)$ between the magnetic moment and the z axis is a continuous function of the distance r from the center of the skyrmion 40. When r is changed from 0 to ∞, $\Theta(r)$ is changed from π to 0 or from 0 to π.

$$N_{sk}=1/4\pi \iint d^2r\, n \cdot [(\partial n/\partial x) \times (\partial n/\partial y)] \quad \text{Expression 1:}$$

$$n(r)=(\cos \Phi(\phi)\sin \Theta(r), \sin \Phi(\phi)\sin \Theta(r), \cos \Theta(r)) \quad \text{Expression 2:}$$

$$\Phi(\phi)=m\,\phi+\gamma$$

In expression 1, n(r) is the magnetic moment of the skyrmion at the position r. In expression 2, m is the vorticity and γ is the helicity. From Expression 1 and Expression 2, when, r is changed from 0 to ∞ and $\Theta(r)$ changes from π to 0, Nsk=−m.

Furthermore, as described further below, when current flows through the magnet 10 with the closed-path pattern, the skyrmion 40 is transferred on the magnet 10 with the closed-path pattern. The transfer direction is a direction perpendicular to the direction of the electron current. For example, in a case where the electron current flows from the positive side of the x axis toward the negative side of the x axis, the skyrmion 40 is transferred from the negative side of the y axis toward the positive side of the y axis.

Figure 2:
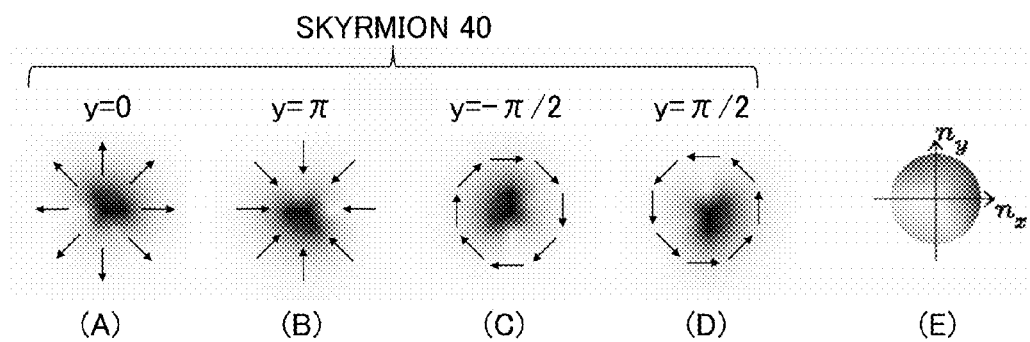
FIG. 2 shows a skyrmion in which the helicity $\gamma$ is different

FIG. 2 is a schematic view of skyrmions 40 in which the helicity γ is different. In particular, FIG. 2 shows an example in a case where the skyrmion number Nsk=−1. In FIG. 2, (E) shows the coordinates adopted by the magnetic moment n (right-handed system). Since a right-handed system is used, the $n_z$ axis adopts an orientation from behind to in front of the plane of the drawing, relative to the $n_x$ axis and the $n_y$ axis that are parallel to the plane of the drawing. In (A) to (E) of FIG. 2, the shading indicates the orientation of the magnetic moment.

The magnetic moment shown by the shading on the circumference in (E) of FIG. 2 has an orientation in the $n_x$-$n_y$ plane. In contrast to this, the magnetic moment indicated by the lightest shading (white) at the center of the circle in (E) of FIG. 2 has an orientation from behind to in front of the plane of the drawing. The angle of the magnetic moment indicated by the shading at each position from the circumference to the center relative to the $n_z$ axis adopts a value from π to 0 according to the distance from the center. The orientation of each magnetic moment in (A) to (D) of FIG. 2 is indicated by the same shading as in (E) of FIG. 2. The magnetic moments indicated by the darkest shading (black), such as the centers of the skyrmions 40 in (A) to (D) of FIG. 2, have an orientation from in front of the plane of the drawing to behind the plane of the drawing. Each arrow in (A) to (D) of FIG. 2 indicates the magnetic moment at a prescribed distance from the center of the magnetic structure. The magnetic structures shown in (A) to (D) of FIG. 2 are each in a state that can be defined as a skyrmion 40.

In (A) of FIG. 2 (γ=0), the shading at a prescribed distance from the center of the skyrmion 40 matches the shading in the circumference in (E) of FIG. 2. Therefore, the orientation of the magnetic moment indicated by the arrows in (A) of FIG. 2 forms a radial shape from the center toward the outer side. Compared to each magnetic moment in (A) of FIG. 2 (γ=0), the orientation of each magnetic moment in (B) of FIG. 2 (γ=π) is an orientation obtained by rotating each magnetic moment in (A) of FIG. 2 by 180°. Compared to each magnetic moment in (A) of FIG. 2 (γ=0), the orientation of each magnetic moment in (C) of FIG. 2 (γ=−π/2) is an orientation obtained by rotating each magnetic moment in (A) of FIG. 2 by −90° (rotating 90° to the right).

Compared to each magnetic moment in (A) of FIG. 2 (γ=0), the orientation of each magnetic moment in (D) of FIG. 2 (γ=π/2) is an orientation obtained by rotating each magnetic moment in (A) of FIG. 2 by 90° (rotating 90° to the left). The skyrmion with a helicity γ=π/2 shown in (D) of FIG. 2 corresponds to the skyrmion 40 shown in FIG. 1.

Although it appears that the magnetic structures of the four examples shown in (A) to (D) of FIG. 2 are different, these magnetic structures are topologically the same. The skyrmions having the structures shown in (A) to (D) of FIG. 2 exist stably once generated, and work as carriers that serve to transfer information in the magnet 10 with the closed-path pattern to which an external magnetic field has been applied.

Figure 3:
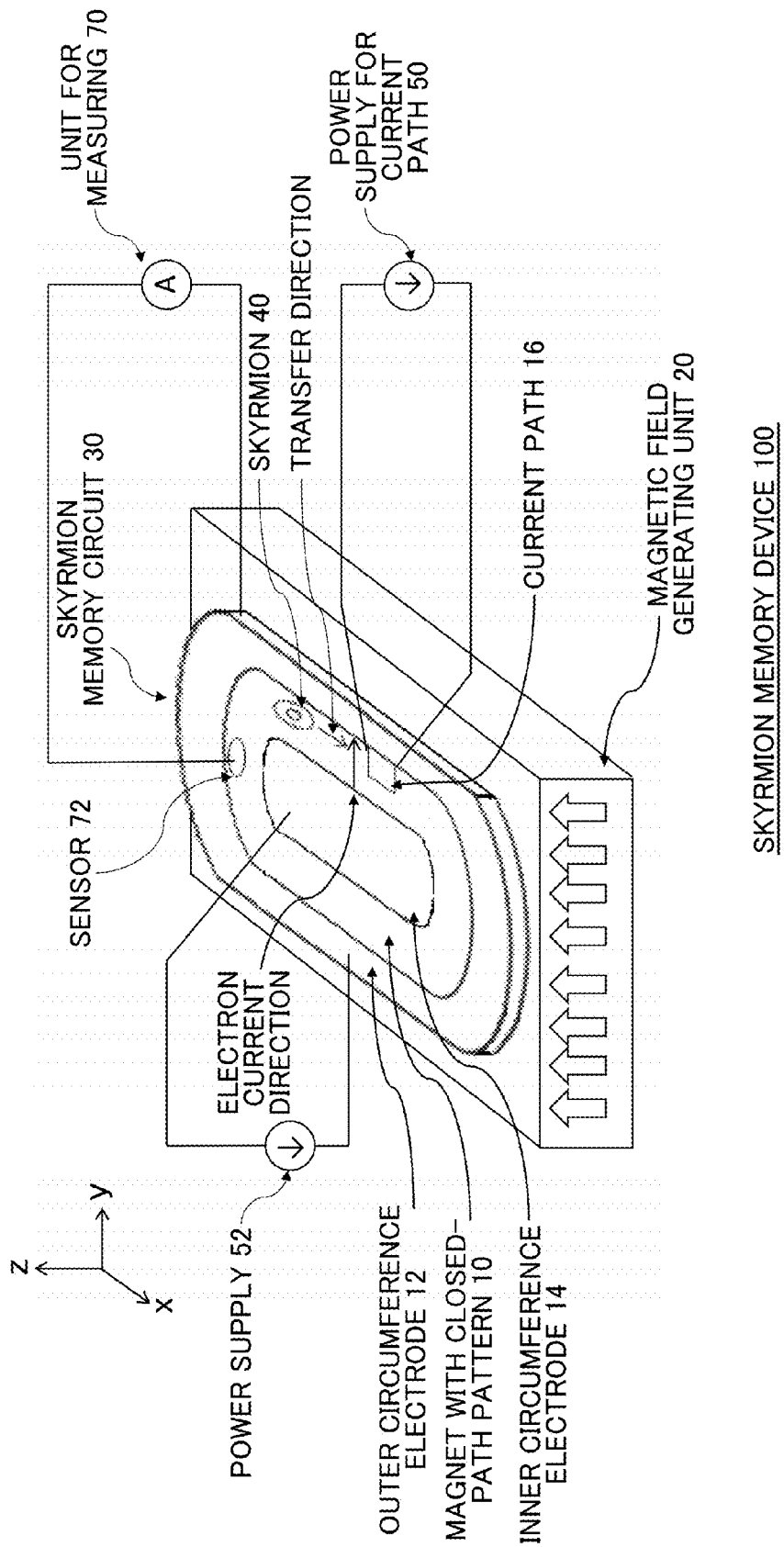
FIG. 3 is a schematic view of an exemplary configuration of a skyrmion memory device 100 that causes current to flow between the inner circumference electrode and the outer circumference electrode in the magnet having the closed-path pattern, and circularly transfers the skyrmions in a direction substantially perpendicular to the current direction.

FIG. 3 shows an exemplary configuration of a skyrmion memory device 100. The skyrmion memory device 100 saves information using skyrmions 40. For example, the presence or lack of a skyrmion 40 at a prescribed position in the magnet 10 with the closed-path pattern corresponds to one bit of information. The skyrmion memory device 100 in the present example includes a skyrmion memory circuit 30, a magnetic field generating unit 20, and a power supply 50 for a current path and a unit for measuring 70 for one or more current paths. The power supply 50 for the current path does not need to be mounted in the skyrmion memory device 100, and may be arranged outside the skyrmion memory device 100. Furthermore, the skyrmion memory device 100 may receive drive power from a power supply 52. The power supply 52 may be provided outside the skyrmion memory device 100.

The skyrmion memory circuit 30 is capable of generating and deleting a skyrmion 40, circularly transferring the skyrmion 40, and increasing and decreasing the transfer velocity. The skyrmion memory circuit 30 includes the magnet 10 with the closed-path pattern, an outer circumference electrode 12, an inner circumference electrode 14, and one or more current paths 16 and sensors 72.

The magnet 10 with the closed-path pattern exhibits at least a skyrmion crystal phase and ferromagnetic phase, according to the applied magnetic field. A magnet having a skyrmion crystal phase and ferromagnetic phase is a necessary condition for being a magnet in which skyrmions 40 can be generated in the magnet 10 with the closed-path pattern. For example, the magnet 10 with the closed-path pattern is a chiral magnet. The magnet 10 with the closed-path pattern is shaped as a thin layer. The diameter of a skyrmion 40 refers to the diameter of the outermost circumference of the skyrmion. In the present example, the outermost circumference refers to the circumference of the magnetic moment oriented in the same direction as the external magnetic field shown in FIG. 1.

The magnet 10 with the closed-path pattern has a closed-path pattern as described above. The magnet 10 with the closed-path pattern includes an inner circumference edge that defines an inner circumference in the plane of the closed-path pattern and an outer circumference edge that defines an outer circumference. The inner circumference electrode 14 and the outer circumference electrode 12 are connected to the magnet 10 with the closed-path pattern in a plane parallel to an extension direction of the magnet 10 with the closed-path pattern. The inner circumference electrode 14 is connected along the inner circumference edge of the magnet 10 with the closed-path pattern and the outer circumference electrode 12 is connected along the outer circumference edge of the magnet 10 with the closed-path pattern.

The magnetic field generating unit 20 applies a first magnetic field to the magnet 10 with the closed-path pattern. The magnetic field generating unit 20 in the present example generates the first magnetic field causing the magnet 10 with the closed-path pattern to be in the ferromagnetic phase. Furthermore, the magnetic field generating unit 20 applies to the magnet 10 with the closed-path pattern the first magnetic field substantially perpendicular to the surface of the magnet 10 with the closed-path pattern having the thin film shape. In the present example, the magnet 10 with the closed-path pattern has a surface (one surface) parallel to the xy plane, and the magnetic field generating unit 20 generates the first magnetic field in the +z direction, as shown by the arrows in the magnetic field generating unit 20. The magnetic field generating unit 20 may be provided facing the back surface of the magnet 10 with the closed-path pattern. The magnetic field generating unit 20 may be distanced from the magnet 10 with the closed-path pattern, or may contact the magnet 10 with the closed-path pattern. If the magnetic field generating unit 20 is metal, the magnetic field generating unit 20 is preferably distanced from the magnet 10 with the closed-path pattern.

The following further describes the mechanism of the motion of a skyrmion in the magnet 10 with the closed-path pattern. The details of this are described further below. Current flows in the magnet 10 with the closed-path pattern in a direction from within the outer circumference electrode 12 toward the inner circumference electrode 14. When thinking about the motion of the skyrmion, the electron current in the opposite direction of the current may be thought of as the drive force. In other words, the electron current flows from the inner circumference electrode 14 to the outer circumference electrode 12.

The skyrmion 40 receives two types of force as a result of the electron current. One type is force having the same orientation as the electron current. The other type is force generated from the balance between a trapping force and the Magnus force. The first force caused by the electron current presses the skyrmion 40 toward the outer circumference edge of the magnet 10 with the closed-path pattern, and the second force causes the skyrmion 40 to be transferred in the transfer direction shown by the arrow, which is substantially perpendicular to the electron current.

The arrangement in which the direction of the drive current of the skyrmion 40 and the transfer direction of the skyrmion 40 are substantially perpendicular is defined as a transverse transfer arrangement. This differs from the longitudinal transfer arrangement defined previously. The following describes the details of the motion of the skyrmion in this transverse transfer arrangement. In the case of the transverse transfer arrangement, it is possible to perform transfer at a high velocity that is 10 times to 100 times the transfer velocity of the skyrmion with the longitudinal transfer arrangement in the case where the drive current is substantially parallel to the direction of the skyrmion.

As a result, it is possible to achieve the increase of the transfer velocity of the skyrmion and the reduction of the drive current density, which are issues when using the skyrmion as a unit of information. The electrode arrangement for a current adopting this transverse transfer arrangement need only be along a length direction of the thin line. This determines an important electrode arrangement in terms of utilizing a memory with a transverse transfer arrangement. Furthermore, as shown in FIG. 3, with the transverse transfer arrangement, the skyrmion can be circularly transferred by forming the magnet having the skyrmion as a closed circuit shape in which both ends of the thin line structure are connected.

When the skyrmion is transferred, it is possible to uniquely determine the transfer direction according to the direction in which the current flows. As shown in FIG. 3, in the case of an electron current direction that is from the inner circumference electrode 14 to the outer circumference electrode 12, the skyrmion is always transferred clockwise as seen from above in the z direction. The circular transfer having a determined direction determines the writing and reading order, and it is possible to uniquely determine the address of information when writing and reading. In the case of the race track structure of Patent Document 1, the domain must be transferred in one left-right direction when writing, and the domain must be transferred in the opposite direction when reading.

When the skyrmion makes a lap around the closed path, it is possible to read the information while maintaining the same circulation direction. The electron current may be from the outer circumference electrode 12 to the inner circumference electrode 14. In this case, the transfer direction of the skyrmion is counter-clockwise, and the skyrmion is circularly transferred along the inner circumference edge of the magnet 10 with the closed-path pattern.

By applying a current with a prescribed current density that is greater than or equal to the current density needed for the transfer of the skyrmion to the magnet 10 with the closed-path pattern, it is possible to delete all of a plurality of the skyrmions being circularly transferred in the magnet 10 with the closed-path pattern. In other words, it is possible to have the same function as a flash memory of an electronic device. This is also a very significant feature in terms of actual implementation. The current applied to the skyrmion memory circuit is only needed during generation (WRITE), deletion (ERASE), and reading (WORD) of skyrmions. When idle, there is no need to transfer a skyrmion, and the power consumption is zero.

The current path 16 is provided on the front surface of the magnet 10 with the closed-path pattern and surrounds an end region that includes the end portions of the magnet 10 with the closed-path pattern. The power supply 50 for the current path applies a second magnetic field to this end region by causing current to flow through the current path 16. For example, the power supply 50 for the current path causes current to flow through the current path 16 in a manner to generate a second magnetic field with the opposite orientation of the first magnetic field generated by the magnetic field generating unit 20.

In the end region, a portion of the first magnetic field generated by the magnetic field generating unit 20 is canceled out by the second magnetic field caused by the current flowing through the current path 16. At this time, the second magnetic field applied by the current flowing through the current path 16 is weaker than the first magnetic field applied by the magnetic field generating unit 20. Therefore, one skyrmion 40 with the ferromagnetic phase is generated in the end region. In order to generate the skyrmion, it is only necessary that the end region at one location be formed in the skyrmion memory circuit 30.

As a result, it is possible to significantly reduce the number of stages of the writing lines for writing the data to the skyrmion memory circuit 30. Since the skyrmion 40 is circularly transferred, the next skyrmion 40 is generated at a timing when the generated skyrmion 40 has been transferred a prescribed distance. As a result, it is possible to form many skyrmion strings in the skyrmion memory circuit.

When actually used in a device, one memory handles information that is from several kilobits to several megabits, and therefore the number of skyrmions being circularly transferred in one skyrmion memory circuit is from several thousands to several millions. Furthermore, several thousand skyrmion memory circuits are arranged in a planar shape and information that is from several hundred megabits to several gigabits is stored, thereby enabling the realization of a large-scale nonvolatile memory.

The sensor 72 is provided facing the front surface of the magnet 10 with the closed-path pattern. A magnetic sensor is formed by various types of sensors such as TMR elements and magnetic resistance elements. The sensor 72 detects the skyrmions in a region of the magnet 10 with the closed-path pattern opposite the sensor 72. For example, the sensor 72 changes the resistance value according to the presence or lack of skyrmions. The change in the resistance value of the magnetic sensor changes the amount of current flowing through the magnetic sensor. The unit for measuring 70 measures the current amount of the sensor 72. In this way, the sensor 72 and the unit for measuring 70 can detect whether a skyrmion 40 has passed through the region opposite the sensor 72. At least one magnetic sensor for sensing the skyrmions in the magnet with the closed-path pattern may be provided. As a result, the number of signal lines for writing can be significantly reduced.

The following describes the motion of a skyrmion that is a nanoscale magnetic structure in which the skyrmion number Msk=−1, as described in FIG. 2.

Figure 4:
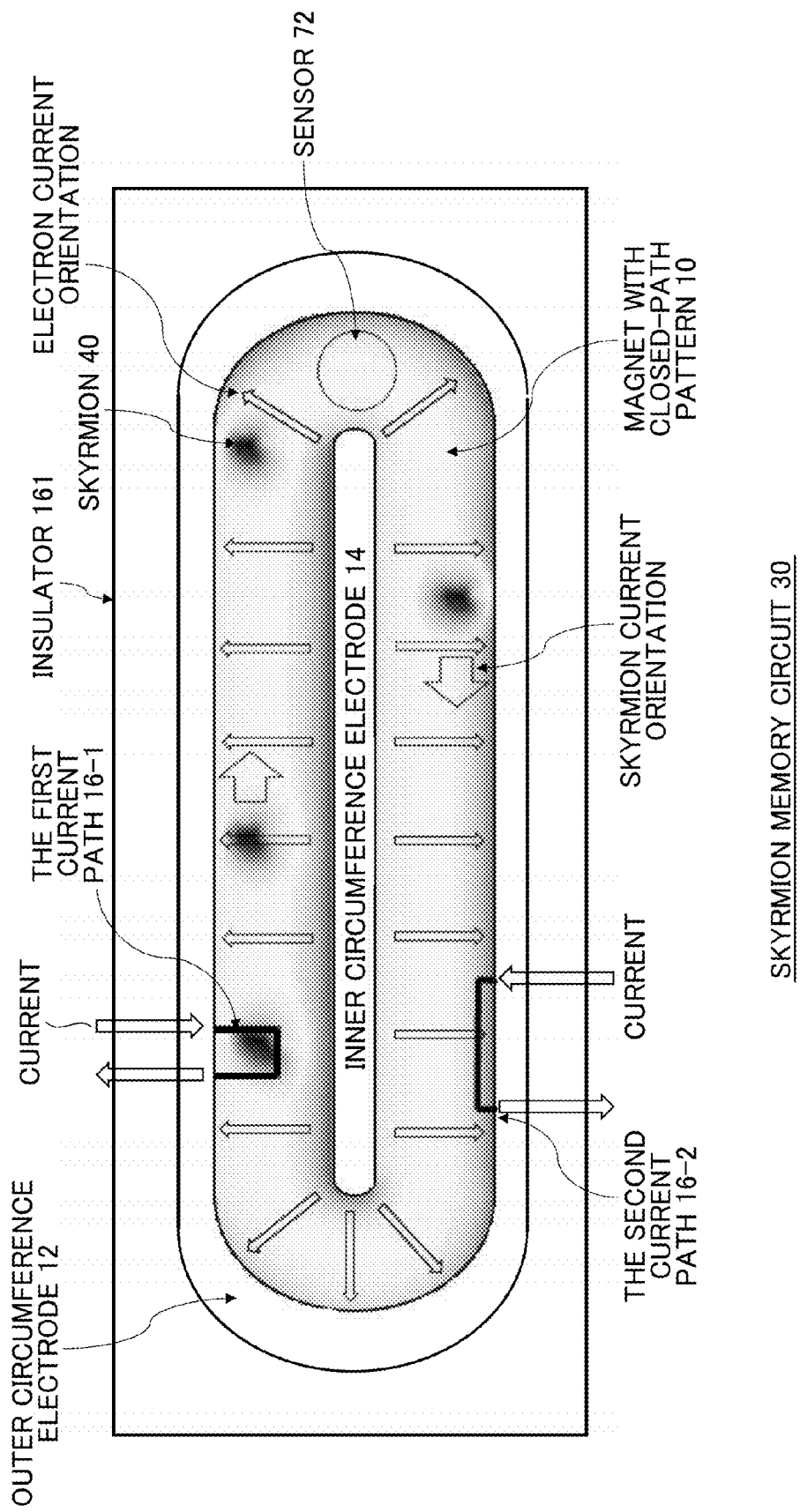
FIG. 4 shows simulation results showing the skyrmion memory circuit 30 that circularly transfers the skyrmions in the transverse transfer arrangement.

FIG. 4 shows the skyrmion memory circuit 30 using the magnet 10 with the closed-path pattern. FIG. 4 shows simulation results indicating the motion of the skyrmion 40 in the transverse transfer arrangement. In FIG. 4, the magnet 10 with the closed-path pattern, the outer circumference electrode 12, the inner circumference electrode 14, and the skyrmion 40 are shown. It should be noted that the electron current, the sensor 72, the second current path 16-2, and the like are shown in addition to the simulation results for easier understanding. Furthermore, an insulator 161 is arranged on the outer side of the outer circumference electrode 12.

The skyrmion 40 is transferred in a direction substantially perpendicular to the electron current (indicated by the large arrows) due to the Magnus force of the electron current from the inner circumference electrode 14 to the outer circumference electrode 12. Since the magnet 10 with the closed-path pattern has a closed-path pattern, the skyrmion 40 is circularly transferred in the magnet 10 with the closed-path pattern. Furthermore, the current density of the electron current for transferring the skyrmion 40 may be small, and there is no lower limit for this current density. The horizontal transfer velocity of the skyrmion 40 can be a high velocity that is approximately 100 to 1000 times faster than the transfer velocity of a skyrmion in a longitudinal transfer arrangement. In contrast to this, a large current density is necessary for transferring the skyrmion in the vertical arrangement described above.

The first magnetic field (oriented from the back surface to the front surface of the plane of the drawing) generated from the magnetic field generating unit 20 shown in FIG. 3 sets the magnet 10 with the closed-path pattern to the ferromagnetic phase. A skyrmion 40 that has been generated once exists stably even in the ferromagnetic phase, and therefore the skyrmion 40 can be used in an information storage medium.

As shown in FIGS. 3 and 4, when the inner circumferential portion of the magnet 10 with the closed-path pattern is an electrode with a negative potential, the outer circumferential portion of the magnet 10 with the closed-path pattern is an electrode with a positive potential, and a prescribed current is made to flow, the skyrmion 40 circulates to the right (clockwise) at a high velocity in a direction substantially perpendicular to the direction of the current, due to the Magnus force as described in detail further below. The magnetic moment of this skyrmion 40 has a spiral structure as shown in FIG. 1 from the front surface to the back surface of the magnet 10 with the closed-path pattern, and exists stably. The skyrmion 40 moves stably while holding this shape for the uneven region of the magnet end portions and the magnetic impurities in the magnet.

A coil (the first current path 16-1) that generates a localized magnetic field is arranged on the front surface of the magnet 10 with the closed-path pattern, and it is possible to generate or delete a plurality of skyrmions 40 by controlling the magnetic field strength formed in the coil.

Furthermore, if the current between the outer circumference electrode 12 and the inner circumference electrode 14 is increased compared to the current when the skyrmions 40 are circulating, it is possible to delete a plurality of skyrmions 40 at once in the skyrmion memory circuit 30 of the magnet 10 with the closed-path pattern and to delete the memory information en masse, and it is also possible to shorten the deletion time.

Furthermore, it is possible to provide a coil (the second current path 16-2) that can accelerate and decelerate the skyrmions 40. By reading the position of a circulating skyrmion 40 with the sensor 72 and causing current to flow through the second current path 16-2 if necessary, the position can be corrected.

The skyrmion memory circuit 30 that can generate the skyrmions 40 uses the magnet 10 with the closed-path pattern. The magnet 10 with the closed-path pattern is, for example, a chiral magnet made of FeGe, MnSi, or the like. The magnet 10 with the closed-path pattern can be formed by using an exposure apparatus, an etching apparatus, or CMP (Chemical Mechanical Planarization) on a magnet thin film formed using MBE (Molecular Beam Epitaxy), sputtering, or the like. The outer circumference electrode 12 and the inner circumference electrode 14 are made of conductive and nonmagnetic metal, such as Cu, W, Ti, TiN, Al, Pt, or Au.

As described above, in a state where a magnetic field oriented in the +z direction is applied to the magnet 10 with the closed-path pattern, when a current is made to flow through the magnet 10 with the closed-path pattern in a direction of the inner circumference electrode 14 from the outer circumference electrode 12, the skyrmions 40 in the magnet 10 with the closed-path pattern move in the orientation of the arrows (orientation of the skyrmion current) along an edge portion of the magnet 10 with the closed-path pattern adjacent to the outer circumference electrode 12.

This motion of a skyrmion 40 can be described using the theory explained below. Here, R=(X, Y) indicates the center position of the magnetic structure (the skyrmion 40 in the present example). Furthermore, Vd indicates the velocity of the magnetic structure with the time differential of R. The behavior of this magnetic structure obeys the motion equation shown in Expression 3 below.

$$G \times (Vs-Vd) + D(\beta Vs - \alpha Vd) + F = 0 \quad \text{Expression 3}$$

In Expression 3 above, ×indicates a cross product. Furthermore, $Vs=-\xi j$, and this indicates the velocity of the conduction electrons. Yet further, $\xi=2eM/(pa^3)$, "a" is a lattice constant, M is the magnitude of the magnetic moment, and p is the spin polarization of the conduction electrons. Yet further, F in the third term is the force acting on the magnetic structure from a boundary between the electrodes (the outer circumference electrode 12 and the inner circumference electrode 14 in the present example) and the magnet, impurities, magnetic fields, and the like.

The Magnus vector G that characterizes the motion of the magnetic structure is expressed with a unit $e_z$ along the z direction, and $G=ge_z$. Here, using the skyrmion number, g is expressed such that $g=4\pi Nsk$. Furthermore, Nsk is the skyrmion number.

In a case where the magnetic structure is a skyrmion, the skyrmion number $Nsk=\pm 1$. In a case where the skyrmion has a longitudinal transfer arrangement, the dissipation process of the second term in Expression 3 can be ignored. Here, a is a Gilbert attenuation constant and β is an adiabatic constant. Furthermore, α and β are constants that are specific to substances. Yet further, β≈α. The tensor component $D_{ij}$ of D is such that $D_{xx}=D_{yy}\approx 4\pi$, and is otherwise 0. In a case of a skyrmion for which $Nsk=\pm 1$, the second term in Expression 3 can be ignored and, when F is sufficiently small, only the first term remains and Vd=Vs. At this time, Vd is the transfer velocity of the skyrmion with a longitudinal transfer arrangement, and therefore Vd (longitudinal transfer arrangement)=Vs.

On the other hand, in a case where the magnetic structure is a magnetic domain wall such as disclosed in Patent Document 1, the skyrmion number Nsk=0 and g=0, such that the first term is zero. When F is sufficiently small, only the second term in Expressions 3 remains, and Vd=(β/α)Vs. Since β≈α, Vd≈Vs. The velocity of the magnetic domain wall is understood to be approximately the same as the velocity of the skyrmion in the longitudinal transfer arrangement.

In the transverse transfer arrangement in the present invention, the movement velocity of the skyrmion 40 can be made larger than the velocity of the magnetic walls and the velocity in the longitudinal transfer arrangement, as described below.

In FIGS. 3 and 4, the orientation of the electron current is the y axis and the orientation of the skyrmion flow is the x axis. In the case of such a transverse transfer arrangement, a very large spin transfer torque effect such as described below is generated.

When Vd (transverse transfer arrangement)=$(Vd^x, 0, 0)$, Vs=$(0, Vs^y, 0)$, F=$(0, F^y, 0)$, and G=$(0, 0, g)$, Expression 4 is obtained from Expression 3. Here, $Vd^x$ is the velocity of the skyrmion in the x direction and $Vs^y$ is the velocity of the electron current in the y direction.

$$-gVs^y - D\alpha Vd^x = 0 \quad \text{Expression 4}$$

Expression 5 is obtained from Expression 4.

$$Vd^x = -gVs^y/D\alpha \quad \text{Expression 5}$$

Since $g=-4\pi$ and $D\approx 4\pi$, Expression 6 shown below can be obtained.

$$Vd^x \approx Vs^y/\alpha \quad \text{Expression 6}$$

In other words, the velocity $Vd^x$ of the skyrmion in the transverse transfer arrangement is $Vs^y/\alpha$. The transfer velocity of the skyrmion in the longitudinal transfer arrangement is $Vs^y$. Here, α is approximately from 0.01 to 0.001, and therefore $Vd^x \approx 10^2 Vs^y$. The skyrmion transfer velocity $Vd^x$ in the x direction is $10^2$ to $10^3$ times the transfer velocity $Vs^y$ of the skyrmion in the longitudinal transfer arrangement. This indicates that, in the case of the transverse current arrangement, the velocity of the skyrmion 40 can be made 100 to 1000 times the velocity of the skyrmion in the longitudinal current arrangement.

This result indicates that, when the necessary skyrmion transfer velocity is fixed, the current density of the transverse transfer arrangement can be decreased to be $10^{-2}$ to $10^{-3}$ times the current density of the longitudinal transfer arrangement. In a case of a skyrmion transfer velocity where the transfer velocity in the longitudinal transfer arrangement is 15 m/s, the current density is $2\times 10^{11}$ Am$^{-2}$, as described previously (Non-Patent Document 2). In a case where the skyrmion transfer velocity in the transverse transfer arrangement is approximately the same, the current density is approximately from $2\times 10^8$ Am$^{-2}$ to $2\times 10^9$ Am$^{-2}$. This is a current density that is approximately two orders of magnitude smaller than the current density in the longitudinal transfer arrangement. This indicates that the desired transfer velocity can be obtained with a sufficiently low current density that is less than or equal to the current density limit of the wires in LSI manufacturing at the current time. This indicates that the skyrmion memory device is a device that can serve as a device with low power consumption.

A pinning effect resulting from impurities or the like can also be discussed using Expression 3. Specifically, if $F_{pin}$ is added to Expression 3, it is understood that the pinning effect for the motion of the skyrmion can be significantly reduced by approximately β times compared to a case of the magnetic walls.

In other words, the pinning effect on the skyrmion velocity is small, and the influence from the dissipation effect is also small. This feature also has significant merit when utilizing the skyrmion transfer method in a memory.

From the above, it is understood that, in the case of the transverse current arrangement, the movement velocity of the skyrmion 40 is 100 times to 1000 times the movement velocity of the skyrmion with the longitudinal current arrangement. Since the movement velocity of the magnetic domain is approximately the same as the transfer velocity in the longitudinal current arrangement, the skyrmion movement velocity in the transverse current arrangement is 100 times to 1000 times the movement velocity of the magnetic domain wall in the same manner. As a result of the above, it is possible to realize an increase in the skyrmion transfer velocity and a decrease in the current density needed for transfer, which are problems to be solved when adopting the skyrmion 40 in a memory element.

Instead of a chiral magnet in which the magnet exhibits spiral magnetism, the conclusions described above can also be applied to a dipole magnet, a frustrated magnet, or a structure obtained by layering magnets and nonmagnets. The dipole magnet is a magnet in which the magnetic dipole interaction is important.

The frustrated magnet is a magnet including a spatial structure of magnetic interaction that prefers a magnetically mismatched state. The magnet including a layered structure of a magnetic material and a nonmagnetic material is a magnet in which the magnetic moment of the magnetic material contacting the nonmagnetic material is modulated by the spin trajectory interaction of the nonmagnetic material. The present invention configured as described above can also be embodied as a magnetic element capable of deleting one or more skyrmions that are generated and transferred in a magnet.

Furthermore, by causing the current flowing through the magnet 10 with the closed-path pattern in a direction from the outer circumference electrode 12 to the inner circumference electrode 14 to be larger than during the transfer of the skyrmion 40, it is also possible to delete all of the one or more skyrmions 40 present in the magnet 10 with the closed-path pattern. The skyrmion 40 receives a force with a magnitude corresponding to the current flowing through the magnet 10 with the closed-path pattern, in a direction opposite this current (a direction of the electron current). Therefore, when this current is sufficiently large, all of the skyrmions 40 that have been transferred exceed the potential barrier at the boundary between the outer circumference electrode 12 and the magnet 10 with the closed-path pattern and disappear. Accordingly, during transfer of the skyrmions 40, the power supply 52 causes an amount of current that does not cause the skyrmions 40 to exceed this potential barrier to flow through the magnet 10 with the closed-path pattern, and during en masse deletion of the skyrmions 40, the power supply 52 causes an amount of current that causes the skyrmions 40 to exceed this potential barrier to flow through the magnet 10 with the closed-path pattern.

In the skyrmion memory circuit 30 shown in FIG. 4, the first current path 16-1 and the second current path 16-2 are provided. The first current path 16-1 is used to generate and delete skyrmions 40. The second current path 16-2 is used to accelerate and decelerate circulating skyrmions 40.

The first current path 16-1 is provided in a manner to surround an end portion of the magnet 10 with the closed-path pattern on the outer circumference electrode 12 side. As described above, the magnetic field generating unit 20 sets the magnet 10 with the closed-path pattern to the ferromagnetic phase. Therefore, the magnetic moment in the magnet 10 with the closed-path pattern is oriented in the same direction as the first magnetic field. However, it should be noted that the magnetic moment in the end portion of the magnet 10 with the closed-path pattern is not oriented in the same direction as the first magnetic field, and has a slope relative to the first magnetic field. Therefore, the skyrmion 40 is more easily generated in the end portion of the magnet 10 with the closed-path pattern than in other regions. By providing the first current path 16-1 in a manner to surround the region including the end portion of the magnet 10 with the closed-path pattern, the skyrmion 40 can be easily generated.

The current path 16 in the present example includes a continuous conduction path that, in the xy plane, cuts across the end portion of the magnet 10 with the closed-path pattern at least once from the outer circumference electrode 12 side to the magnet 10 with the closed-path pattern side and cuts across the end portion of the magnet 10 with the closed-path pattern at least once from the magnet 10 with the closed-path pattern side to the outer circumference electrode 12 side. In this way, the current path 16 surrounds the region including the end portion of the magnet 10 with the closed-path pattern. The current path 16 does not need to form a closed region in the xy plane. A combination of the current path 16 and the end portion need only form the closed region in the front surface of the magnet 10 with the closed-path pattern. Current is applied to the first current path 16-1 formed in this manner in the direction of the arrows shown in FIG. 4. As a result, a magnetic field with an orientation opposite the direction of the first magnetic field is generated in the current path, and the magnetic field strength in the z direction in the current path weakens. As a result, the skyrmion can be generated in the current path.

The skyrmion 40 that has been generated once exists stably in the ferromagnetic phase, and therefore the skyrmion 40 can be used in an information storage medium. The generated skyrmion 40 is circularly transferred in the skyrmion memory circuit 30 of the magnet 10 with the closed-path pattern due to the current flowing between the outer circumference electrode 12 and the inner circumference electrode 14. Furthermore, when the circularly transferred skyrmion 40 reaches the first current path 16-1, this skyrmion 40 can be deleted by causing current to flow through the first current path 16-1.

This deletion method differs from the method whereby a large number of skyrmions in the skyrmion memory circuit 30 due to the current flowing between the outer circumference electrode 12 and the inner circumference electrode 14 of the skyrmion memory circuit 30 are deleted en masse. By causing a single pulse current to flow through the first current path 16-1, a single skyrmion 40 near the end region surrounded by the first current path 16-1 is deleted at a specified timing. In other words, this deletion method provides a method for deletion of bit units.

When deleting the skyrmions 40 individually, a current that is smaller than the current used when generating a skyrmion is caused to flow through the first current path 16-1 at the timing when the skyrmion 40 has drawn near the first current path 16-1. As a result, the magnetic field at the end region surrounded by the first current path 16-1 weakens and an attractive force is generated attracting the circulated skyrmion 40 into the current path. This attractive force induces an end portion Magnus force on the skyrmion 40 having a spiral structure, and bends the motion direction of this skyrmion 40.

As a result, the skyrmion 40 moves in a direction toward the outer circumference electrode 12. If the Magnus force is sufficiently large, the skyrmion 40 overcomes the potential barrier at the boundary between the magnet 10 with the closed-path pattern and the outer circumference electrode 12 and disappears. The following describes the method for generating, transferring, and deleting a skyrmion 40, through embodiment examples.

First Embodiment Example

In the first embodiment example, simulation experiment results of the generation and transfer of a skyrmion are shown. The motion of the magnetic moment of the skyrmion can be expressed with the motion equation shown in Expression 8. The following shows a numerical solution of the equations shown below, which include terms for adiabatic and non-adiabatic spin transfer torque.

$$dM_r/dt = -M_r \times B_r^{eff} + \alpha/M \cdot M_r \times dM_r/dt + pa^3/2eM(j(r) \cdot \nabla)$$
$$M_r - (pa^3\beta/(2eM^2))[Mr \times (j(r) \cdot \nabla)M_r]$$

Expression 8:

$$H = -J\Sigma Mr \cdot (M_{r+ex} + M_{r+ey}) - Dm\Sigma(M_r \times M_{r+ex} \cdot e_x + M_r \times M_{r+ey} \cdot e_y) - B \cdot \Sigma Mr$$

Expression 9:

Here, as a result of $B_r^{eff} = -(1/(h\gamma))(\partial H/\partial M_r)$, Expression 8 and Expression 9 are associated with each other. Furthermore, $\gamma = g\mu B/h$ (>0) is the magnetic rotation ratio, h is the Planck constant, $M_r = M \cdot n(r)$, $M_r$ indicates the magnetic moment, n(r) is the unit vector indicating the orientation of the magnetic moment of the skyrmion 40 at the position r shown in Expression 2, and ×indicates the cross product in Expression 8 and Expression 9 above. Yet further, $e_x$ and $e_y$ are the unit vectors in the x and y direction, and $M_{r+ex}$ and $M_{r+ey}$ indicate the magnetic moments at positions differing from Mr by the unit vectors in the x and y directions.

Here, the Hamiltonian H shown in Expression 9 is that of a chiral magnet. Concerning a dipole magnet, a frustrated magnet, and a magnet formed from a layered structure of a magnetic material and a nonmagnetic material, this H expression need only be replaced with a term describing the corresponding magnet.

Figure 5:
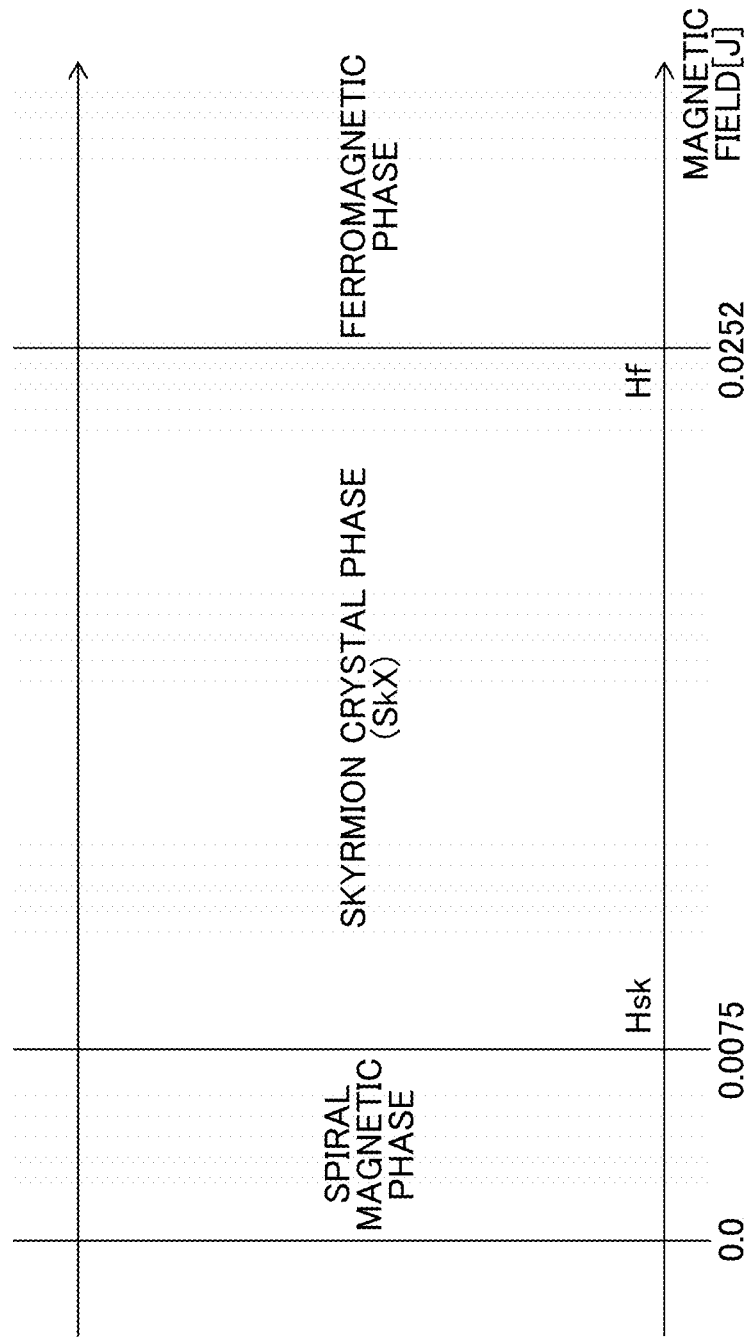
FIG. 5 is a magnetic phase diagram of a chiral magnet used in the magnet with the closed-path pattern.

FIG. 5 is a phase diagram showing the magnetic field dependency of the chiral magnet magnetic phase used in the magnet 10 with the closed-path pattern. In the present embodiment example, the simulation experiment was performed with the conditions of Hsk and Hf shown in FIG. 5. The chiral magnet is a magnet that enters the skyrmion crystal phase (SkX) from the spiral magnetic phase due to the magnetic field strength Hsk, and enters the ferromagnetic phase from the skyrmion crystal phase (SkX) at the greater magnetic field strength Hf. In this skyrmion crystal phase (SkX), a plurality of the skyrmions 40 are generated in the xy plane in alignment in the densest structure.

Next, with J indicating the magnitude of the magnetic exchange interaction of this magnet, various physical quantities are described using values standardized by this amount. In this case, the magnet enters the skyrmion crystal phase at a magnetic field strength Hsk −0.0075J, from the chiral phase having a magnetic structure with a spiral magnetic moment at a low magnetic field. The diameter λ of the skyrmion 40 is shown by $\lambda = 2\pi\sqrt{2} \cdot J \times a/Dm$. Here, "a" is the lattice constant of the magnet 10 with the closed-path pattern, and Dm is the magnitude of the Dzyaloshinskii-Moriya interaction and is a physical constant that is specific to the substance. Accordingly, the skyrmion diameter λ becomes a substance-specific constant. As shown in Non-Patent Document 1, the skyrmion diameter λ is 70 nm for FeGe and 18 nm for MnSi, for example.

The magnet 10 with the closed-path pattern used in the present embodiment example is a chiral magnet and the magnitude J of the magnetic exchange integration is 1 meV. The magnitude of the Dzyaloshinskii-Moriya interaction Dm=0.18J, the magnetic moment M=1, and the Gilbert damping coefficient α=0.04. For example, since Dm=0.18J, λ=50a. In a case where the magnet 10 with the closed-path pattern lattice constant a=0.5 nm, the size is such that λ=25 nm. Furthermore, with the chiral magnet used in the present embodiment example, the magnet enters the ferromagnetic phase from the skyrmion crystal at a magnetic field strength of Hf=0.0252J.

The orientation relationship between the orientation of the movement of the skyrmion 40 and the orientation of the current forming from the outer circumference electrode 12 and the inner circumference electrode 14 is important. The transverse transfer arrangement is used in which the orientation of the transfer of the skyrmion 40 and the orientation of the current are arranged as substantially perpendicular orientations.

In the simulation experiment of the generation and transfer of the skyrmion 40, as shown in FIG. 4, the electron current flows from the inner circumference electrode 14 to the outer circumference electrode 12. In the present example, the current density of the electron current is 0.001ξj. Here, ξ is a constant that makes the current density non-dimensional, and j is the current density that has been made non-dimensional. In the initial state, the skyrmion 40 does not exist in the skyrmion memory circuit.

The first magnetic field H from the magnetic field generating unit 20 placed on the back surface (e.g. the ferromagnetic thin film) is applied to the magnet 10 with the closed-path pattern from the back surface to the front surface (the +z direction). This first magnetic field has a value of H=0.03J that is slightly larger than the value of H=0.0252J that is the boundary between the skyrmion crystal phase and the ferromagnetic phase. Accordingly, the magnet 10 with the closed-path pattern forming the skyrmion memory circuit 30 is in the ferromagnetic phase, and the magnetic moment thereof is in a state of being oriented in the +z direction.

As shown in FIG. 4, the current path 16 is provided in the magnet 10 with the closed-path pattern. The shape of the current path 16 may be a multilayer wrapped coil shape, such as a coil. The first current path 16-1 is arranged in a manner to include the outer circumference edge of the magnet 10 with the closed-path pattern. The region surrounded by the first current path 16-1 is the end region A. The magnetic field strength in the end region A is Ha. The first current path 16-1 may be electrically insulated from the magnet 10 with the closed-path pattern. The coil current is made to flow through the first current path 16-1 in the direction shown in FIG. 4. This coil current generates the second magnetic field in the −z direction in the end region. The second magnetic field induced by this coil current is in the opposite direction of the uniform first magnetic field from the magnetic field generating unit 20, and therefore the magnetic field Ha in the +z direction of the end region is weakened. As a result, it is possible to generate the skyrmion 40 in the end region A. In a case where the first current path 16-1 does not include the end region A, the skyrmion cannot be generated.

Figure 6:
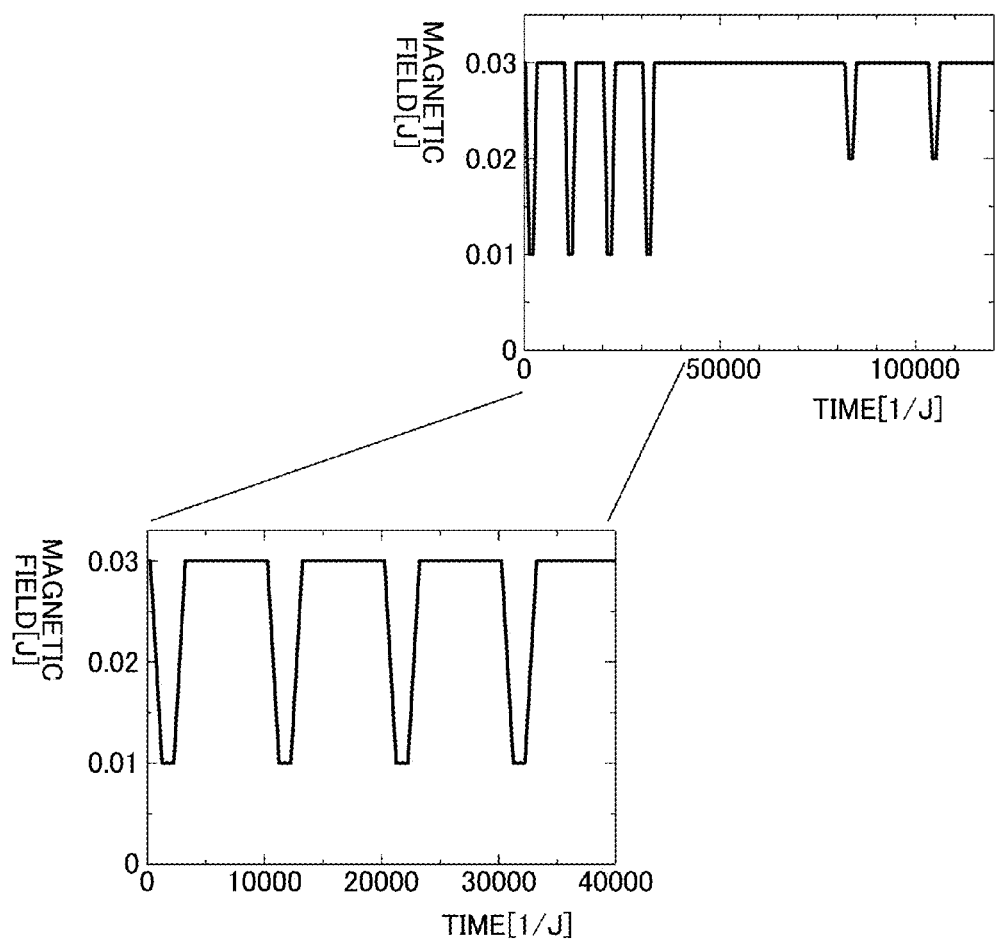
FIG. 6 shows the change over time of a magnetic field at the magnet side end portion S surrounded by the current path in the skyrmion memory circuit that circularly transfers the skyrmions, in which the electrodes are arranged with the transverse transfer arrangement in the magnet having the closed-path pattern.

The change over time of the magnetic field strength in the end region according to the simulation experiment is shown in FIG. 6. This change begins from a state where the first magnetic field H applied to the magnet 10 with the closed-path pattern is larger than Hf and the magnet 10 with the closed-path pattern enters the ferromagnetic phase. In the present example, the first magnetic field from the magnetic field generating unit 20 is in the +z direction and has a magnetic field strength H=0.03J. In this case, the entirety of the magnet 10 with the closed-path pattern is in the ferromagnetic phase, and therefore the skyrmion is not generated. In the same manner, the magnetic field of the end region is also 0.03J.

Next, the current is made to begin to flow through the first current path 16-1. The magnetic field Ha of the end region is decreased by the second magnetic field that is generated by the coil current. At t=1000(1/J), the magnetic field of the end region is Ha=0.01J. After this, until t=2000(1/J), a state where Ha=0.01J is maintained. The coil current is reduced and, at t=3000(1/J), the coil current is turned OFF. In this case, the magnetic field of the end region is Ha=0.03J. This state is maintained until t=10000(1/J). At t=10000(1/J), the coil current is again made to flow. The application of this coil current pulse is repeated four times. The two coil current pulses existing after t=50000(1/J) are current pulses for deleting the skyrmions 40.

FIGS. 7 to 12 show embodiment examples of the simulation results relating to the generation of the skyrmion 40 in a case where the application of the coil current pulse described above is repeated four times. The shading expressed on the $n_x$ and $n_y$ axes that intersect with each other in the drawings described below indicates the orientation of the magnetic moment expressed on the $n_x$ and $n_y$ axes. Furthermore, in the examples shown in FIGS. 7 to 12, the size of the end region surrounded by the first current path 16-1 is such that the width W1 and the length L1 that are in the same directions as the width direction and the length direction of the magnet 10 with the closed-path pattern, relative to the diameter λ of the skyrmion 40, are W1=0.75·λ and L1=0.5·λ. The length of this end region is a length parallel to the end portion of the magnet 10 with the closed-path pattern.

Figure 7:
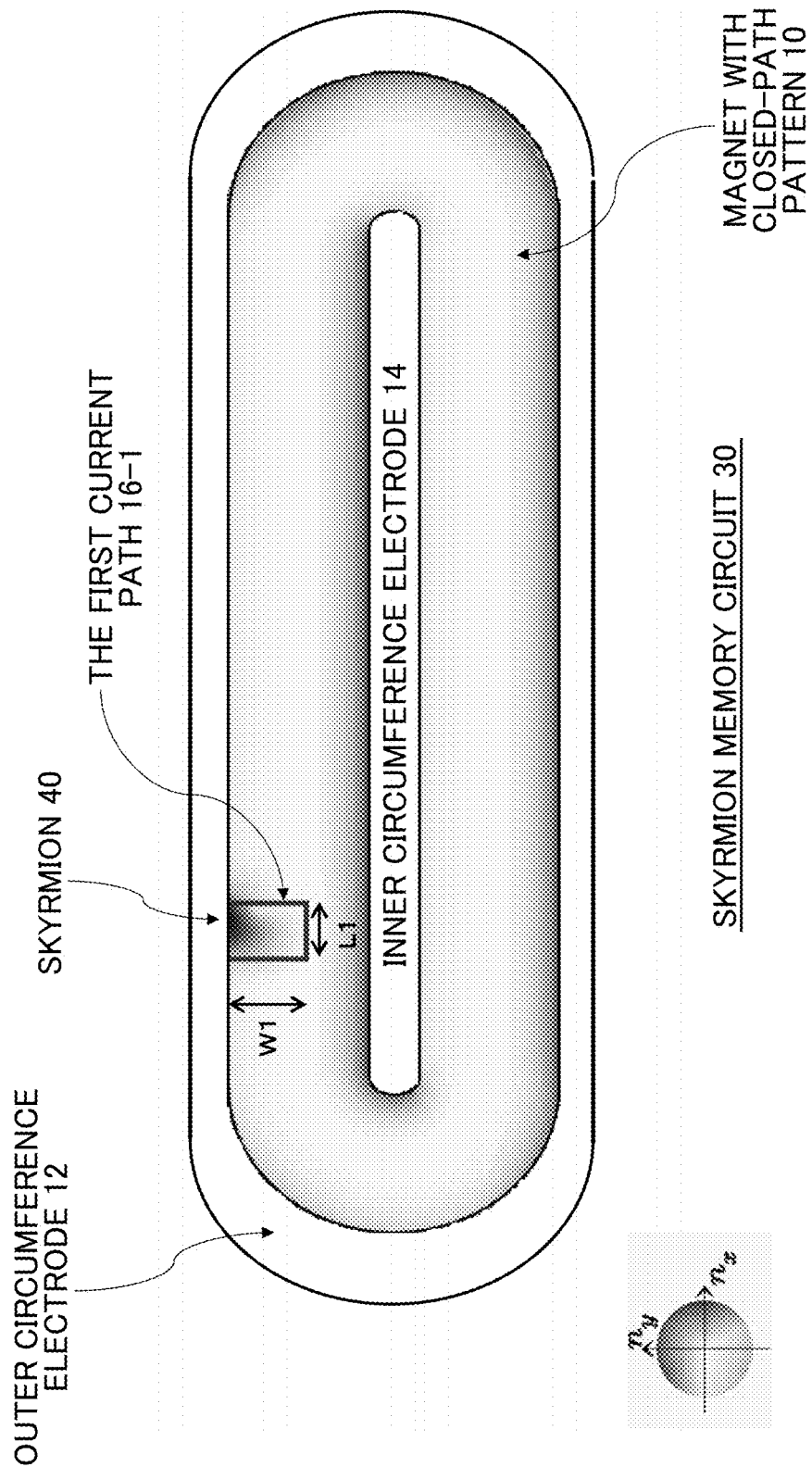
FIG. 7 shows the simulation results of the motion of the skyrmions being circularly transferred in the skyrmion memory circuit 30 at the time 1300/J.

FIG. 7 shows the simulation results of the motion of the skyrmion being circularly transferred in the skyrmion memory circuit 30 at a time 1300/J. A skyrmion 40 is being generated in the skyrmion memory circuit made from the magnet 10 with the closed-path pattern in the ferromagnetic phase. As shown in FIG. 7, the magnet 10 with the closed-path pattern is entirely in the ferromagnetic phase, and therefore the shading is shown as being white. However, it should be noted that the end portion of the magnet 10 with the closed-path pattern has a magnetic moment with an inclined orientation in the ferromagnetic phase as well, and therefore shading is produced.

Figure 8:
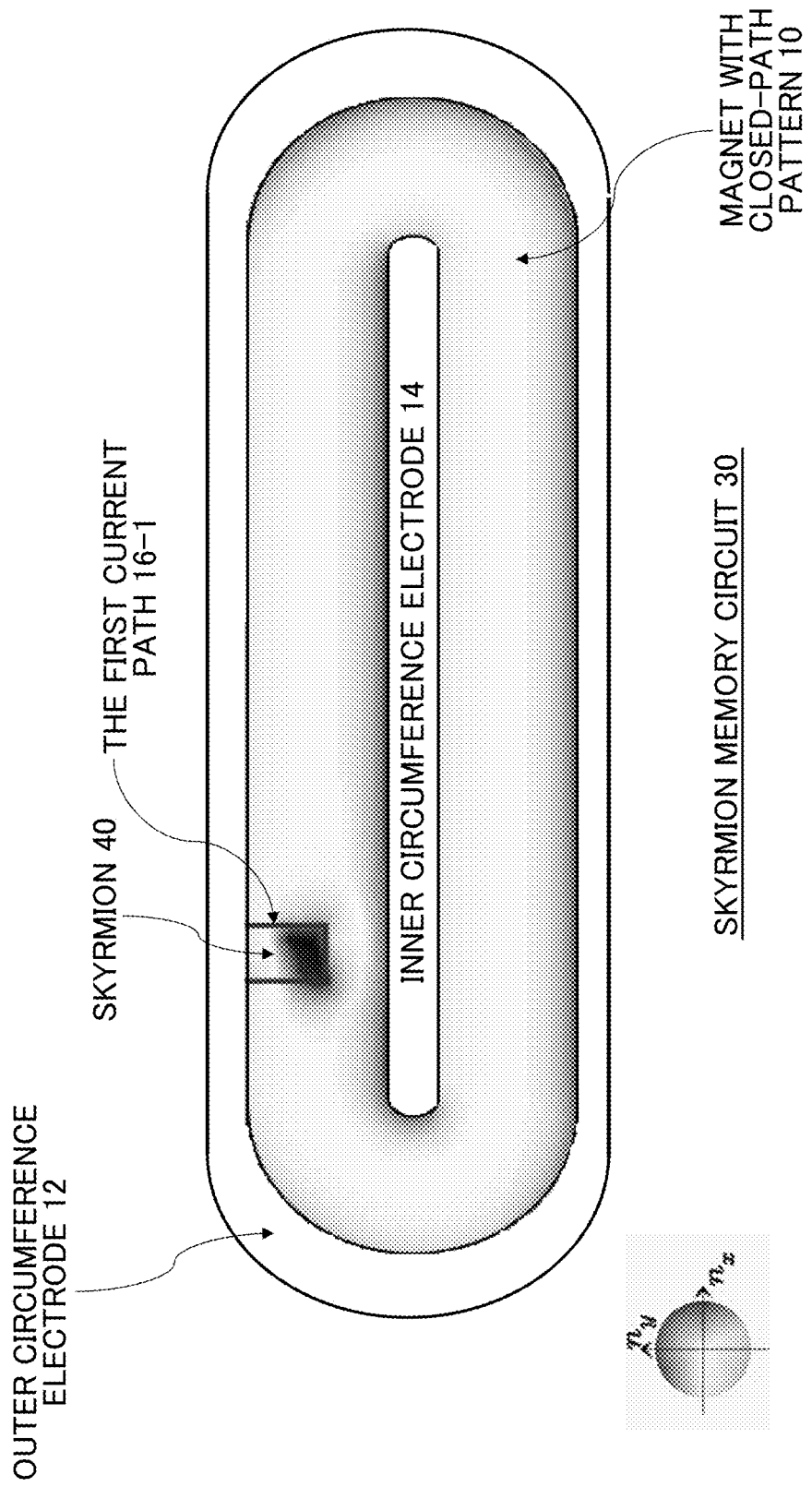
FIG. 8 shows the simulation results of the skyrmion being circularly transferred in the skyrmion memory circuit 30 at the time 1850/J.
Figure 8:
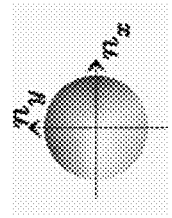

FIG. 8 shows a state at t=1850(1/J). The skyrmion 40 is almost completely formed in the magnet 10 with the closed-path pattern. In other words, it is understood that a time of approximately 1000(1/J) is needed for the generation of the skyrmion 40. In the present example, 1000(1/J) is approximately 0.3 nanoseconds, and this indicates that the generation of the skyrmion 40 can be realized by an ultra-short pulse.

Figure 9:
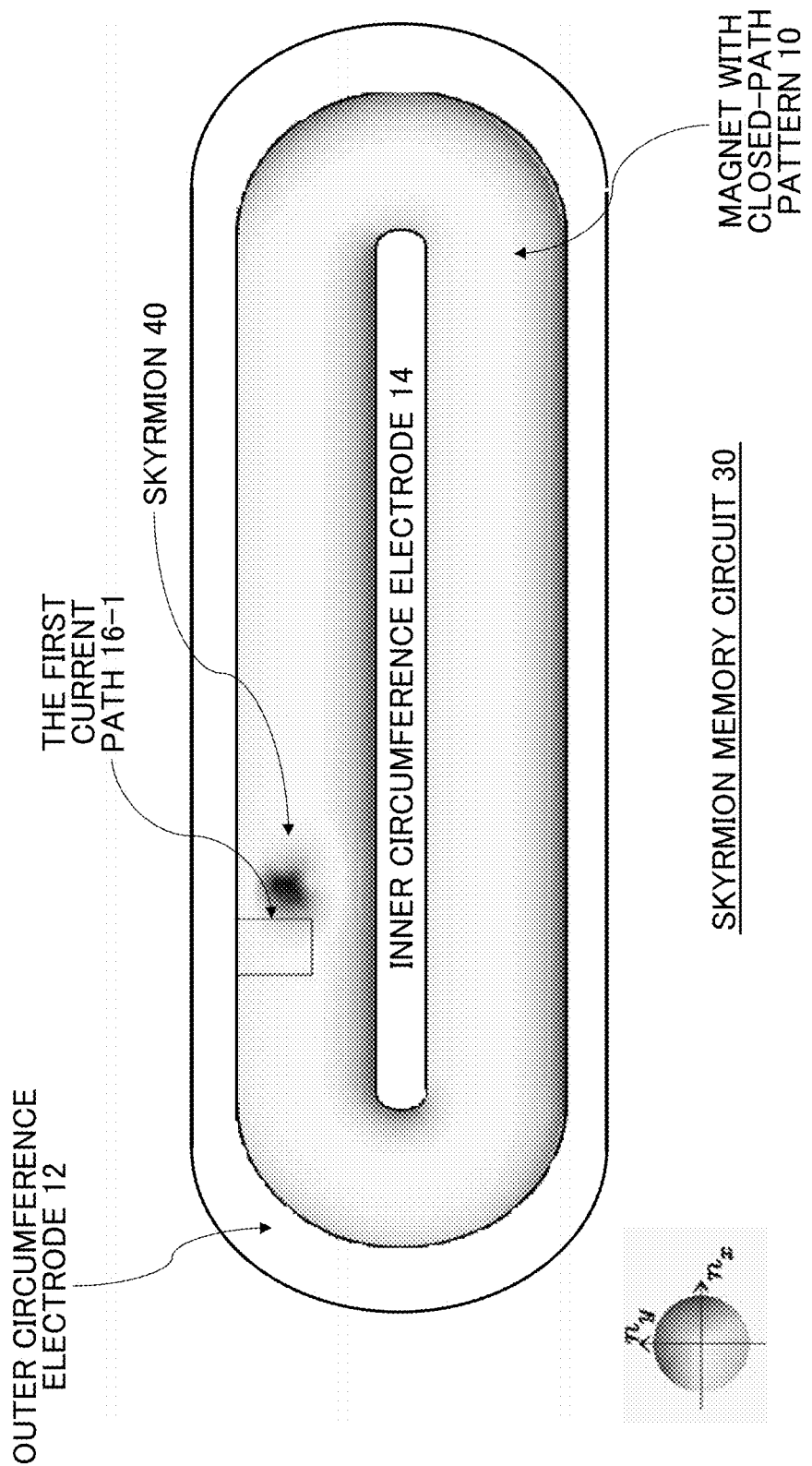
FIG. 9 shows the simulation results of the motion of the skyrmions being circularly transferred in the skyrmion memory circuit 30 at the time 6550/J.

FIG. 9 shows a state where the coil current is zero at t=6550(1/J). When the coil current is sufficiently small, the skyrmion 40 is transferred clockwise in a direction substantially perpendicular to the electron current due to the electron current with a steady current density of 0.001ξj between the outer circumference electrode 12 and the inner circumference electrode 14.

Figure 10:
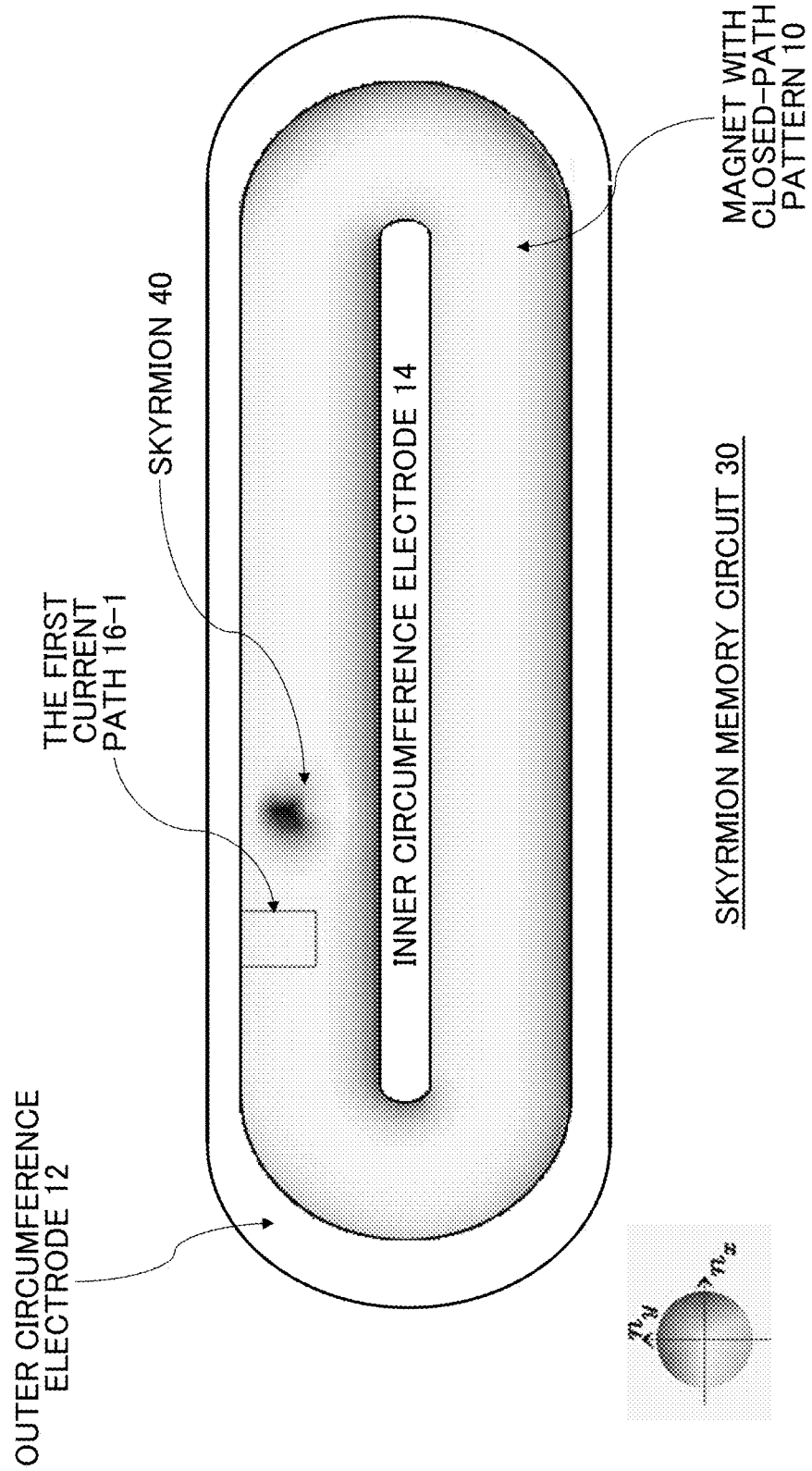
FIG. 10 shows the simulation results of the motion of the skyrmions being circularly transferred in the skyrmion memory circuit 30 at the time 9200/J.

FIG. 10 shows a state at t=9200(1/J). The skyrmion 40 is transferred farther downstream.

Figure 11:
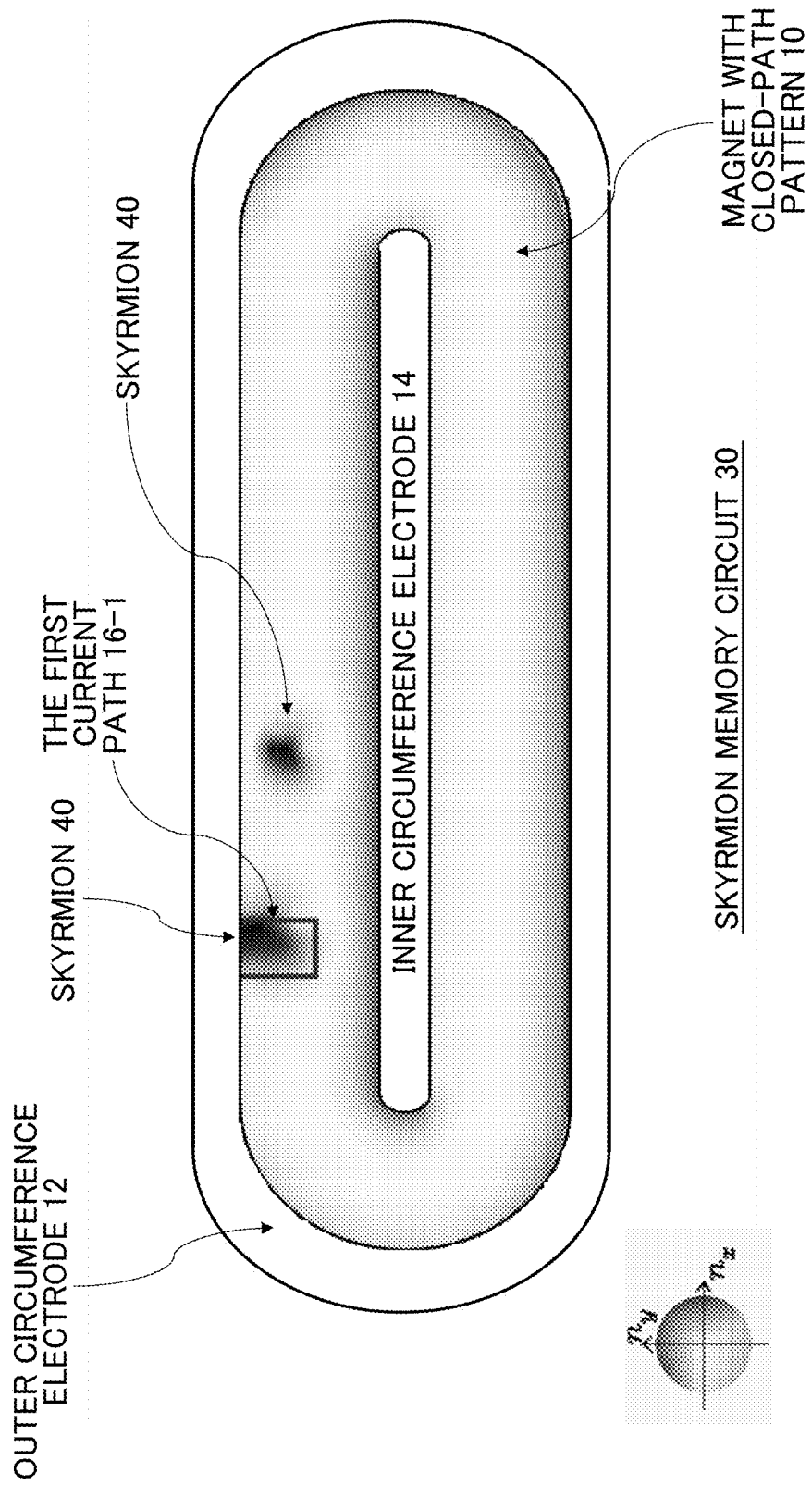
FIG. 11 shows the simulation results of the motion of the skyrmions being circularly transferred in the skyrmion memory circuit 30 at the time 11450/J.

FIG. 11 shows a state where the second coil current pulse is applied to the first current path 16-1 at t=11450(1/J). In the same manner as in FIG. 7, a second skyrmion 40 is being generated.

Figure 12:
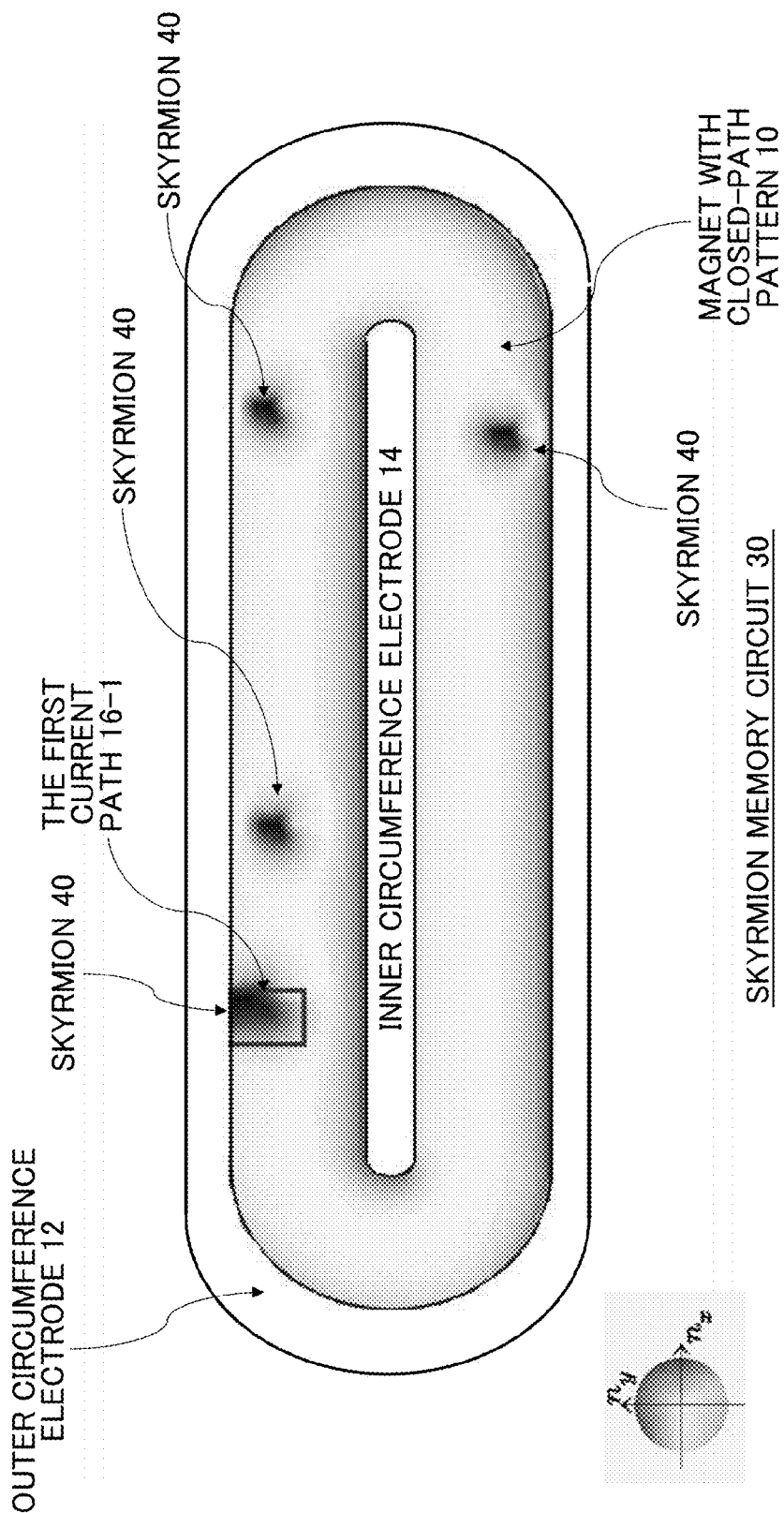
FIG. 12 shows the simulation results of the motion of the skyrmions being circularly transferred in the skyrmion memory circuit at the time 31450/J.

FIG. 12 shows a state at t=31450(1/J). This time is immediately after the fourth current pulse is applied and the formation of the fourth skyrmion 40 has ended. As shown in FIG. 4, at the locations where the skyrmion memory circuit 30 of the magnet 10 with the closed-path pattern curves, the orientation of the electron current also becomes a direction substantially perpendicular to a tangent of the outer circumference edge along the curve and the transfer direction of the skyrmion 40 always progresses in a direction substantially perpendicular to the electron current, and therefore the skyrmion 40 curves. As a result, the skyrmion 40 is circularly transferred without flying away from the outer circumference edge of the magnet 10 with the closed-path pattern.

As described above, by applying current pulses to the first current path 16-1 surrounding the end region and decreasing the magnetic field strength of the end region A, it is possible to form the skyrmion 40. From the simulation experiment, the conditions for generating the skyrmion 40 under the present conditions are as shown below.

(Condition 1) As a condition for generating the skyrmion, concerning the size of the end region A, the optimal range of the width W1 to the diameter λ of the skyrmion is as shown below.

$$0.75\lambda \geq W1 > 0.2\lambda$$

(Condition 2) As a condition for forming the skyrmion, concerning the size of the end region A, the optimal range of the length L1 of the end region, which is a length L1 parallel to the end portion of the magnet having the closed-path pattern, relative to the diameter λ of the skyrmion is as shown below.

$$0.5\lambda \geq L1 > 0.1\lambda$$

(Condition 3) As a condition for generating the skyrmion, the optimal range for the magnetic field strength Ha of the end region A is as shown below.

$$Ha \leq 0.01J$$

If Ha>0.01J, the skyrmion 40 is not generated.

If current pulses satisfying these conditions are sequentially applied to the first current path 16-1, it is possible to form the skyrmion 40 in the desired time. The direction (first direction) in which the current pulses flow through the first current path 16-1 is a direction that causes the direction of the magnetic field generated by this current to have the opposite orientation of the magnetic field generated by the magnetic field generating unit 20. The simulation from FIGS. 7 to 14 shows an embodiment example of generating four skyrmions. The motion of the generated skyrmions reaches a steady velocity sufficiently quickly. Since the density of the electron current of the magnet 10 with the closed-path pattern is substantially constant, the skyrmions 40 move at the same velocities and it is possible to maintain constant intervals between the skyrmions 40. This transfer velocity is determined by the current density between electrodes. The "1" and "0" values of the information saved by the skyrmion memory device 100 need only correspond to the presence or lack of the skyrmions 40. In a case where there is no skyrmion 40 at a location within a prescribed interval in the magnet 10 with the closed-path pattern, this interval is held.

With λ indicating the diameter of a skyrmion, the interval d between a plurality of the skyrmions 40 being circularly transferred may be d≥0.5·λ. When the interval d is smaller than this, it is difficult to separate and detect the skyrmions 40, and there are cases where the skyrmions 40 move due to the repulsive force between the skyrmions 40. The interval between the skyrmions 40 refers to the shortest distance between end portions of the skyrmions 40.

The interval d between the skyrmions 40 being circularly transferred is preferably such that d≥2·λ. By arranging the skyrmions 40 with such an interval d, the plurality of skyrmions 40 can be circularly transferred while maintaining the interval d.

Second Embodiment Example

Next, FIGS. 13 to 17 show the simulation results of the deletion of a skyrmion formed in the skyrmion memory circuit of the magnet 10 with the closed-path pattern. Furthermore, in the same manner as in the first embodiment example, in the example of FIGS. 13 to 17, the size of the end region surrounded by the first current path 16-1 is such that the width W1 is 0.75λ and the length L1 is 0.5λ. The second embodiment example corresponds to the times after the time t=50000(1/J) shown in FIG. 6.

Figure 13:
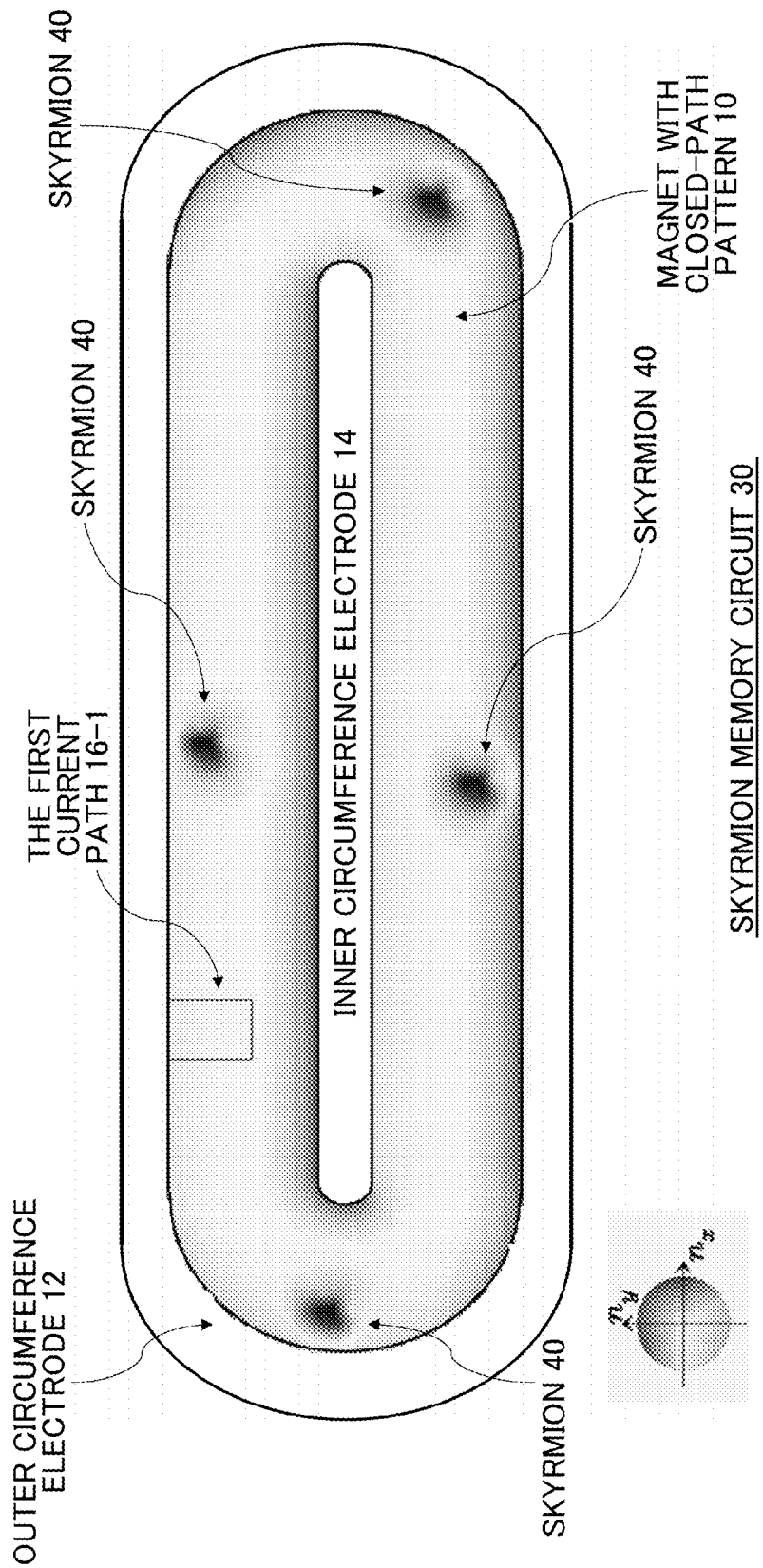
FIG. 13 shows the simulation results of the motion of the skyrmions being circularly transferred in the skyrmion memory circuit at the time 58100/J.

FIG. 13 shows a state at t=58100(1/J). The four skyrmions generated in FIG. 12 are circulating stably.

Figure 14:
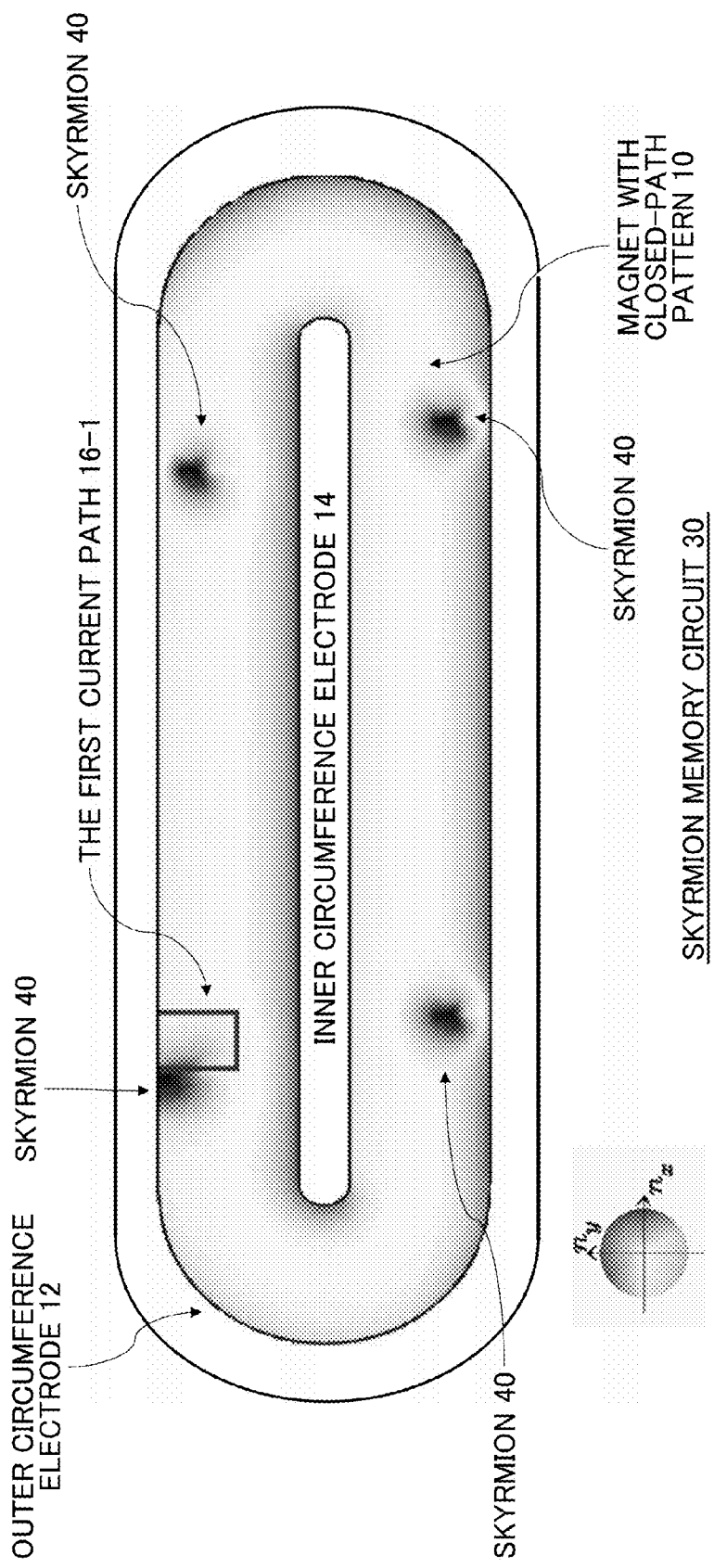
FIG. 14 shows the simulation results of the motion of the skyrmions being circularly transferred in the skyrmion memory circuit at the time 83150/J.

FIG. 14 shows a state at t=83150(1/J). One skyrmion 40 reaches the first current path 16-1. A first current path power supply 50 begins making the coil current for deletion flow at t=83150(1/J). In the present example, the orientation of the coil current for deletion is the same as the orientation of the coil current for generation of the skyrmion 40. Furthermore, the peak value of the coil current for deletion is smaller than the peak value of the coil current for generation. The peak value of the coil current for deletion has a magnitude that does not result in a new skyrmion 40 being generated by this current. In the present example, the peak value of the coil current for deletion is approximately half of the peak value of the coil current for generation.

The magnetic field Ha of the end region decreases due to the second magnetic field generated by the coil current. The magnetic field Ha of the end region at this time fluctuates from 0.03J to 0.02J. As described above, the skyrmion 40 moves in the direction of the outer circumference electrode 12 due to this magnetic field, and is deleted. The current flowing through the first current path 16-1 during the deletion has a magnitude enabling the skyrmion 40 that comes via the circular transfer to overcome the potential barrier at the boundary with the magnet 10 with the closed-path pattern. This deletion method can be understood in the following manner using Expression 3. The skyrmion 40 that comes via the circular transfer draws near the end region. At this time, the magnetic field Ha of the end region decreases from 0.03J to 0.02J, and therefore an attractive force acts on the skyrmion 40 to pull the skyrmion 40 toward the end region. When this happens, due to the Magnus force, the velocity of the skyrmion 40 in the direction of the end portion of the magnet 10 with the closed-path pattern is increased and the skyrmion 40 moves. Due to this motion, the skyrmion 40 jumps over the end portion potential and is deleted.

Figure 15:
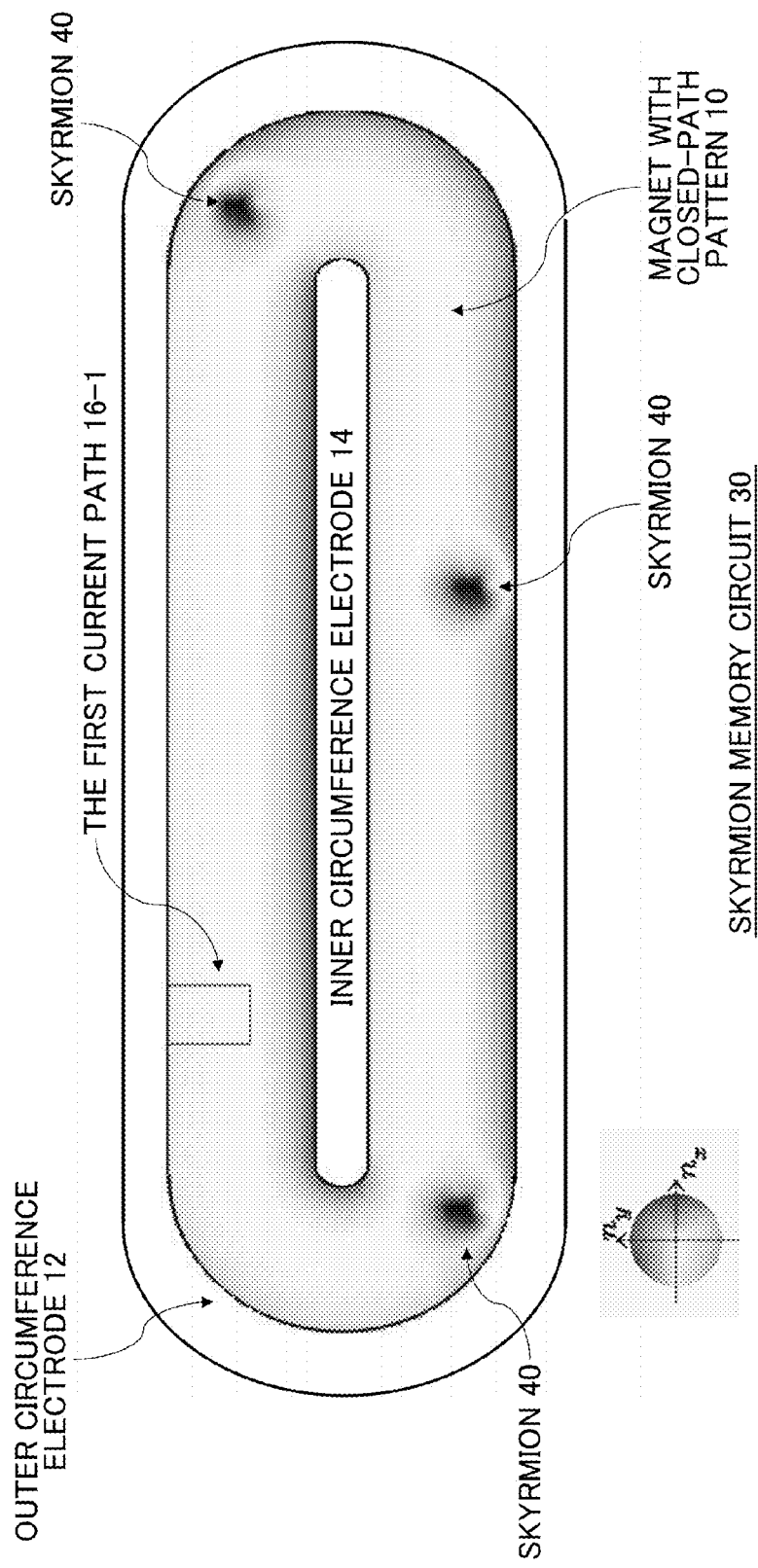
FIG. 15 shows the simulation results of the motion of the skyrmions being circularly transferred in the skyrmion memory circuit at the time 86700/J.

FIG. 15 shows a state at t=86700(1/J). Three skyrmions 40 are being transferred.

Figure 16:
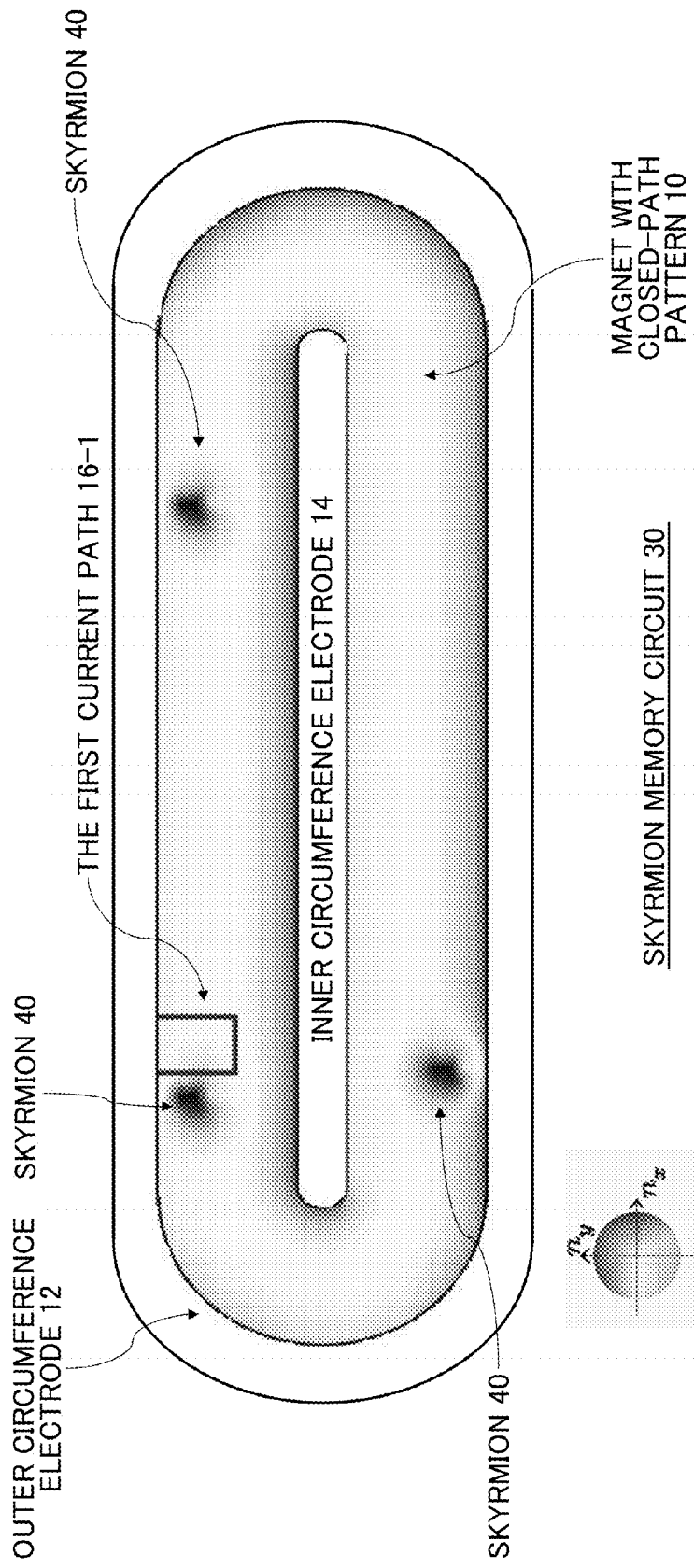
FIG. 16 shows the simulation results of the motion of the skyrmions being circularly transferred in the skyrmion memory circuit at the time 104000/J.

FIG. 16 shows a state at t=104300(1/J). One skyrmion that was circulating reaches the first current path 16-1. In this state, by applying the coil current pulse for deletion to the first current path 16-1, this skyrmion 40 is deleted.

Figure 17:
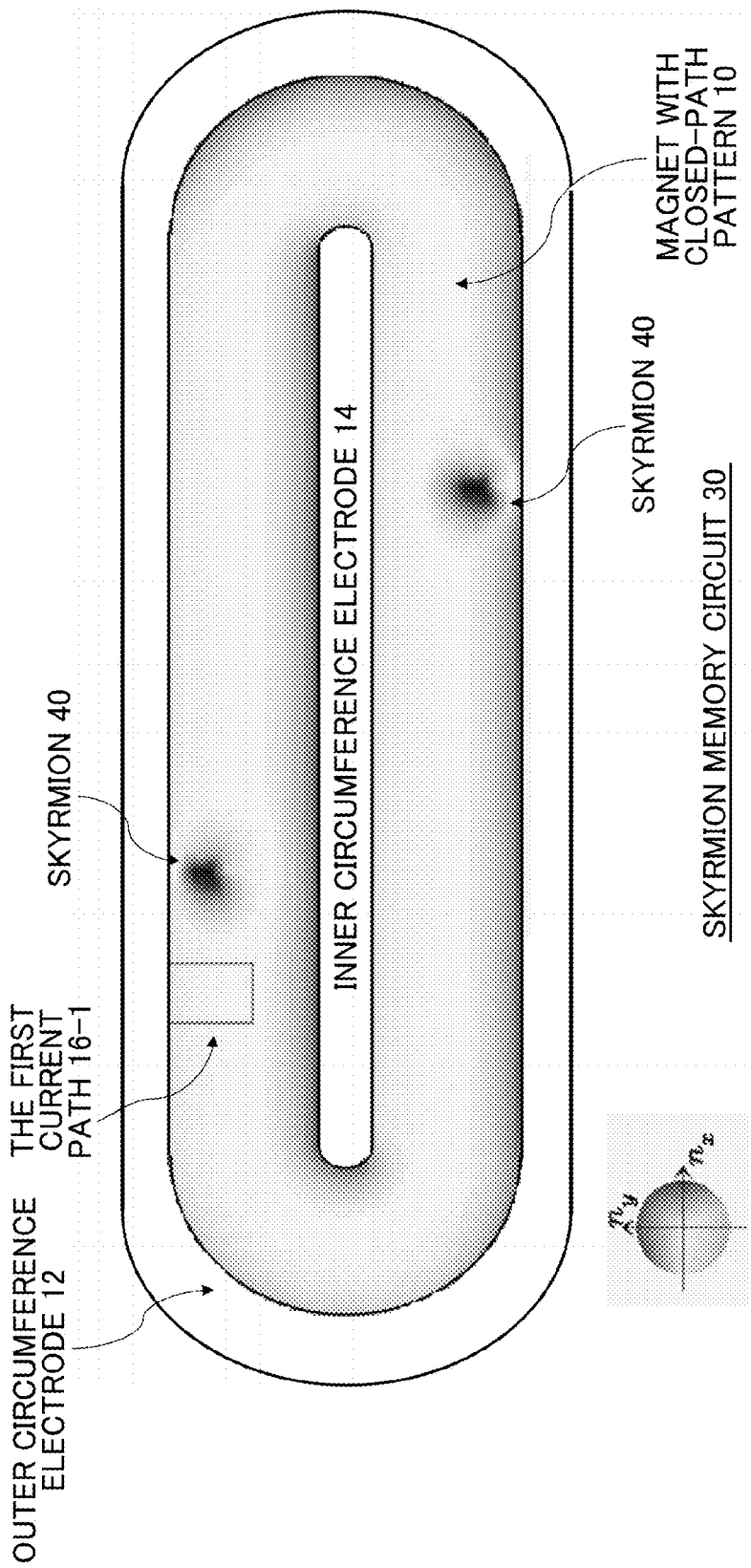
FIG. 17 shows the simulation results of the motion of the skyrmions being circularly transferred in the skyrmion memory circuit at the time 116800/J.

FIG. 17 shows a state at t=116800(1/J). One skyrmion 40 that was circulating reaches the coil, but since the coil current pulse is not applied to the first current path 16-1, the skyrmion 40 passes by without being deleted. After this, the circulation of the remaining two skyrmions 40 continues.

As described above, the simulation results show that a skyrmion 40 that comes via the transfer can be deleted at the timing that the skyrmion 40 reaches the first current path 16-1. The magnetic field of the end region at this time is Ha=0.02J. The time of the current pulse for deletion of the skyrmion is 0.3 nanoseconds, which is the same as the generation time.

In the present example, a suitable range for the magnetic field Ha of the end region during deletion is 0.024J≥Ha>0.01J. If Ha>0.024J, the skyrmion 40 passes by without being deleted. If Ha is less than or equal to 0.01J, a new skyrmion 40 is generated.

From the above simulation experiment, the conditions for deleting a skyrmion 40 that comes via the transfer under the present conditions are as shown below.

(Condition 4) As a condition for deleting a skyrmion that comes via the circular transfer, the optimal range for the length L1 of the end region parallel to the end portion of the magnet 10 with the closed-path pattern is as shown below.

$$0.5\lambda \geq L1 > 0.1\lambda$$

(Condition 5) As a condition for deleting a skyrmion that comes via the circular transfer, the optimal range for the width W1 of the end region in a direction that is the same as the width direction of the magnet 10 with the closed-path pattern is as shown below.

$$0.75\lambda \geq W1 > 0.2\lambda$$

(Condition 6) As a condition for deleting a skyrmion that comes via the circular transfer, the optimal range for the magnetic field strength Ha of the end region is as shown below.

$$0.024J \geq Ha > 0.01J$$

If current pulses satisfying these conditions are sequentially applied to the first current path 16-1 at a prescribed timing, it is possible to delete the skyrmion 40. The direction (second direction) in which the current pulses flow through the first current path 16-1 in the present example is a direction that causes the direction of the magnetic field generated by this current to have the opposite orientation of the magnetic field generated by the magnetic field generating unit 20. In the present example, the direction in which the current pulses are made to flow when generating the skyrmion 40 and the direction in which the current pulses are made to flow when deleting the skyrmion 40 are the same.

In a case where the length L1 of the end region parallel to the end portion of the magnet 10 with the closed-path pattern is less the 0.5λ value of the second embodiment example (e.g. W1=0.3λ), if the coil current flowing through the first current path 16-1 is larger than in the second embodiment example, the skyrmion 40 can be deleted. Furthermore, in a case where the width W1 that is the length of the end region in the same direction as the width direction of the magnet 10 with the closed-path pattern is larger than 0.75λ, the skyrmion 40 cannot be deleted. In a case where the width W1 of the end region is less than the 0.75λ value of the second embodiment example (e.g. W1=0.4λ), if the magnetic field Ha is a value near 0.01J, deletion is possible. In a case where W1=0.2λ, even if the magnetic field Ha is 0.01J, deletion is impossible.

Third Embodiment Example

Figure 18:
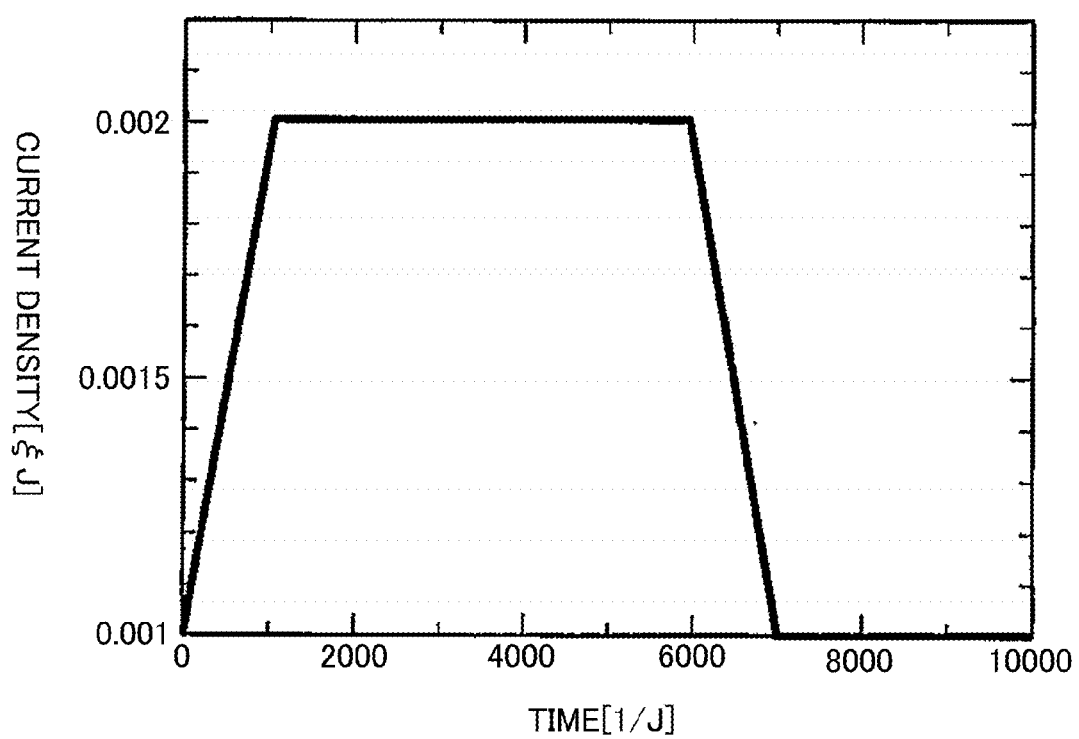
FIG. 18 shows application conditions for the current flowing to perform en masse deletion of all of the skyrmions 40 being circularly transferred in the magnet 10 with the closed-path pattern in a direction substantially perpendicular to the drive current.
Figure 19:
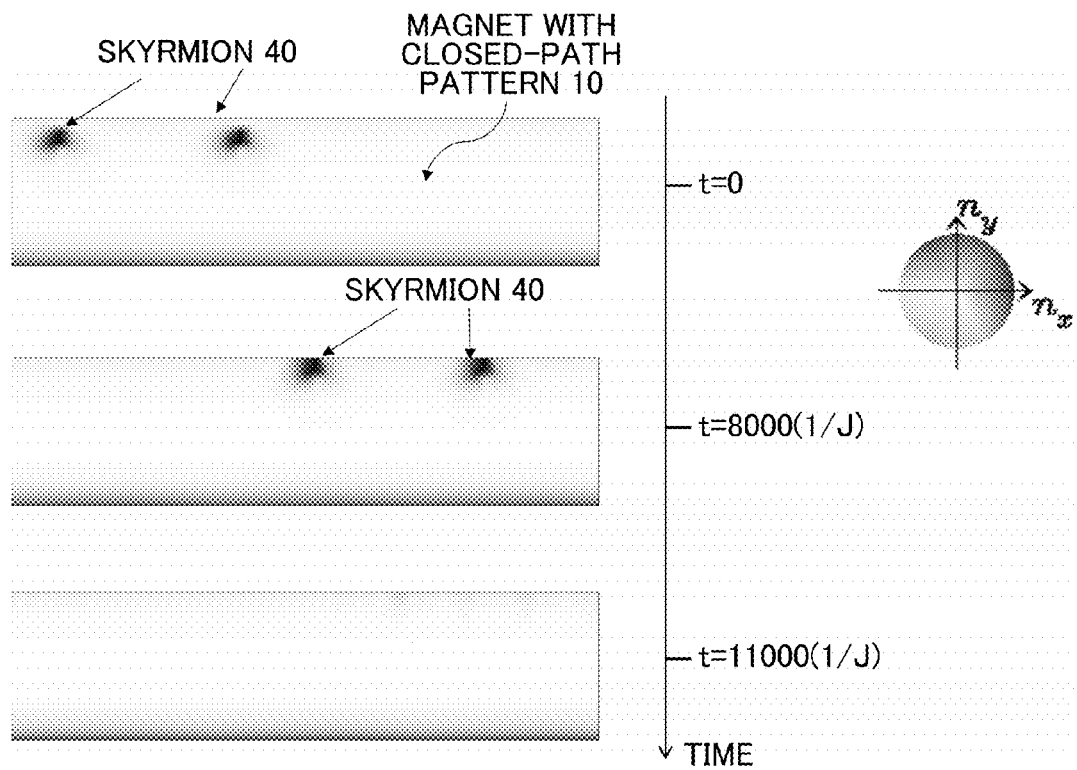
FIG. 19 shows simulation results showing a state in which two skyrmions being circularly transferred are deleted.

The simulation results of FIGS. 18 and 19 show that a plurality of skyrmions 40 in the skyrmion memory circuit of the magnet 10 with the closed-path pattern can be deleted en masse by the current between the outer circumference electrode 12 and the inner circumference electrode 14 in the transverse transfer arrangement. FIG. 18 shows an example of the current density of the current flowing through the magnet 10 with the closed-path pattern from the outer circumference electrode 12 in the direction of the inner circumference electrode 14. In the present example, the current density for the circular transfer by which the skyrmions 40 circulate in the skyrmion memory circuit 30 of the magnet 10 with the closed-path pattern is $0.001\xi j$. When deleting the skyrmions 40 en masse, the current density of the current flowing through the magnet 10 with the closed-path pattern is further raised from a current density of $0.001\xi j$, which is necessary for the transmission in the transverse transfer arrangement, to $0.002\xi j$. The time needed to raise the current density to $0.002\xi j$ is $1000(1/J)$. After this, the current density is maintained at $0.002\xi j$ until $t=6000(1/J)$. From $t=6000(1/J)$ to $t=7000(1/J)$, the current density returns from $0.002\xi j$ to the steady current density of $0.001\xi j$.

FIG. 19 shows simulation results in which two skyrmions 40 are present in the magnet 10 with the closed-path pattern. In FIG. 19, a portion of the skyrmion memory circuit 30 of the magnet 10 with the closed-path pattern is pulled out.

At $t=0$, the two skyrmions 40 are transferred in the magnet 10 with the closed-path pattern. As shown in FIG. 18, the current density of the current flowing through the magnet 10 with the closed-path pattern is raised. In this way, the skyrmions 40 that have come via the transfer in the transverse transfer arrangement receive a force in the direction of the outer circumference electrode 12. Even after the current density has become the steady current density at $t=7000(1/J)$, the skyrmions 40 move due to the steady current density. At $t=8000(1/J)$, the two skyrmions 40 are near the outer circumference electrode 12. At $t=11000(1/J)$, the two skyrmions 40 are already taken into the outer circumference electrode 12 and deleted. There is a time of approximately 3 nanoseconds from when the current density begins increasing to when the skyrmions 40 are deleted. All of the skyrmions in the magnet 10 with the closed-path pattern can be deleted in a short time.

As described above, in the transverse transfer arrangement, the current is made to flow in a direction from the outer circumference electrode 12 to the inner circumference electrode 14, and all of the skyrmions 40 in the skyrmion memory circuit 30 can be deleted en masse. From the simulation experiment, the conditions for deleting all of the skyrmions 40 in the skyrmion memory circuit 30 under the present conditions are as shown below.

(Condition 7) As a condition for deleting all of the skyrmions in this skyrmion memory circuit 30, with Jc indicating the current density of the current flowing from the outer circumference electrode 12 to the inner circumference electrode 14 forming the skyrmion memory circuit 30 and Jd indicating the current density circularly transferring the skyrmions 40, Jc is a current density at least two times that of Jd. Furthermore, the application time is preferably greater than or equal to $6000(1/J)$ (=2 nanoseconds). In other words, there are the following conditions.

$$Jc \geq 2 \cdot Jd \text{ and } t \geq 6000(1/J)$$

This en masse deletion method provides a very important function when using the skyrmion memory device 100. The deletion time is lengthened when there is only a function of individually selecting skyrmions 40 and deleting these skyrmions 40. The en masse deletion method described above solves the problem of long deletion time in one stroke. A plurality of skyrmions 40 of a specified skyrmion memory circuit 30 can be deleted en masse. Furthermore, even in a block made from a plurality of skyrmion memory circuits 30, the skyrmions 40 in each block can be deleted en masse.

Fourth Embodiment Example

Figure 20:
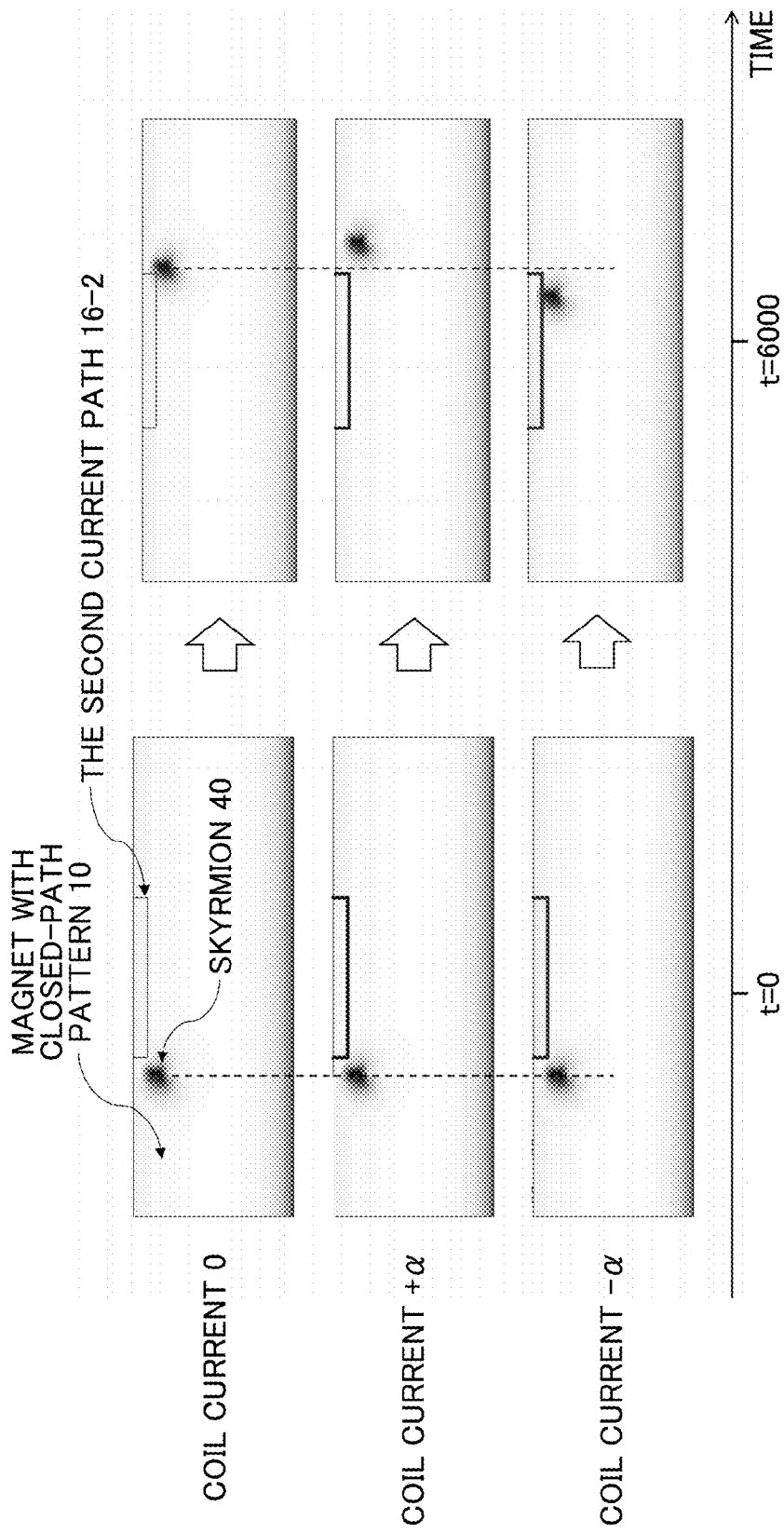
FIG. 20 shows simulation results showing a state in which a skyrmion being circularly transferred is accelerated and decelerated.

FIG. 20 shows an example of adjustment of the transfer velocity of skyrmions 40 using the second current path 16-2. By using the second current path 16-2, it is possible to adjust the interval or the like of the circulating skyrmions 40. In FIG. 20, a portion of the magnet 10 with the closed-path pattern in the skyrmion memory circuit 30 is pulled out. The two long edges of the magnet 10 with the closed-path pattern shown in FIG. 20 connect to the outer circumference electrode 12 and the inner circumference electrode 14. It should be noted that, in FIG. 20, the top and bottom of the magnet 10 with the closed-path pattern in the vicinity of the second current path 16-2 are inverted compared to FIG. 4. In other words, the outer circumference electrode 12 is connected to the top side of the magnet 10 with the closed-path pattern shown in FIG. 20 and the inner circumference electrode 14 is connected to the bottom side.

The second current path 16-2 is installed in the end portion of the magnet 10 with the closed-path pattern on the outer circumference electrode 12 and surrounds the end region that is long in the extension direction of the end portion of the magnet 10 with the closed-path pattern on the outer circumference electrode 12 side. By controlling the magnetic field strength in this end region according to the coil current, a skyrmion 40 that comes via the transfer can be accelerated and decelerated.

As shown in FIGS. 3 and 4, the sensor 72 is installed in the magnet 10 with the closed-path pattern of the skyrmion memory circuit 30. The sensor 72 may be a magnetic resistance sensor, and may be a tunnel magnetoresistance element. A second current path power supply 50 monitors the signal from the sensor 72 and controls the coil current applied to the second current path 16-2.

FIG. 20 shows the operation of three types of skyrmions 40, including a case where the coil current flowing through the second current path 16-2 is zero, a case where the coil current is $+\alpha$, and a case where the coil current is $-\alpha$. In the case where the coil current is $+\alpha$, the second magnetic field applied to the end region A by this current has the same orientation as the first magnetic field applied by the magnetic field generating unit 20. Furthermore, in the case where the coil current is $-\alpha$, the second magnetic field applied to the end region A by this current has the opposite orientation of the first magnetic field applied by the magnetic field generating unit 20.

In the present example, in the case where the coil current is zero, the magnetic field of the end region surrounded by the second current path 16-2 is $Ha=0.003J$, as generated by the magnetic field generating unit 20. In the case where the coil current is $+\alpha$, the second magnetic field due to this current is added such that $Ha=0.04J$. In the case where the coil current is $-\alpha$, the second magnetic field due to this current and the first magnetic field due to the magnetic field generating unit 20 cancel out, such that $Ha=0.02J$.

FIG. 20 shows the two states at $t=0$ and $t=6000$ for the three cases described above. In each case, the skyrmion 40 is present at the same position in the state where $t=0$. In contrast to this, in the state where t=6000 (the state where the skyrmion 40 has passed near the second current path 16-2), each skyrmion 40 is at a different position. In the three cases above, compared to the skyrmion 40 in the case where the coil current is zero, the skyrmion 40 is accelerated in the case where the coil current is $+\alpha$ and the skyrmion 40 is decelerated in the case where the coil current is $-\alpha$. In other words, it is shown that when the magnetic field of the end region surrounded by the second current path 16-2 is made stronger, the skyrmion 40 passing nearby can be accelerated, and when the magnetic field of the end region surrounded by the second current path 16-2 is made weaker, the skyrmion 40 passing nearby can be decelerated. In the present example, the width W2, which is the length of the second current path 16-2 in the same direction as the width direction of the magnet 10 with the closed-path pattern, and L2, which is the length of the second current path 16-2 in a direction parallel to the end portion of the magnet 10 with the closed-path pattern, with respect to the diameter $\lambda$ of the skyrmion 40, are such that $L2=2\lambda$ and $W2=0.2\lambda$. The skyrmion 40 draws near the outer circumference electrode 12 side in a direction substantially perpendicular to the electron current, due to the electron current flowing through the magnet 10 with the closed-path pattern, and circulates in the magnet 10 with the closed-path pattern. Therefore, the second current path 16-2 is preferably provided in the end portion of the magnet 10 with the closed-path pattern on the outer circumference electrode 12 side.

As described above, the transfer velocity of a skyrmion 40 can be adjusted using the second current path 16-2. From the simulation experiment, the conditions for accelerating and decelerating the skyrmion 40 by controlling the magnetic field strength in this end region using the second current path 16-2 under the present conditions are as shown below.

(Condition 8) In order to accelerate the transfer of this skyrmion 40 in the skyrmion memory circuit 30, it is only necessary to apply the coil current such that the magnetic field caused by the coil in the end region is applied in the same direction as the magnetic field generating unit 20 at the time point when this skyrmion 40 reaches the coil (the second current path 16-2 in the present example). The acceleration strength can be controlled according to the magnitude of the coil current.

(Condition 9) In order to decelerate the transfer of this skyrmion 40 in the skyrmion memory circuit 30, it is only necessary to apply the coil current such that the magnetic field caused by the coil in the end region is applied in the opposite direction of the magnetic field generating unit 20 at the time point when this skyrmion 40 reaches the coil (the second current path 16-2 in the present example). The deceleration strength can be controlled according to the magnitude of the coil current.

(Condition 10) The width W2 and length L2 of the second current path 16-2 are preferably as shown below.

$$0.2 \geq W2 \text{ and } L2 \geq \lambda$$

In this way, the skyrmion 40 can be suitably accelerated and decelerated.

As described above, in the first to fourth embodiment examples, simulation experiments are shown for the generation, circular transfer, deletion, en masse deletion, and acceleration and deceleration of the skyrmions 40 due to the current application and the magnetic field in the skyrmion memory device 100. Furthermore, the design rules for generation, deletion, and en masse deletion of the skyrmions are made clear by (Condition 1) to (Condition 10). These rules are useful as rules determined for designing the skyrmion memory device 100.

The mechanism described above is expressed as an amount defined by two quantities, which are the magnetic exchange interaction characterizing the magnetism of the magnet 10 with the closed-path pattern and the size $\lambda$ of the skyrmions. Here, $\lambda$ is related to the Dzyaloshinskii-Moriya interaction Dm such that $\lambda=2\pi\sqrt{2}\cdot J \times a/Dm$. Accordingly, design rules capable of being applied to various chiral magnets are realized, and the applicable range is broad.

Figure 21A:
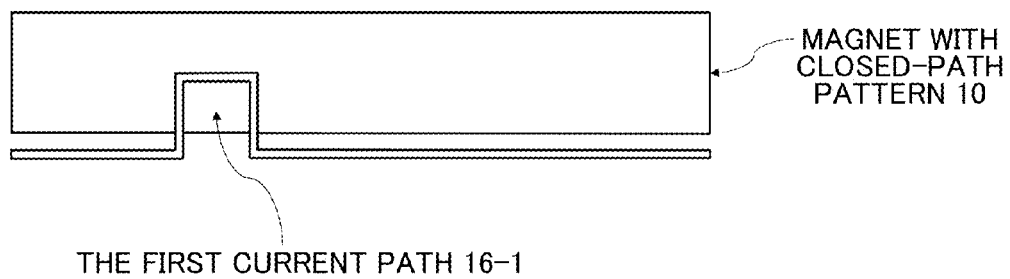
FIG. 21A shows an exemplary shape of the first current path 16-1.
Figure 21B:
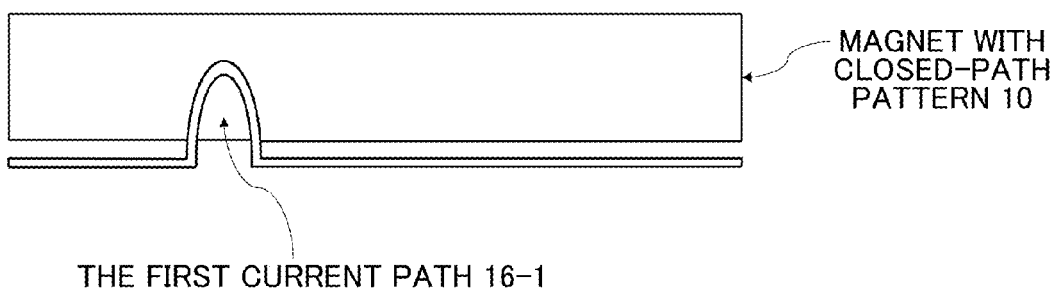
FIG. 21B shows an exemplary shape of the first current path 16-1.
Figure 21C:
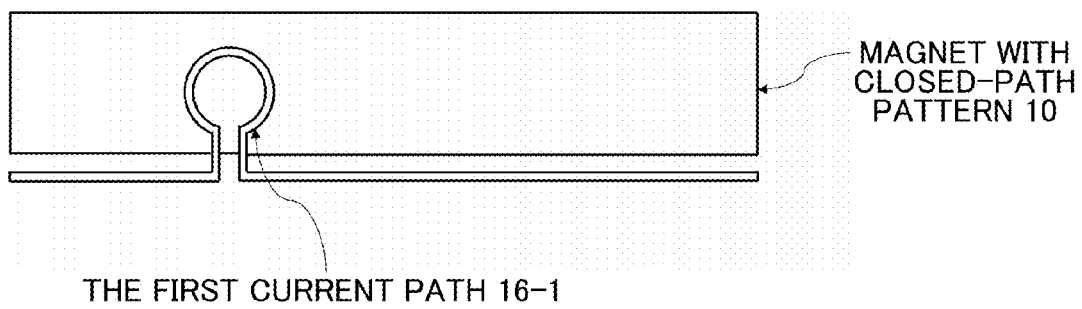
FIG. 21C shows an exemplary shape of the first current path 16-1.

FIGS. 21A to 21C show exemplary shapes of the first current path 16-1. FIG. 21A is the same as the example shown in FIGS. 3 and the like. As shown in FIG. 21B, the first current path 16-1 may surround an end region that is a portion of an ellipse, a circle, or an oval. As shown in FIG. 21C, the first current path 16-1 may surround an end region whose shape is a circle, a square, or a combination of other shapes.

Figure 22:
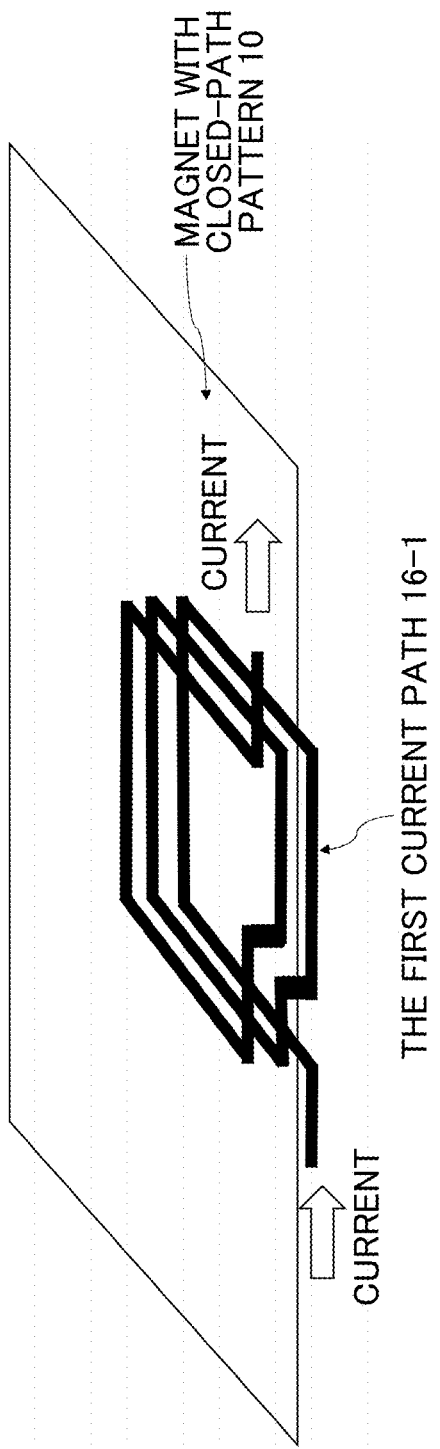
FIG. 22 is a schematic view of a multilayer coil for generating a magnetic field with current.

FIG. 22 shows a case where the first current path 16-1 is a multilayer wrapped coil. The multilayer wrapped coil structure us effective for realizing a large increase in the magnetic field strength during deletion of a skyrmion. Various current path shapes other than these examples can be through of, and the current path shape is not limited to these examples.

Figure 23:
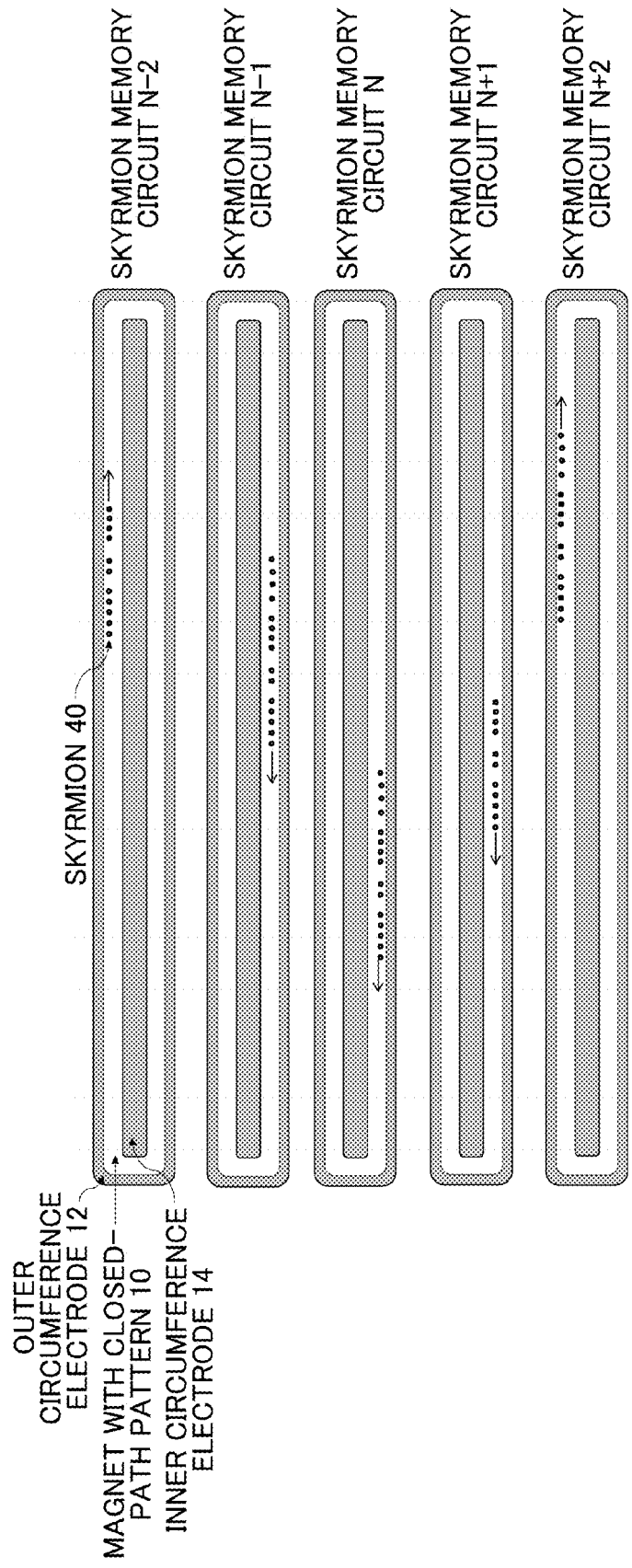
FIG. 23 is a schematic view of a skyrmion memory device 100 including a plurality of skyrmion memory circuits 30.
Figure 24:
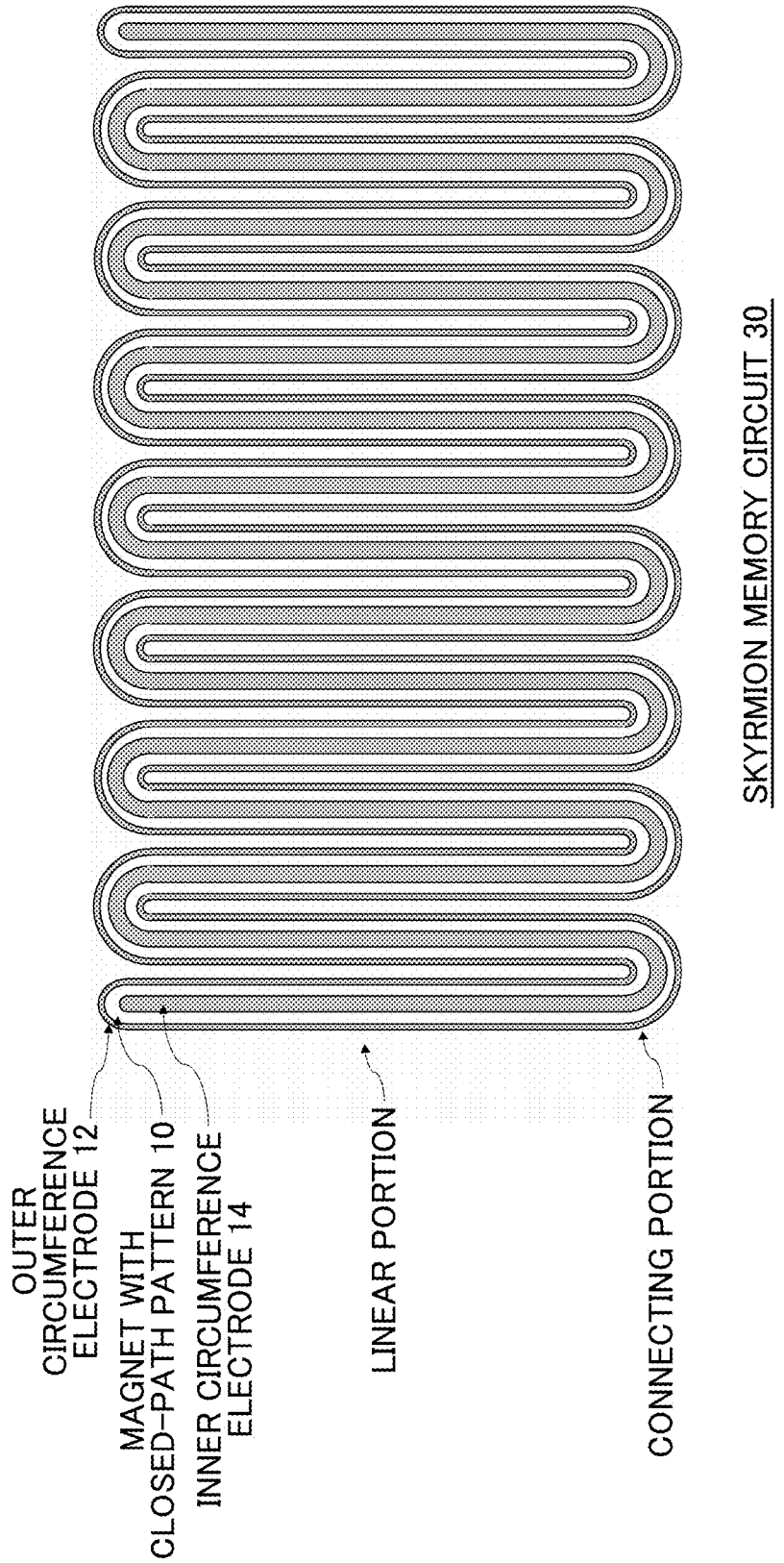
FIG. 24 is a schematic view of a skyrmion memory device having the skyrmion memory circuit 30 with a zigzag pattern.
Figure 25:
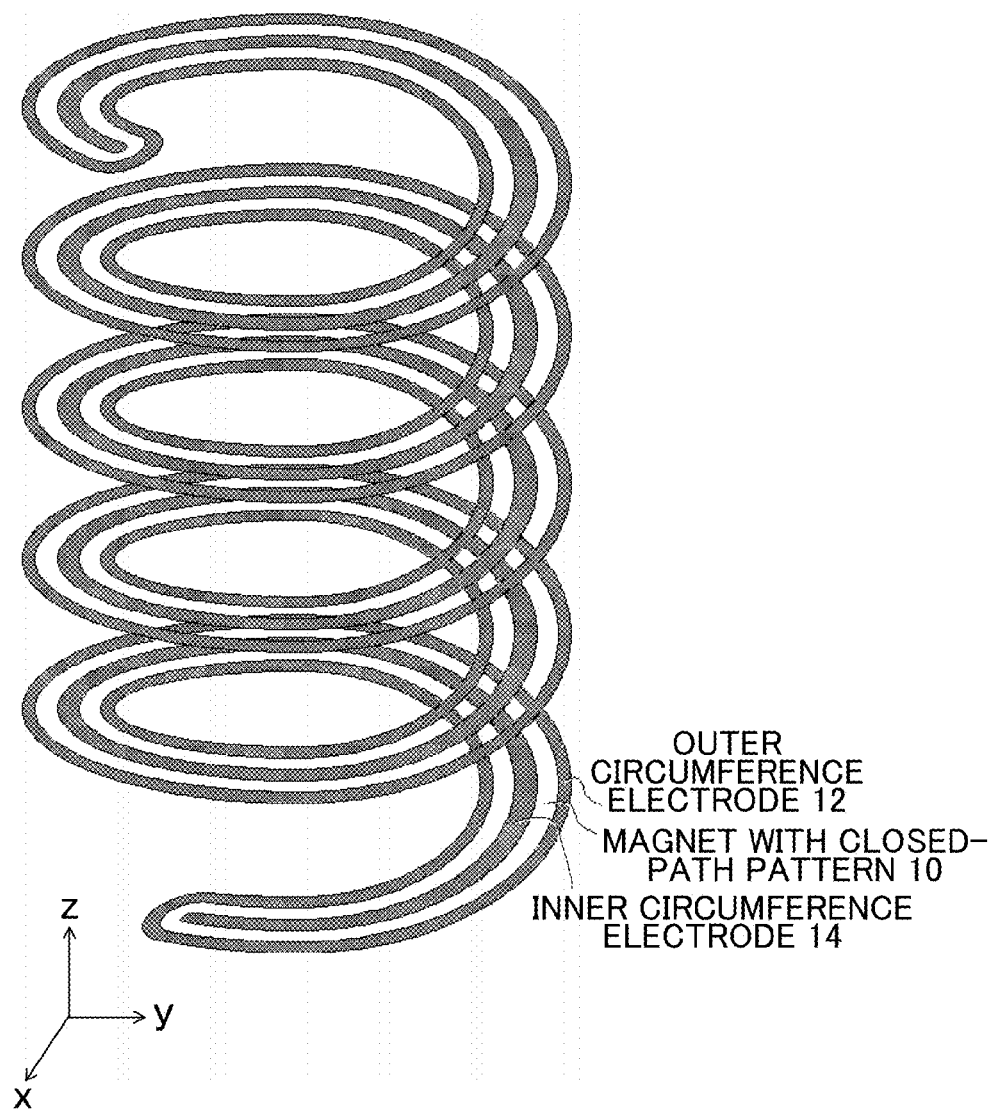
FIG. 25 is a schematic view of the skyrmion memory circuit 30 having a coil shape.

FIG. 23 is a schematic view showing a skyrmion memory device 100 including a plurality of skyrmion memory circuits 30. In FIGS. 23 to 25, the display of the sensor 72 and the current path 16 in the skyrmion memory circuits 30 is omitted. Many skyrmions 40 in the magnet 10 with the closed-path pattern of the skyrmion memory circuit N circulate at equal velocities in the direction of the arrows. Here, N of the skyrmion memory circuits shown in FIG. 23 may be formed in a memory device on one chip, where N is an integer greater than or equal to 1. For example, N of the skyrmion memory devices 100 shown in FIG. 3 may be formed in this memory device. Among the N skyrmion memory circuits, each skyrmion memory circuit 30 may be provided on the same substrate, or may be provided on an independent substrate. Furthermore, the magnetic field generating unit 20 may be provided in common for the N skyrmion memory circuits. The N skyrmion memory circuits may be formed in the same layer parallel to the xy plane in the memory device, or may be formed in a plurality of layers that are layered in the z-axis direction.

FIG. 24 is a schematic view of an example in which one skyrmion memory circuit 30 includes a zigzag pattern that zigzags back and forth. The skyrmion memory circuit 30 in the present example includes a plurality of linear portions provided in parallel, such as the plurality of skyrmion memory circuits 30 shown in FIG. 23, and arc-shaped connecting portions that connect the end portions of the respective linear portions. By connecting the top and bottom end of adjacent linear portions to each other, the zigzag pattern is formed. The magnet 10 with the closed-path pattern in the skyrmion memory circuit 30 in the present example forms paths in which the movement directions of the skyrmions 40 are opposite, in each linear portion and connecting portion forming the zigzag pattern. Furthermore, at both ends of the zigzag pattern, these two paths are connected to form one loop. If a pattern such as shown in the present example is used, a long skyrmion memory circuit can be formed easily. By forming a long skyrmion memory circuit 30, it is possible to form a large number of skyrmions 40 in one skyrmion memory circuit 30, and a larger amount of information can be saved.

FIG. 25 is a schematic view of a coil-shaped skyrmion memory circuit 30. The skyrmion memory circuit 30 in the present example extends as a spiral in the z-axis direction. The magnet 10 with the closed-path pattern in the skyrmion memory circuit 30 in the present example forms paths in which the movement directions of the skyrmions 40 are opposite, in each portion forming the coil, in the same manner as the example in FIG. 24. Furthermore, at both ends of the coil shape, these two paths are connected to form one loop. In this case, the circulating skyrmion memory circuit 30 extends three-dimensionally upward, and therefore the degree of integration can be significantly increased.

In the manner described above, various shapes can be thought of for the skyrmion memory circuit. It is clear that the skyrmion memory circuit shape is not limited to the above examples.

The effects of the embodiment examples in a chiral magnet are also qualitatively realized in a dipole magnet, a frustrated magnet, or a magnet made from a layered structure of magnetic material and nonmagnetic material.

In this way, the simulation results and the structure of the skyrmion memory device 100 provide the optimal design guidelines for the methods of the generation, circular transfer, deletion, en masse deletion, and acceleration and deceleration of the skyrmions 40. These design rules can be described by the two quantities that are the magnetic exchange interaction J characterizing the magnetism of the magnet 10 with the closed-path pattern and the skyrmion size λ. Being able to provide common design guidelines for a variety of magnets can be expected to have a large impact in terms of implementation of the skyrmion memory circuit 30 using the skyrmions 40.

Figure 26:
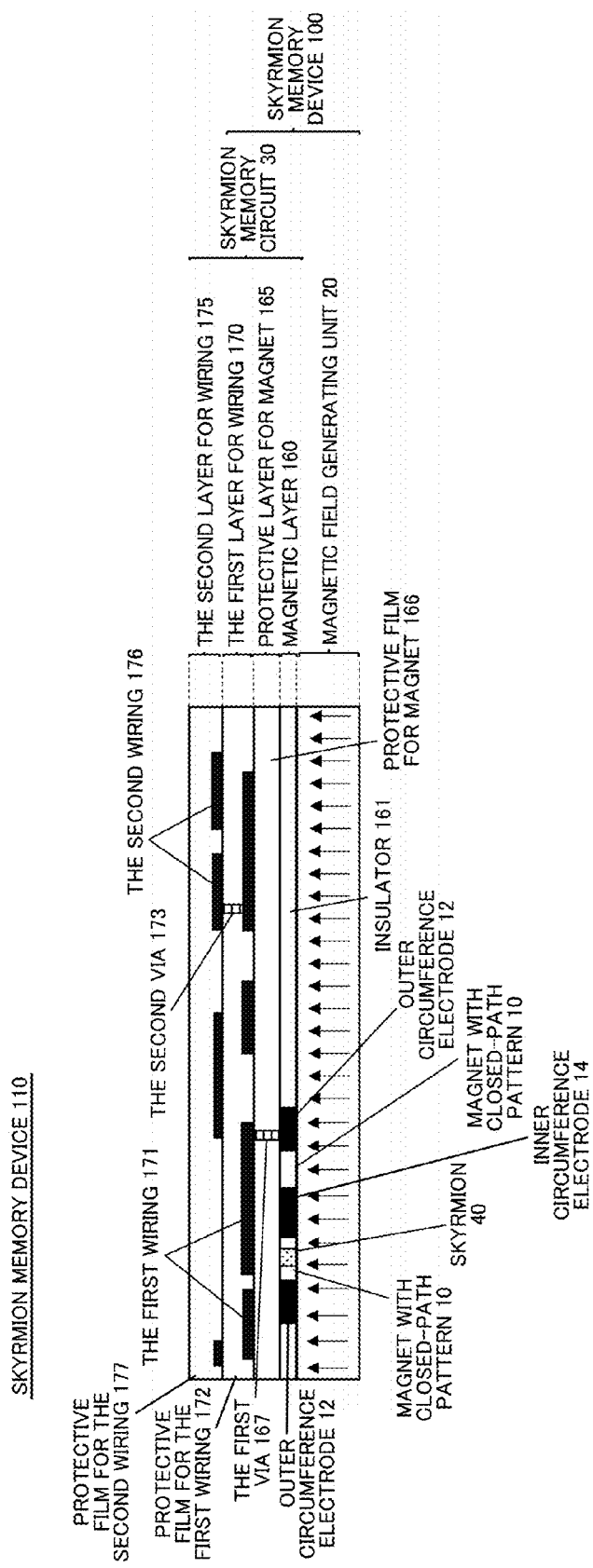
FIG. 26 shows a cross-sectional structure of the skyrmion memory device 110.

FIG. 26 shows a cross-sectional structure of a skyrmion memory device 110. The skyrmion memory device 110 includes the skyrmion memory device 100 described in FIGS. 1 to 25. The skyrmion memory device 110 includes a magnetic field generating unit 20 that is a ferromagnetic layer and a skyrmion memory circuit 30 formed above the magnetic field generating unit 20.

The skyrmion memory circuit 30 in the present example corresponds to the skyrmion memory circuit 30 shown in FIG. 3 and the like. It should be noted that, in FIGS. 26 and onward, there are cases where the current path 16 and the sensor 72 are omitted. At least a portion of the current path 16 and the sensor 72 may be formed inside the layered structured shown in FIG. 26 and the like. The skyrmion memory circuit 30 in the present example includes a layered structured in which a magnetic layer 160, a protective layer 165 for a magnet, a first layer for wiring 170, and a second layer for wiring 175 are layered in the stated order.

The magnetic layer 160 includes the magnet 10 with the closed-path pattern, an insulator 161, the outer circumference electrode 12, and the inner circumference electrode 14. In the magnet 10 with the closed-path pattern, the skyrmion 40 is generated and deleted. The insulator 161 surrounds the magnet 10 with the closed-path pattern, the outer circumference electrode 12, and the inner circumference electrode 14. The magnet 10 with the closed-path pattern, the outer circumference electrode 12, and the inner circumference electrode 14 have a structure in which nonmagnetic metal, magnetic material, and nonmagnetic metal are joined, and this is the basic structure of a skyrmion magnetic medium. This structure is abbreviated as an NMN structure. The magnetic layer 160 may include a plurality of NMN structures in the same layer.

The protective layer 165 for the magnet includes a protective film 166 for a magnet and a first via 167. The protective film 166 for the magnet protects the magnetic layer 160. The first via 167 supplies a current for operation to the outer circumference electrode 12 and the inner circumference electrode 14.

The first layer for wiring 170 includes a first wiring 171, a protective film 172 for the first wiring, and a second via 173. The electrodes and the like of the skyrmion memory circuit 30 are electrically connected to the outside of the skyrmion memory circuit 30. Furthermore, a portion of the first wiring 171 may function as the current path 16. The protective film 172 for the first wiring functions as an interlayer insulating film for forming the first wiring 171 and the second via 173. It is difficult to lead the two types of wires, which are the wire for the current path and the wire connecting to the nonmagnetic metal, in the same layer without having these wires intersect. Therefore, the second layer for wiring 175 may be formed on the first layer for wiring 170.

The second layer for wiring 175 includes a second wire 176 and a protective film 177 for the second wiring. The second wire 176 is connected to the second via 173. The protective film 177 for the second wiring functions as an interlayer insulating film for insulating the second wire 176. For example, the second via 173 is connected to at least one of the two types of wires among the wire for the current path and the wire connecting to the nonmagnetic metal.

In the magnet 10 with the closed-path pattern, the skyrmion 40 is shown in the drawing by a square shape with dots. By making current flow through the current path 16 formed by the first wiring 171 and the like, the skyrmion 40 can be generated in the magnet 10 with the closed-path pattern.

Figure 27:
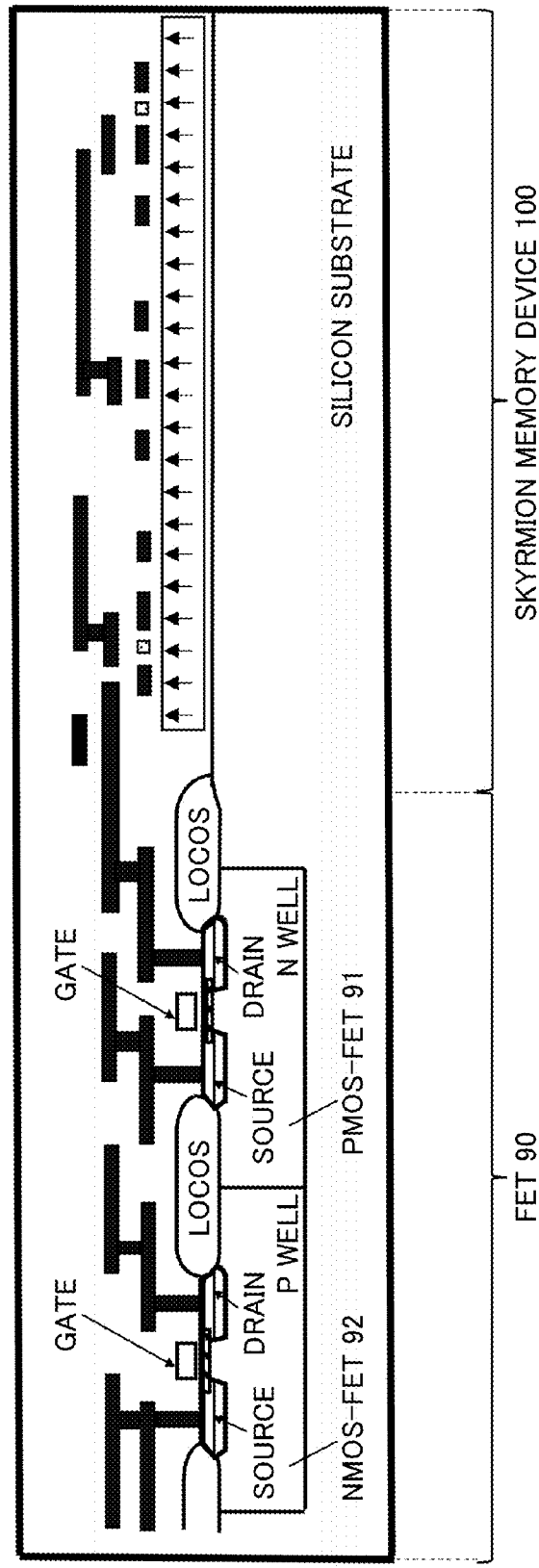
FIG. 27 shows another example of a cross-sectional structure of the skyrmion memory device 110.

FIG. 27 shows another example of a cross-sectional structure of the skyrmion memory device 110. The skyrmion memory device 110 includes the skyrmion memory device 100 and a FET (Field Effect Transistor) 90. The skyrmion memory device 100 is formed on a silicon substrate in which the FET 90 is not present.

The FET 90 is a general FET that is formed through a general silicon process. The FET 90 in the present example includes two Cu wire layers. Furthermore, the FET 90 includes a CMOS circuit including a PMOS-FET 91 and an NMOS-FET 92 formed on a P-type substrate. The FET 90 is necessary for switching the wires of the skyrmion memory circuit 30. The CMOS circuit converts the current from the sensor into a voltage, and may also be provided as a voltage amplification circuit.

Figure 28:
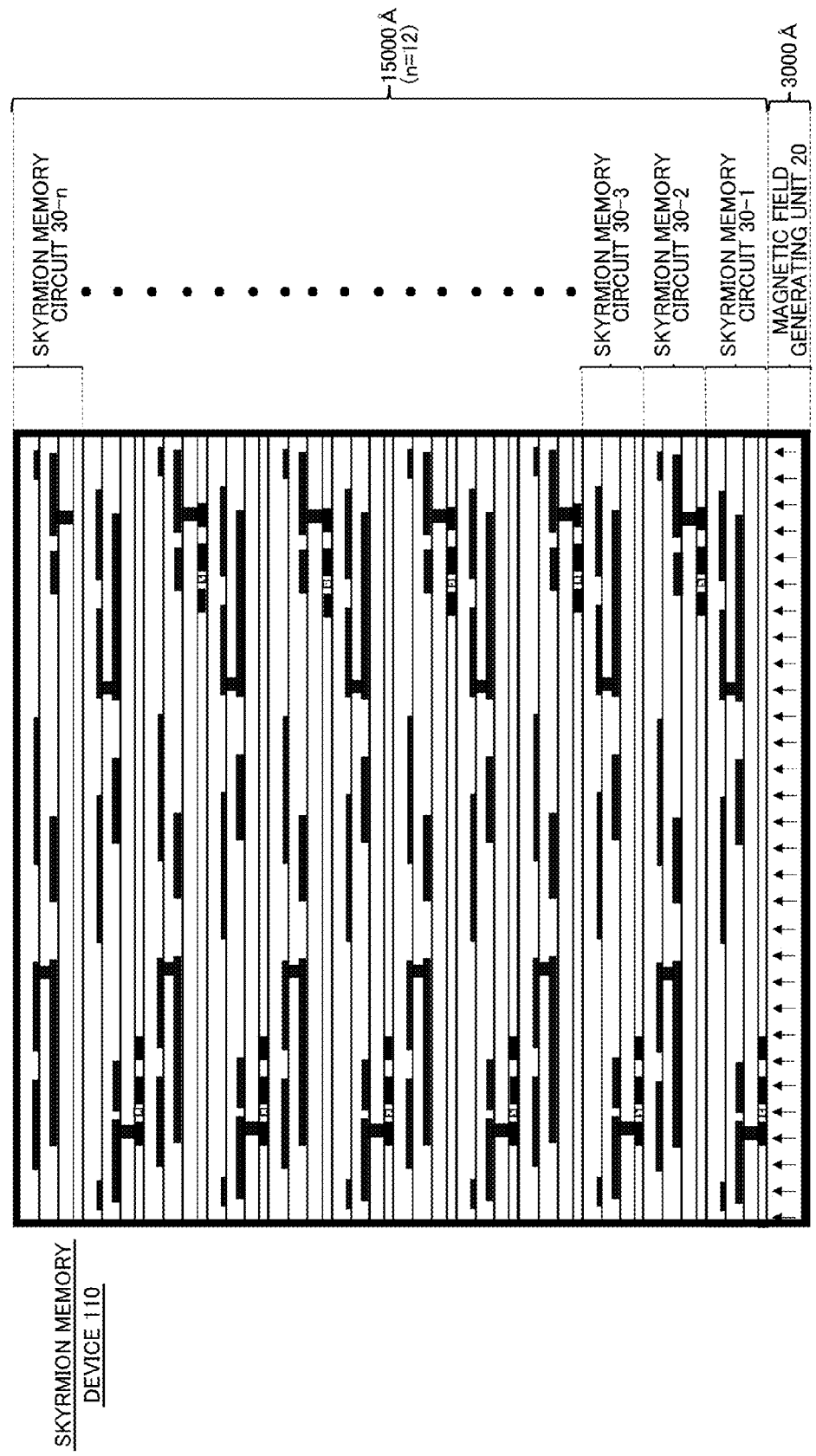
FIG. 28 shows a skyrmion memory device 110 in which n layers of the skyrmion memory circuit 30 are layered.

FIG. 28 shows a skyrmion memory device 110 in which n layers of the skyrmion memory circuit 30 are layered. The skyrmion memory device 110 in the present example shows a case where n=12. The magnetic field generating unit 20 has a film thickness of 3000 Angstrom. The skyrmion memory circuit 30 includes a structure obtained by layering from a skyrmion memory circuit 30-1 to a skyrmion memory circuit 30-n. The skyrmion memory circuits 30 in the present example have a total film thickness of 15000 Angstrom.

Figure 29:
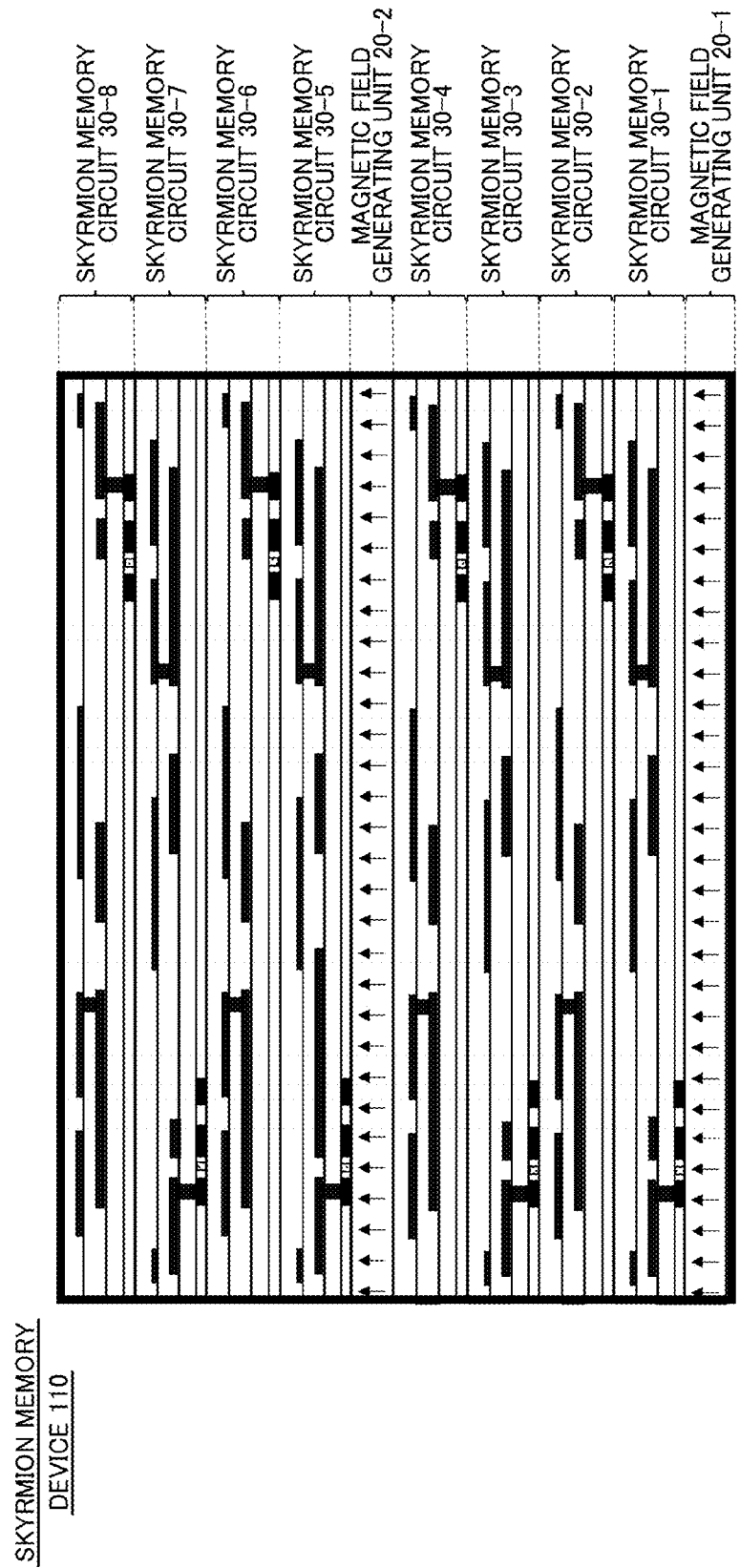
FIG. 29 shows a skyrmion memory device 110 that includes a plurality of the magnetic field generating units 20.

FIG. 29 shows a skyrmion memory device 110 that includes a plurality of the magnetic field generating units 20. The skyrmion memory device 110 in the present example includes a total of eight layers of skyrmion memory circuits 30, from a skyrmion memory circuit 30-1 to a skyrmion memory circuit 30-8. The skyrmion memory device 110 includes four layers of skyrmion memory circuits 30 on a magnetic field generating unit 20-1. The skyrmion memory device 110 further includes a magnetic field generating unit 20-2 between the skyrmion memory circuit 30-4 and the skyrmion memory circuit 30-5. In this way, the skyrmion memory circuits 30 can keep the strength of the magnetic field received from the magnetic field generating units 20 constant. The magnetic field generating units 20 may be arranged at suitable intervals according to the material of the skyrmion memory circuits 30 or the like.

Figure 30:
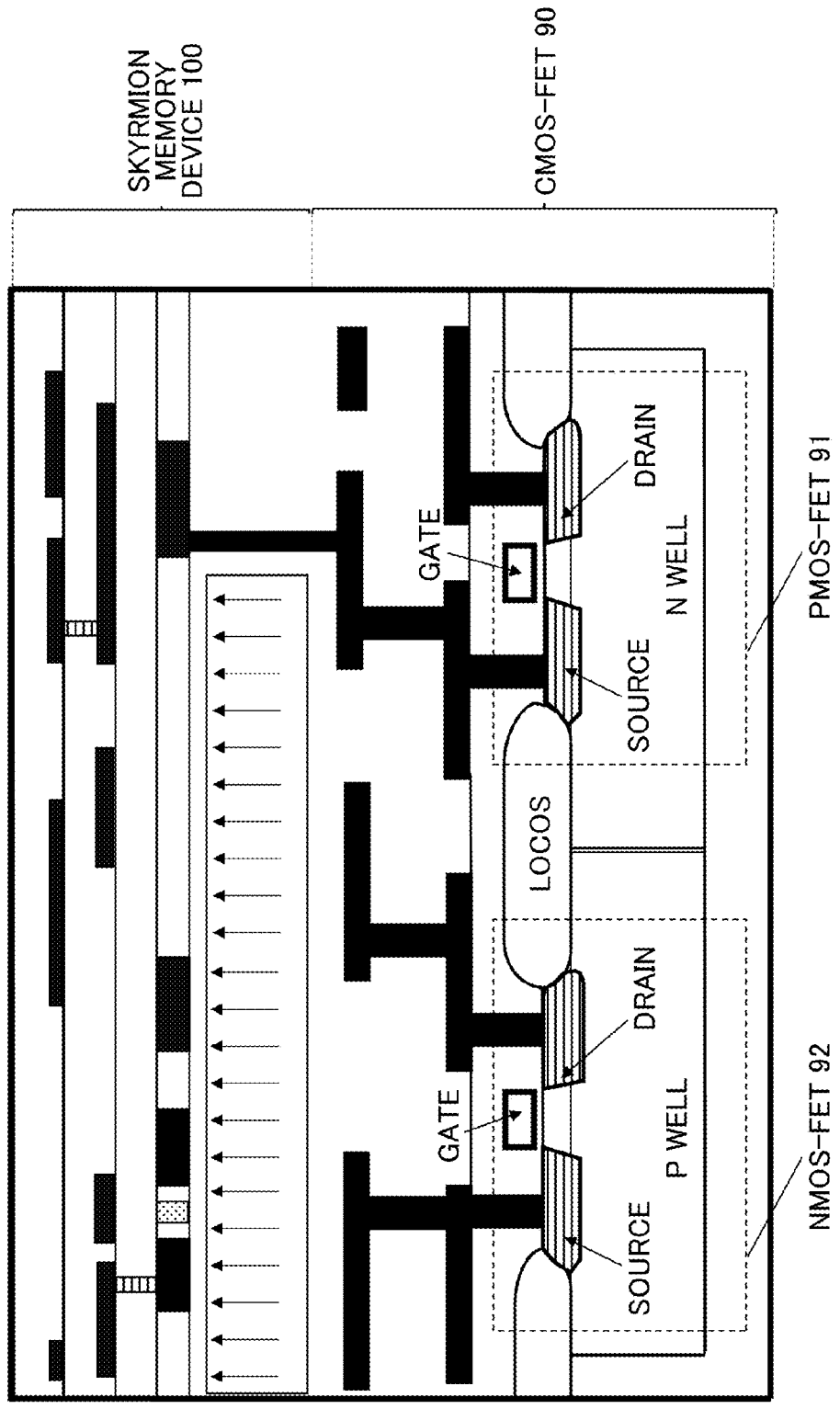
FIG. 30 is a cross-sectional view of a skyrmion memory device 110 in which the skyrmion memory device 100 is mounted on the top layer of a CMOS-FET 90.

FIG. 30 is a cross-sectional view of a skyrmion memory device 110 in which the skyrmion memory device 100 is mounted on the top layer of a CMOS-FET 90. The skyrmion memory device 110 includes the skyrmion memory device 100 and the CMOS-FET 90 establishing a CPU function. The skyrmion memory device 100 is formed on the CMOS-FET 90. The CMOS-FET 90 in the present example includes the PMOS-FET 91 and the NMOS-FET 92 formed on the P-type substrate.

Figure 31:
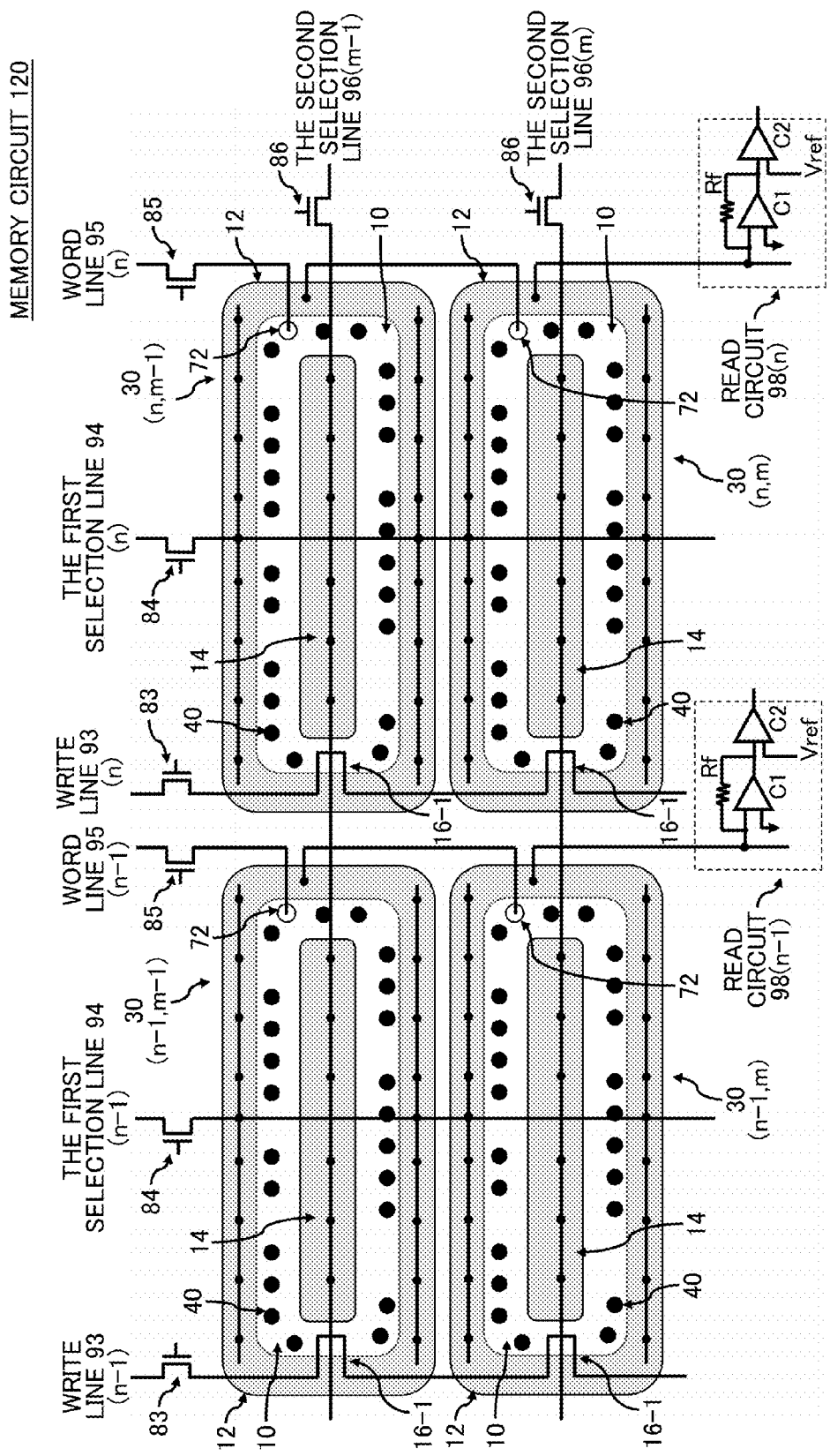
FIG. 31 shows one example of a memory circuit 120 that uses the skyrmion memory device 110.

FIG. 31 shows a memory circuit 120 that is one example of the skyrmion memory device 110. The skyrmion memory device 110 in the present example includes a plurality of the skyrmion memory circuits 30 shown in FIG. 3 in a matrix shape. In FIG. 31, only the (n−1)-th column, the n-th column, the (m−1)-th row, and the m-th row are shown among the plurality of columns and rows in the matrix.

The memory circuit 120 includes a write line 93, a first selection line 94, and a word line 95 provided for each column, and a second selection line 96 provided for each row. Furthermore, the memory circuit 120 includes switches (83, 84, 85, and 86) provided for each line. In the present example, each switch is a FET.

The first selection line 94 of each column is connected to each outer circumference electrode 12 of the skyrmion memory circuit 30 in the corresponding column. The outer circumference electrode 12 of each skyrmion memory circuit 30 may be electrically connected to the first selection line 94 at a plurality of positions. The switch 84, when in the ON state, applies a prescribed voltage to each outer circumference electrode 12 in the corresponding column.

The second selection line 96 of each row is connected to each inner circumference electrode 14 of the skyrmion memory circuit 30 in the corresponding row. The inner circumference electrode 14 of each skyrmion memory circuit 30 may be electrically connected to the second selection line 96 at a plurality of positions. The switch 86, when in the ON state, applies a prescribed voltage to each inner circumference electrode 14 in the corresponding row.

With the switch 84 and the switch 86, an arbitrary skyrmion memory circuit 30 can be selected. A prescribed current flows between the outer circumference electrode 12 and the inner circumference electrode 14 of the skyrmion memory circuit 30 selected by the switch 84 and the switch 86. In this way, a large number of skyrmions 40 present in the magnet 10 with the closed-path pattern circulate in the magnet 10 with the closed-path pattern at a constant velocity while maintaining a constant interval therebetween. In this way, it is possible to select an arbitrary skyrmion memory circuit 30 and transfer the skyrmions 40.

The write lines 93 are connected in series with the first current path 16-1 of the skyrmion memory circuit 30 in each column. In other words, a write line 93 wired to one skyrmion memory circuit 30 is a line shared with a write line 93 wired to another skyrmion memory circuit 30. The switch 83, when in the ON state, causes a prescribed write current pulse to flow through the write line 93 of the corresponding column. In other words, a write current pulse flows through each first current path 16-1 connected in series.

In this way, a skyrmion 40 is generated in each skyrmion memory circuit 30 in the corresponding column. First, current is applied to the first current path 16-1 of the column of a plurality of skyrmion memory circuits 30 needed for the writing. One skyrmion 40 is generated in the column of the selected plurality of skyrmion memory circuits 30. This skyrmion 40 is a header pattern indicating the head of the data. This header pattern may be a plurality of the skyrmions 40.

Next, the skyrmion memory circuit 30 to which the data is to be written is selected using the switch 84 and the switch 86. The skyrmion 40 begins circulating in the magnet 10 with the closed-path pattern. After the skyrmion indicating the header pattern has passed through the first current path 16-1, the write current pulse is made to flow at a timing corresponding to the data pattern. The header pattern is attached to the head, and the pattern of the skyrmion 40 corresponding to the data pattern can be generated in the magnet 10 with the closed-path pattern.

In this way, all of the skyrmions 40 in the skyrmion memory circuit 30 to which the data is to be written circulate in the magnet 10 with the closed-path pattern. By causing the write current pulse to flow at the timing corresponding to the data patterns, the pattern of the skyrmion 40 can be generated in the magnet 10 with the closed-path pattern.

Current is not made to flow between the outer circumference electrode 12 and the inner circumference electrode 14 of the skyrmion memory circuit 30 to which the data is not to be written. Therefore, the skyrmion 40 of the header pattern of this skyrmion memory circuit 30 does not move in the magnet 10 with the closed-path pattern. In this state, even when sequential current pulses are applied according to the data pattern, a skyrmion 40 is not generated in this skyrmion memory circuit 30. Therefore, a skyrmion 40 corresponding to the data pattern is not generated in the skyrmion memory circuit 30 to which the data is not to be written.

The header pattern may be deleted. The switch 84 and the switch 86 are selected and have current applied thereto such that the skyrmion 40 at the head of the header pattern of the column selected to have the data written thereto is positioned in the first current path 16-1. The skyrmion 40 that is the header pattern can be deleted with a small current pulse in the first current path 16-1. A plurality of skyrmions may indicate a plurality of header patterns.

With such a configuration, it is possible to write an arbitrary data pattern to an arbitrary skyrmion memory circuit 30. The memory circuit 120 can use one write line 93 and one switch 83 to write data at a large number of bit positions of a skyrmion memory circuit 30, in the same manner as a NAND flash memory. Furthermore, it is possible to use one write line 93 and one switch 83 to write data to a large number of skyrmion memory circuits 30.

The word line 95 is connected in series with the sensor 72 of the skyrmion memory circuit 30 in each column. In other words, the word line 95 wired to one skyrmion memory circuit 30 is a line shared with the word line 95 wired to another skyrmion memory circuit 30. The sensor 72 in the present example includes a TMR element. In the present example the outer circumference electrode 12 in the skyrmion memory circuit 30 at each stage is connected to the TMR element at each stage, thereby connecting each sensor 72 in parallel. Furthermore, the word line 95 is connected to the read circuit 98. The switch 85, when in the ON state, applies a prescribed voltage to the word line 95 of the corresponding column. The read circuit 98 measures the current flowing through the word line 95.

In a case where the skyrmion 40 is present at a position corresponding to the sensor 72, the resistance value of the TMR element becomes larger and the current detected by the read circuit 98 becomes smaller. In the present example, since a plurality of TMR elements are connected in series, the resistance value corresponding to the current detected by the read circuit 98 is the sum of the resistance values of the plurality of TMR elements.

In the present example, the skyrmion memory circuit 30 from which the data is to be read is selected by the switch 84 and the switch 86. In this way, all of the skyrmions 40 of the skyrmion memory circuit 30 from which the data is to be read circulate in the magnet 10 with the closed-path pattern. On the other hand, current does not flow between the outer circumference electrode 12 and the inner circumference electrode 14 of the skyrmion memory circuit 30 from which the data is not to be read. Therefore, the skyrmion 40 in this skyrmion memory circuit 30 does not move.

In such a state, the change over time of the current flowing through the word line 95 is detected by the read circuit 98. This change over time corresponds to the arrangement pattern of the skyrmion 40 in the selected skyrmion memory circuit 30. The skyrmion 40 in the skyrmion memory circuit 30 that is not selected does not move. Therefore, when reading the data, the arrangement pattern of the skyrmion 40 of the skyrmion memory circuit 30 that is not selected does not affect the current change. Accordingly, the data of the selected skyrmion memory circuit 30 can be read.

With such a configuration, it is possible to read the data pattern from an arbitrary skyrmion memory circuit 30. It is possible to read the data from a large number of bit positions of the skyrmion memory circuit 30 using one word line 95 and one switch 85. Furthermore, it is possible to read the data from a large number of skyrmion memory circuits 30 by using one word line 95 and one switch 85. The skyrmion memory circuit 30 may be used as a memory having a shift register function.

When deleting the skyrmions 40 in each skyrmion memory circuit 30, a current for en masse deletion having a prescribed current density is supplied between the first selection line 94 and the second selection line 96. The memory circuit 120 does not require the addition of a wire for skyrmion deletion. In this way, all of the skyrmions 40 of the skyrmion memory circuit 30 selected by the switch 84 and the switch 86 are deleted en masse. This is also the same as the specifications of a flash memory. A plurality of skyrmion memory circuits 30 may be selected simultaneously and the skyrmions 40 may be deleted en masse. The time for the en masse deletion is 1 nanosecond, which is high speed.

In the example of FIG. 31, the first selection line 94 is connected to the outer circumference electrode 12 and the second selection line 96 is connected to the inner circumference electrode 14. In contrast to this, the first selection line 94 may be connected to the inner circumference electrode 14 and the second selection line 96 may be connected to the outer circumference electrode 12.

As described above, the memory circuit 120 can significantly reduce the number of lines needed to realize the memory function. For example, it is only necessary for four lines (the write line 93, the first selection line 94, the word line 95, and the second selection line 96) to be provided for one skyrmion memory circuit 30. Furthermore, four wire switches may be provided for one skyrmion memory circuit 30. Yet further, in a case where the skyrmion memory circuits 30 are arranged in a matrix shape, it is only necessary to provide the write line 93, the first selection line 94, and the word line 95 for each column and to provide the second selection line 96 for each row.

The information stored in one skyrmion memory circuit 30 may be approximately several kilobits. In other words, it is possible to realize the memory function for storing several kilobits of information with four lines and four FETs. The memory circuit using the skyrmion memory circuits 30 is compared to a NAND FET memory. Currently, a NAND FET memory is a memory provided for practical use.

A NAND FET memory is a memory having a deformable gate FET structure with a source and a drain. The lines for writing and reading of one prescribed column of the FET having the deformable gate structure may be a single bit line. However, in a NAND memory, one word line selecting the deformable gate FET is required in each deformable gate FET. Now, when realizing a 1-kilobit memory with a NAND memory, NAND memories are arranged in a 32×32 matrix.

A wire for cell selection is required for each vertical column (bit line) and horizontal column (word line), and therefore 62 of these wires are required. The ability to read and write data with one bit line is an excellent characteristic of a NAND circuit. In contrast to this, when realizing a 1-kilobit memory with one skyrmion memory circuit 30, there may be a total of four lines including one write line, one read line, and two selection lines. There may also be four switching FETs.

Accordingly, the skyrmion memory circuit 30 can realize a reduction to 1/250 of a NAND FET memory. It is possible to significantly improve the degree of integration. A 1-kilobit memory may be formed by a plurality of skyrmion memory circuits 30. In this case as well, it is possible to ensure superiority with regard to the number of lines over a NAND memory. Furthermore, as described above, the lines for reading and writing the data of the skyrmion memory circuits 30 can be shared among a plurality of skyrmion memory circuits 30. This further enables the skyrmion memory device to significantly reduce the number of lines and the number of FETs even more compared to the NAND memory, thereby providing significantly more integration.

The skyrmion memory device 100 has a write time less than or equal to 1 nanosecond. A time of approximately 1 nanosecond is required for the data deletion. Furthermore, the time needed to delete a plurality of skyrmions en masse is approximately 1 nanosecond. Currently, this is the same en masse deletion function as in a NAND flash memory that is provided for practical use. However, the time needed for writing and deletion of a NAND flash memory is on the order of microseconds. The skyrmion memory device 100 is capable of increasing the speed by three orders of magnitude or more with regard to the time for deletion. Furthermore, in the case of a TMR element, the writing speed is such that the writing takes approximately several nanoseconds, and high-speed reading is also possible.

On the other hand, in a case where a skyrmion memory cell holding one skyrmion 40 is used, one bit of information is stored in each skyrmion memory cell. The presence or lack of the skyrmion 40 in each skyrmion memory cell becomes one bit of information.

When realizing a 1-kilobit RAM, when 1-bit skyrmion memory cells are arranged in a 32×32 matrix, a wire for cell selection is required for each vertical column and horizontal column, and therefore 62 of these wires are required. At least one wire for the sensor is required for either each row or column, and therefore a total of 94 wires are required.

A total of 94 FET switches for controlling the ON/OFF states of these wires are also required. A skyrmion memory circuit 30 that can store 1 kilobit of information can form a circuit with four wires and four switches. In other words, when using a 1-bit skyrmion memory cell, approximately 23 times the number of wires and switches are required compared to a 1-kilobit skyrmion memory circuit 30. This difference in the number of wires and the number of FETs is further widened when the number of skyrmions that can be generated in the skyrmion memory circuit 30 is increased.

In other words, when the skyrmion memory circuit 30 is used, it is possible to significantly improve the degree of integration of the memory circuit 120. When selecting an address randomly such as in a RAM and writing bit information, the skyrmion memory circuit 30 must circularly transfer the skyrmion 40 at this location to the position of the sensor 72, but as in a shift register or the like, for example, the time needed for the circular transfer can be omitted when reading data continuously. Therefore, the skyrmion memory circuit 30 is particularly useful as a memory for a shift register.

The memory circuit 120 is particularly effective when processing many bits in parallel. For example, when simultaneously processing each bit in 8-bit information, eight first selection lines 94 are selected simultaneously. Furthermore, one of the second selection lines 96 is selected. In this way, it is possible to select eight skyrmion memory circuits 30. Then, by inputting the 8-bit information into the eight write lines 93, it is possible to write each bit of the 8-bit information in parallel. Furthermore, when writing more 8-bit information, the skyrmions 40 may be circulated after selecting the following second selection line 96 may or without changing the second selection line 96.

The skyrmion memory circuits 30 do not degrade no many how many times the generation and deletion of skyrmions 40 are performed. This is because the electrons and the like do not move at all when a skyrmion 40 is generated and deleted. Therefore, the number of writings and deletions of information by the skyrmion memory circuit 30 is not limited. In other words, the endurance (durability) is unlimited.

The skyrmion memory circuit 30 can significantly improve data retention (holding) performance. As long as a strong local magnetic field is not applied, a skyrmion 40 that has been generated once exists stably without being erased. Generally, when a magnet is miniaturized to a nano-size scale, the magnetic moment of the magnet receives a thermal disturbance. In LSIs required to hold memory for 10 years or more, the heat disturbance endurance of this magnetic moment is an extremely important issue. The skyrmion memory circuit 30 provides an externally applied magnetized film (the magnetic field generating unit 20) in the bottom portion of the magnet 10 with the closed-path pattern. The magnetic moment of the perpendicularly magnetized film in the magnetic field generating unit 20 is spread over a large area from several $\mu_2$ to several $mm^2$ in a two-dimensional plane. The magnetic moment of the magnetized film of the magnetic field generating unit 20 does not invert upon receiving the thermal disturbance.

Accordingly, the magnetic field generated from the magnetic moment of the magnetic field generating unit 20 is not affected by thermal variance, and therefore the generated skyrmion 40 can be protected by the magnetic field potential and can hold the magnetic moment. These two features simultaneously solve the problem of degradation of the holding performance and the limit on the number of writings in a flash memory due to degradation of the oxide film that accompanies the implantation and removal of electrons caused by the application of high voltage, for example. These features are also effective for the degradation of the thermal disturbance durability of the magnetic moment of the nano-size magnet in an MRAM. The serious problems described above occur when implementing a race track shape in Patent Document 1.

Figure 32:
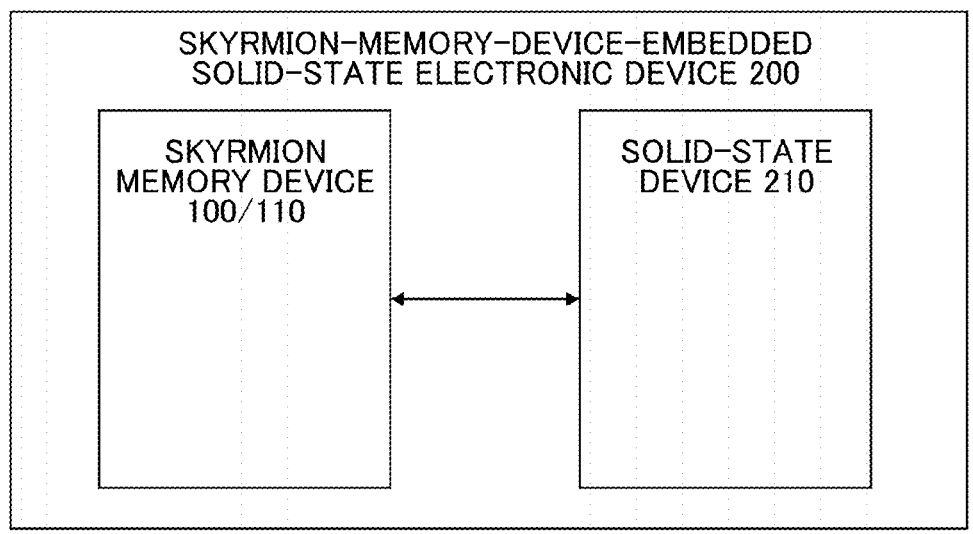
FIG. 32 is a schematic view of an exemplary configuration of a skyrmion-memory-device embedded solid-state electronic device 200.

FIG. 32 is a schematic view of an exemplary configuration of a skyrmion-memory-device embedded solid-state electronic device 200. The skyrmion-memory-device embedded solid-state electronic device 200 includes the skyrmion memory device 100 and a solid-state electronic device 210. The skyrmion memory device 110 may be included instead of the skyrmion memory device 100. The solid-state electronic device 210 functions as a central computational processing device, for example. The solid-state electronic device 210 may be formed in the same chip as the skyrmion memory device 100. The skyrmion memory devices 100 and 110 are the skyrmion memory devices 100 and 110 described in FIGS. 1 to 31. The solid-state electronic device 210 is a CMOS-FET device, for example. The solid-state electronic device 210 has a function of at least one of writing data to the skyrmion memory device 100 or 110 and reading data from the skyrmion memory device 100 or 110.

Figure 33:
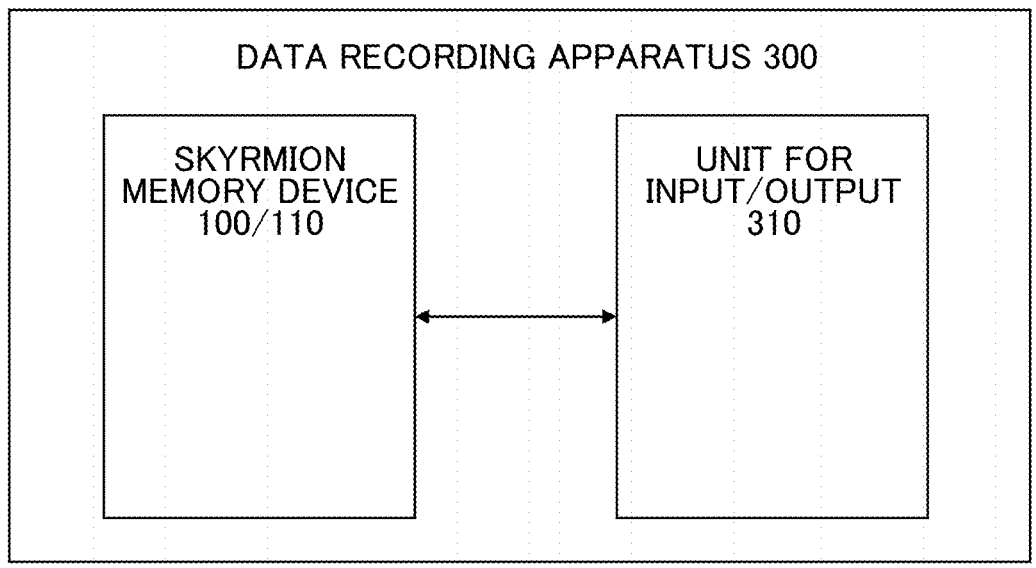
FIG. 33 is a schematic view of an exemplary configuration of a data recording apparatus 300.

FIG. 33 is a schematic view of an exemplary configuration of a data recording apparatus 300. The data recording apparatus 300 includes the skyrmion memory device 100 or 110 and a unit for input/output 310. The data recording apparatus 300 is a memory device for replacing a hard disk or a memory device such as a USB memory, for example. The unit for input/output 310 has a function of at least one of writing data from the outside to the skyrmion memory device 100 or 110 and outputting data to the outside by reading the data from the skyrmion memory device 100 or 110.

The bit information resulting from the skyrmions 40 can be directly written and deleted by the magnetic field induced by the current, while the magnet 10 with the closed-path pattern capable of inducing the magnetic moment acts as the storage medium. The recording method of the skyrmion memory device 100 or 110 shown in this Specification is not only able to remove the load of motor driving of electronic equipment such as a hard disk that is a high-capacity magnetic memory, but is also able to performing writing and deletion at ultra-high speed. Therefore, there is a high probability that the skyrmion memory device 100 or 110 will replace the large scale data recording apparatuses such as current hard disks in the future. Furthermore, in a flash memory that can perform writing and deletion of electrical information, particularly in consideration of the demand for high-capacity recording capacity in recent years, a skyrmion memory circuit 30 employing skyrmions 40 can realize many superior features.

A processor 410 includes a digital circuit that processes a digital signal, for example. The processor 410 has a function for at least one of writing data to the skyrmion memory device 100 or 110 and reading data from the skyrmion memory device 100 or 110.

Figure 34:
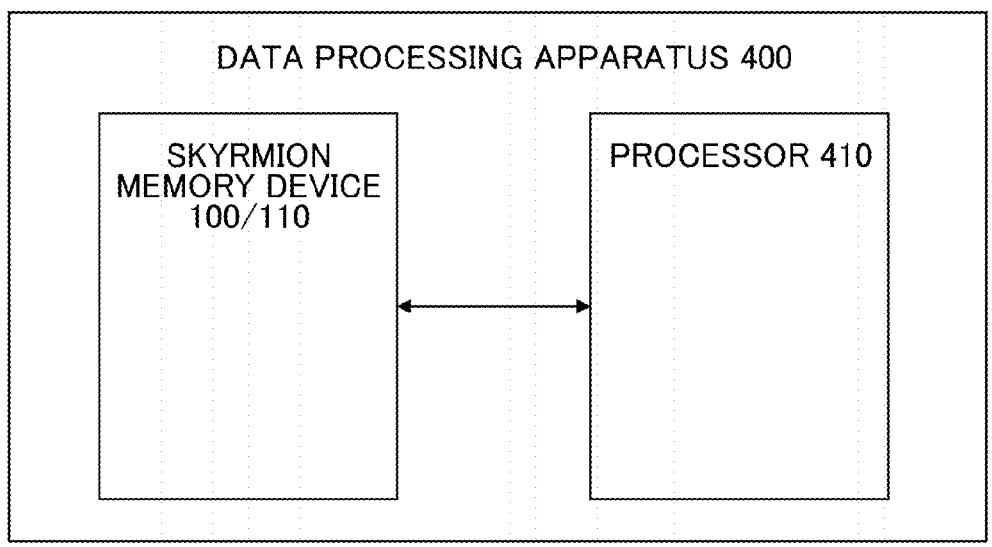
FIG. 34 is a schematic view of an exemplary configuration of a data processing apparatus 400.

FIG. 34 is a schematic view of an exemplary configuration of a data processing apparatus 400. The data processing apparatus 400 includes the skyrmion memory device 100 or 110 and the processor 410. The skyrmion memory device 100 or 110 can include the CMOS-FET 90 establishing a CPU function and a skyrmion memory device 100 or 110 that is a layered large-scale nonvolatile memory, in the same chip. As a result, the CPU processing time can be shortened and the processing speed can be increased, and the power consumption of the CPU can be significantly reduced.

In other words, it is possible to significantly reduce the processing time for calling up the basic OS or the like from the HD when a PC starts up, writing to and reading from an external SRAM or DRAM, and the like, and this contributes to a reduction in CPU time (significant increase in speed). As a result, it is possible to realize a CPU that has significantly lower power consumption. Furthermore, the skyrmion memory device 100 or 110 that is a large-scale nonvolatile memory has zero power consumption for memory holding. The orientation of the magnetic moment of the skyrmion 40 does not require any power supply from the outside to have topological stability. A DRAM memory requires a data refresh, and an SRAM requires constant power input since an SRAM is volatile. A flash memory has a long data access time, and therefore cannot directly exchange data with the CPU.

The skyrmion 40 is capable of electrically writing and deleting bit information to be allocated thereto. The writing time and deletion time for the bit information relating to this skyrmion 40 can be realized to be on the order of nanoseconds. The realization of a high-speed large-scale nonvolatile memory using such a skyrmion 40 significantly improves the high-speed processing power of large-scale information that is currently demanded for many types of electronic equipment.

In particular, the skyrmion memory circuit 30 adopting the skyrmion 40 is used as a means of recording magnetic moment, and therefore it is possible to delete the recording and perform writing, i.e. perform a so-called overwrite, as many times as desired. Furthermore, since the skyrmion memory circuit 30 is used as a means of recording magnetic moment, it is possible to maintain the recording hold state in a stable state for a long time. The skyrmion memory circuit 30 adopting the skyrmion 40 can significantly shorten the operation time needed for the writing and deletion, and can shorten these times to be sub-nanosecond times. As a result, it is possible to realize high-speed operation for writing and deletion beyond that of current DRAMs. Furthermore, by adopting such a skyrmion memory device 100 or 110 in electronic equipment such as a PC, it is possible to significantly increase the usage environment thereof.

Specifically, it is possible to shorten the rising time from when the power supply to the electronic equipment is switched on to when operation becomes possible, to improve the response speed, and to provide a user with a suitable usage environment. Power saving can also be realized in the electronic equipment adopting the skyrmion memory device 100 or 110, and therefore it is possible to realize an increased lifetime for the mounted battery. This further enables the user side to be provided with revolutionary specifications in mobile electronic equipment adopting the skyrmion memory device 100 or 110. It should be noted that the electronic equipment may be a variety of devices, including a personal computer, an image recording apparatus, and the like.

Figure 35:
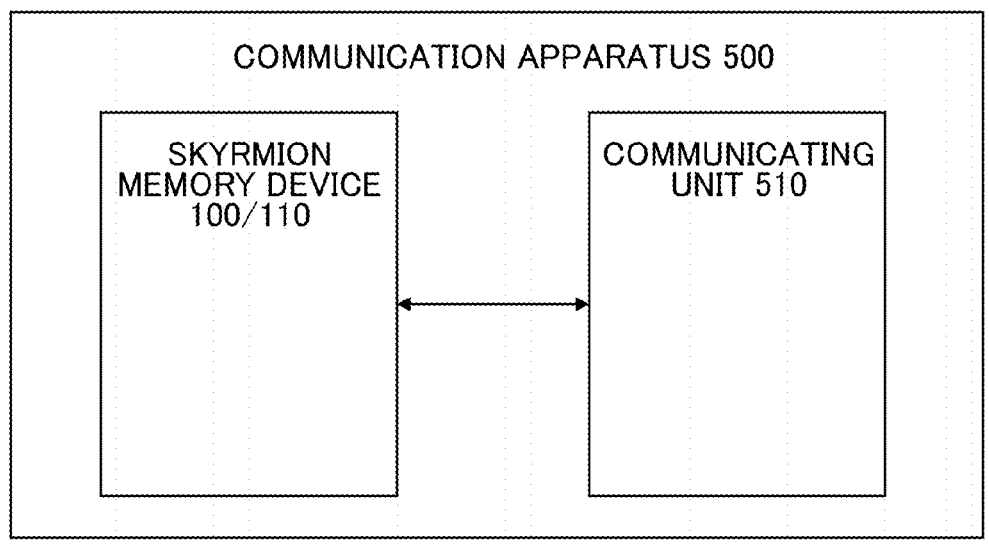
FIG. 35 is a schematic view of an exemplary configuration of a communication apparatus 500.
Figure 36:
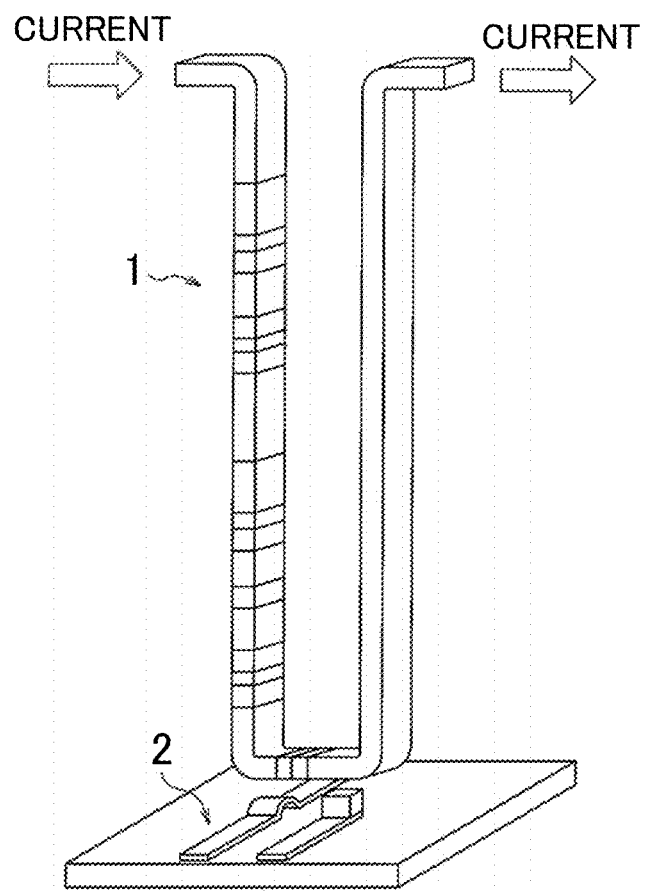
FIG. 36 is a schematic view of the principles of driving a magnetic domain wall with current.

FIG. 35 is a schematic view of an exemplary configuration of a communication apparatus 500. The communication apparatus 500 refers to a general apparatus that has a function for communication with the outside, such as a mobile telephone, a smartphone, or a tablet terminal, for example. The communication apparatus 500 may be portable, or may be non-portable. The communication apparatus 500 includes the skyrmion memory device 100 or 110 and a communicating unit 510.

The communicating unit 510 has a function for communication with the outside of the communication apparatus 500. The communicating unit 510 may have a wireless communication function, a wired communication function, or a function for both wireless and wired communication.

The communicating unit 510 has at least one of a function for writing data received from the outside to the skyrmion memory device 100 or 110, a function for transmitting data read from the skyrmion memory device 100 or 110 to the outside, and a function for operating based on control information stored by the skyrmion memory device 100 or 110.

By adopting the skyrmion memory device 100 or 110 in electronic equipment such as a digital camera, it is possible to record a moving image spanning a large capacity. Furthermore, by adopting the skyrmion memory device 100 or 110 in electronic equipment such as a 4K television receiver, it is possible to realize high capacity for image recording. As a result, it is possible to eliminate the need for connecting the television receiver to an external hard disk. Furthermore, in addition to adopting the skyrmion memory device 100 or 110 in a data recording apparatus such as a hard disk or the like, the skyrmion memory device 100 or 110 may be realized specifically as a data recording medium.

By adopting the skyrmion memory device 100 or 110 in electronic equipment such as the navigation system of an automobile, it is possible to realize even higher resolution and to easily store a large amount of map information.

The skyrmion memory device 100 or 110 is expected to have a large impact on the practical application of self-driving apparatuses, flying apparatuses, and apparatuses for space flight. Specifically, the present invention brings much knowledge to humanity in the fields of complicated processing control for flying apparatuses, weather information processing, enriching services for passengers by providing video with high image quality, controlling apparatuses for space flight, and recording enormous amounts of storage information of observed image information.

The skyrmion memory device 100 or 110 is a memory that has the possibility of being used as a high-speed large-scale nonvolatile memory and as a memory that provides great contributions to the environment of our daily lives.

The skyrmion memory circuit, which is a skyrmion memory using a large number of skyrmions, disclosed by the present invention has a feature of being able to omit a large number of sensors and a large number of skyrmion generating sections, since skyrmions that have nanoscale magnetic structures are circularly transferred in a magnet with a closed-path pattern. Furthermore, the skyrmion memory circuit has a feature of serving as a magnetic shift register that sequentially transfers skyrmions serving as information. Accordingly, the skyrmion memory circuit is expected to be used as a large-scale information storage medium, and to be important as a memory device in an electronic device.

LIST OF REFERENCE NUMERALS

1: magnetic register, 2: magnetic sensor, 10: magnet with a closed-path pattern, 12: outer circumference electrode, 14: inner circumference electrode, 16: current path, 20: magnetic field generating unit, 30: skyrmion memory circuit, 40: skyrmion, 50: current path power supply, 52: power supply, 70: unit for measuring, 72: sensor, 83, 84, 85, 86: switch, 90: FET, 91: FET, 92: FET, 93: write line, 94: first selection line, 95: word line, 96: second selection line, 98: read circuit, 100: skyrmion memory device, 110: skyrmion memory device, 120: memory circuit, 160: magnetic layer, 161: insulator, 165: protective layer for a magnet, 166: protective film for a magnet, 167: first via, 170: first layer for wiring, 171: first wiring, 172: protective film for the first wiring, 173: second via, 175: second layer for wiring, 176: second wire, 177: protective film for the second wiring, 200:

skyrmion-memory-device embedded solid-state electronic device, 210: solid-state electronic device, 300: data recording apparatus, 310: unit for input/output, 400: data processing apparatus, 410: processor, 500: communication apparatus, 510: communicating unit

What is claimed is:

1. A skyrmion memory circuit comprising:
a magnet with a closed-path pattern with a thin film shape capable of generating a skyrmion, wherein
the magnet with the closed-path pattern has a width W and a length L in a plane of the thin film, and has a closed-path pattern that has both ends of the length L connected to each other and circularly transfers the skyrmion.

2. The skyrmion memory circuit according to claim 1, wherein
the magnet with the closed-path pattern includes:
an inner circumference edge that defines an inner circumference of the magnet with the closed-path pattern in a plane of the closed-path pattern; and
an outer circumference edge that defines an outer circumference,
the skyrmion memory circuit includes, in a plane parallel to an extension direction of the magnet with the closed-path pattern:
an inner circumference electrode made from a nonmagnetic metal connected to the inner circumference edge of the magnet with the closed-path pattern; and
an outer circumference electrode made from a nonmagnetic metal connected to the outer circumference edge of the magnet with the closed-path pattern, and
the skyrmion memory circuit has a transverse transfer arrangement in which a direction in which current flows between the inner circumference electrode and the outer circumference electrode is arranged substantially perpendicular to a direction in which the skyrmion is transferred.

3. The skyrmion memory circuit according to claim 2, wherein
one or more of the skyrmions are circularly transferred in the magnet with the closed-path pattern by applying current between the inner circumference electrode and the outer circumference electrode.

4. The skyrmion memory circuit according to claim 3, wherein
with the diameter of the skyrmion being λ, the width W of the magnet with the closed-path pattern is such that W>0.5 λ.

5. The skyrmion memory circuit according to claim 3, wherein with the diameter of the skyrmion being λ, an interval d between a plurality of the skyrmions being circularly transferred is such that d≥0.5 λ.

6. The skyrmion memory circuit according to claim 3, wherein
with the diameter of the skyrmion being λ, when an interval d between a plurality of the skyrmions being circularly transferred is such that d≥2·λ, the plurality of skyrmions are circularly transferred while maintaining the interval d.

7. The skyrmion memory circuit according to claim 3, wherein
with a magnitude of a magnetic exchange interaction of the magnet with the closed-path pattern being J and a current density of the current when a plurality of the skyrmions are being circularly transferred being Jd, a current density Jc of the current flowing between the inner circumference electrode and the outer circumference electrode is such that Jc≥2·Jd, and the plurality of skyrmions being circularly transferred are all deleted.

8. The skyrmion memory circuit according to claim 3, further comprising:
one or more current paths in one plane of the magnet with the closed-path pattern, wherein
one or more of the skyrmions is generated or erased, or a transfer speed of the one or more skyrmions is increased or decreased, by applying current to the current path.

9. The skyrmion memory circuit according to claim 8, wherein
a first current path among the one or more current paths has a width W1 and a length L1 in the same direction as a width direction and a length direction of the magnet with the closed-path pattern and surrounds an end region in a range where the width W1 and length L1, relative to the diameter λ of the skyrmion, are such that 0.75·λ≥W1>0.2·λ and 0.5·λ≥L1>0.1·λ, and
when a magnetic field Ha of the end region is such that 0.01J Ha (with J indicating a magnitude of a magnetic exchange interaction of the magnet with the closed-path pattern), due to a magnetic field generated by current flowing in a first direction through the first current path, the skyrmion is generated in the magnet with the closed-path pattern.

10. The skyrmion memory circuit according to claim 1, wherein
the magnet with the closed-path pattern expresses at least a ferromagnetic phase and a skyrmion crystal phase generated by the skyrmion, according to an applied magnetic field.

11. The skyrmion memory circuit according to claim 1, wherein
the magnet with the closed-path pattern is made from one of a chiral magnet, a dipole magnet, a frustrated magnet, and a layered structure of a magnetic material and a nonmagnetic material.

12. A skyrmion memory device comprising:
a plurality of the skyrmion memory circuits according to claim 3, arranged in a matrix shape;
a first selection line that selects the inner circumference electrode of the magnet with the closed-path pattern and a switch provided to the first selection line;
a second selection line that selects the outer circumference electrode of the magnet with the closed-path pattern and a switch provided to the second selection line;
one or more write lines that apply current to one or more current paths and a switch provided to the one or more write lines;
a sensor that detects the skyrmion;
a word line connected to the sensor and a switch provided to the word line;
a detection circuit that detects a signal of the word line; and
a magnetic field generating unit that applies a first magnetic field to the magnet with the closed-path pattern.

13. The skyrmion memory device according to claim 12, wherein
the write line for generating the skyrmion wired to one of the skyrmion memory circuits is in common with the write line of another of the skyrmion memory circuits.

14. The skyrmion memory device according to claim 12, wherein the word line for sensing the skyrmion wired to one of the skyrmion memory circuits is in common with word line of another of the skyrmion memory circuits.

15. The skyrmion memory device according to claim 12, wherein the skyrmions in the plurality of skyrmion memory circuits are deleted en masse by applying a predetermined current in a width direction of the magnet with the closed-path pattern of the plurality of skyrmion memory circuits.

16. A skyrmion memory device having a multilayer structure in which two or more of the skyrmion memory devices according to claim 12 are layered.

17. A solid-state electronic device on which is mounted a skyrmion memory device including the skyrmion memory device according to claim 12 and a central computational processing device formed in the same chip.

18. A data recording apparatus on which the skyrmion memory device according to claim 12 is mounted.

19. A data processing apparatus on which the skyrmion memory device according to claim 12 is mounted.

20. A communication apparatus on which the skyrmion memory device according to claim 12 is mounted.

* * * * *